United States Patent
Gaul et al.

(10) Patent No.: US 12,136,656 B2
(45) Date of Patent: Nov. 5, 2024

(54) SEMICONDUCTOR STRUCTURE HAVING TWO-DIMENSIONAL CHANNEL

(71) Applicant: International Business Machines Corporation, Armonk, NY (US)

(72) Inventors: Andrew Gaul, Halfmoon, NY (US); Julien Frougier, Albany, NY (US); Ruilong Xie, Niskayuna, NY (US); Andrew M. Greene, Slingerlands, NY (US); Christopher J. Waskiewicz, Rexford, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 17/486,460

(22) Filed: Sep. 27, 2021

(65) Prior Publication Data

US 2023/0105783 A1    Apr. 6, 2023

(51) Int. Cl.
*H01L 29/423* (2006.01)
*H01L 29/06* (2006.01)
(Continued)

(52) U.S. Cl.
CPC .... *H01L 29/42392* (2013.01); *H01L 29/0665* (2013.01); *H01L 29/66477* (2013.01); *H01L 29/78696* (2013.01)

(58) Field of Classification Search
None
See application file for complete search history.

(56) References Cited

U.S. PATENT DOCUMENTS 8,471,249 B2  6/2013 Chiu et al.
8,679,902 B1  3/2014 Basker et al.
(Continued)

FOREIGN PATENT DOCUMENTS

CN    105470001 A    4/2016
EP     3255656 A1    12/2017
(Continued)

OTHER PUBLICATIONS

H.-B. Chen et al., "Performance of GAA Poly-Si Nanosheet (2nm) Channel of Junctionless Transistors with Ideal Subthreshold Slope," Symposium on VLSI Technology, Jun. 11-13, 2013, 2 pages.
(Continued)

*Primary Examiner* — Robert K Carpenter
(74) *Attorney, Agent, or Firm* — Samuel Waldbaum; Ryan, Mason & Lewis LLP

(57) ABSTRACT

Semiconductor structures are disclosed which comprise semiconductor devices having thin multi-layer channel stacks. In one example, a semiconductor structure comprises a gate structure comprising a multi-layer channel stack. The multi-layer channel stack comprises a first dielectric layer, a second dielectric layer, and a channel layer disposed between the first and second dielectric layers. The semiconductor structure further comprises a first source/drain region disposed on a first side of the gate structure and in electrical contact with a first end portion of the multi-layer channel
(Continued)

stack and a second source/drain region disposed on a second side of the gate structure and in electrical contact with a second end portion of the multi-layer channel stack.

20 Claims, 57 Drawing Sheets

(51) Int. Cl.
  *H01L 29/66* (2006.01)
  *H01L 29/786* (2006.01)

(56) References Cited

U.S. PATENT DOCUMENTS

| | | | |
|---|---|---|---|
| 8,742,511 | B2 | 6/2014 | Chang et al. |
| 8,916,914 | B2 | 12/2014 | Kim et al. |
| 9,349,806 | B2 | 5/2016 | Ho et al. |
| 9,461,114 | B2 | 10/2016 | Obradovic et al. |
| 9,490,323 | B2 | 11/2016 | Rodder et al. |
| 9,508,801 | B2 | 11/2016 | Franklin et al. |
| 9,548,394 | B2 | 1/2017 | Das et al. |
| 9,553,199 | B2 | 1/2017 | Hou et al. |
| 9,748,352 | B2 | 8/2017 | Liu et al. |
| 9,812,449 | B2 | 11/2017 | Obradovic et al. |
| 10,008,583 | B1 | 6/2018 | Rodder et al. |
| 10,134,915 | B2 | 11/2018 | Colinge et al. |
| 10,236,292 | B1 | 3/2019 | Frougier et al. |
| 10,249,710 | B2 | 4/2019 | Bentley et al. |
| 10,304,833 | B1 | 5/2019 | Suvarna et al. |
| 10,381,271 | B2 | 8/2019 | Rodder et al. |
| 10,388,732 | B1 | 8/2019 | Frougier et al. |
| 10,418,449 | B2 | 9/2019 | Paul et al. |
| 10,510,622 | B1 | 12/2019 | Frougier et al. |
| 10,916,637 | B2 | 2/2021 | Smith et al. |
| 2010/0295021 | A1 | 11/2010 | Chang et al. |
| 2012/0138887 | A1 | 6/2012 | Zhang et al. |
| 2012/0273763 | A1 | 11/2012 | Banerjee et al. |
| 2014/0197459 | A1 | 7/2014 | Kis et al. |
| 2016/0211264 | A1 | 7/2016 | Peng |
| 2017/0040321 | A1 | 2/2017 | Mitard |
| 2017/0317206 | A1 | 11/2017 | van Dal et al. |
| 2018/0182898 | A1 | 6/2018 | Moroz et al. |
| 2018/0315769 | A1* | 11/2018 | Huo ............... H10B 43/27 |
| 2020/0044087 | A1* | 2/2020 | Guha ............. H01L 29/66439 |
| 2020/0091149 | A1* | 3/2020 | Lee ................ B82Y 10/00 |
| 2020/0105751 | A1* | 4/2020 | Dewey ............ H01L 21/8256 |
| 2021/0296445 | A1* | 9/2021 | Lee ................ B82Y 10/00 |
| 2023/0073078 | A1* | 3/2023 | Rachmady ....... H01L 27/0688 |

FOREIGN PATENT DOCUMENTS

| | | |
|---|---|---|
| EP | 3882212 A1 | 9/2021 |
| EP | 4020586 A1 | 6/2022 |
| WO | 2011160922 A1 | 12/2011 |
| WO | 2021066947 A1 | 8/2021 |

OTHER PUBLICATIONS

S. Li et al., "Nanometre-Thin Indium Tin Oxide for Advanced High-Performance Electronics," Nature Materials, Aug. 12, 2019, pp. 1091-1097, vol. 18.

H. Fujiwara et al., "Surrounding Gate Vertical-Channel FET with Gate Length of 40 nm Using BEOL Compatible High-Thermal-Tolerance In-Al-Zn Oxide Channel," IEEE Transactions on Electron Devices, Sep. 17, 2020, 2 pages, vol. 67, No. 12.

A.-S. Chou et al., "High On-Current 2D nFET of 390 µA/µm at VDS = 1V Using Monolayer CVD MoS2 Without Intentional Doping," IEEE Symposium on VLSI Technology, Jun. 16-19, 2020, 2 pages.

F. Liao et al., "High-Performance Logic and Memory Devices Based on a Dual-Gated MoS2 Architecture," Applied Electronic Materials, Dec. 12, 2019, 25 pages.

A. Nourbakhsh et al., "15-nm Channel Length MoS2 FETs with Single- and Double-Gate Structures," Symposium on VLSI Technology Digest of Technical Papers, Jun. 16-18, 2015, pp. T28-T29.

T.-W. Kim et al., "Logic Characteristics of 40 nm Thin-Channel InAs HEMTs," 22nd International Conference on Indium Phosphide and Related Materials (IPRM), May 31-Jun. 4, 2010, 4 pages.

A. Konar et al., "Carrier Transport in High Mobility InAs Nanowire Junctionless Transistors," Nano Letters, Feb. 6, 2015, 22 pages, vol. 15, No. 3.

B. Vincent et al., "A Benchmark Study of Complementary-Field Effect Transistor (CFET) Process Integration Options Done by Virtual Fabrication," IEEE Journal of the Electron Devices Society, Apr. 28, 2020, pp. 668-673, vol. 8.

J. Ryckaert et al., "The Complementary FET (CFET) for CMOS Scaling Beyond N3," IEEE Symposium on VLSI Technology Digest of Technical Papers, Jun. 18-22, 2018, pp. 141-142.

Eric Pop, "Oxide and Chalcogenide Transistors for M3D Applications—Part 2 (Task 2776.003)," Electrical Engineering (EE) and Materials Science & Engineering (MSE), Stanford University, obtained Sep. 24, 2021, 26 pages.

International Search Report and Written Opinion for PCT Application No. PCT/EP2022/072615 dated Nov. 24, 2022, 12 pages.

S. Wi et al., "Enhancement of Photovoltaic Response in Multilayer MoS2 Induced by Plasma Doping," ACS Nano, May 1, 2014, pp. 5270-5281, vol. 8, No. 5.

M. Chen et al., "Stable Few-Layer MoS2 Rectifying Diodes Formed by Plasma-Assisted Doping," Applied Physics Letters, Sep. 2013, pp. 142110:1-4, vol. 103, No. 14.

A. Nipane et al., "Few-Layer MoS2p-Type Devices Enabled by Selective Doping Using Low Energy Phosphorus Implantation," ACS Nano, Jan. 20, 2016, pp. 2128-2137, vol. 10, No. 2.

J. Sun et al., "Ultrahigh Hole Mobility of Sn-Catalyzed GaSb Nanowires for High Speed Infrared Photodetectors," Nano Letters, Aug. 2, 2019, pp. 5920-5929, vol. 19, No. 9.

* cited by examiner

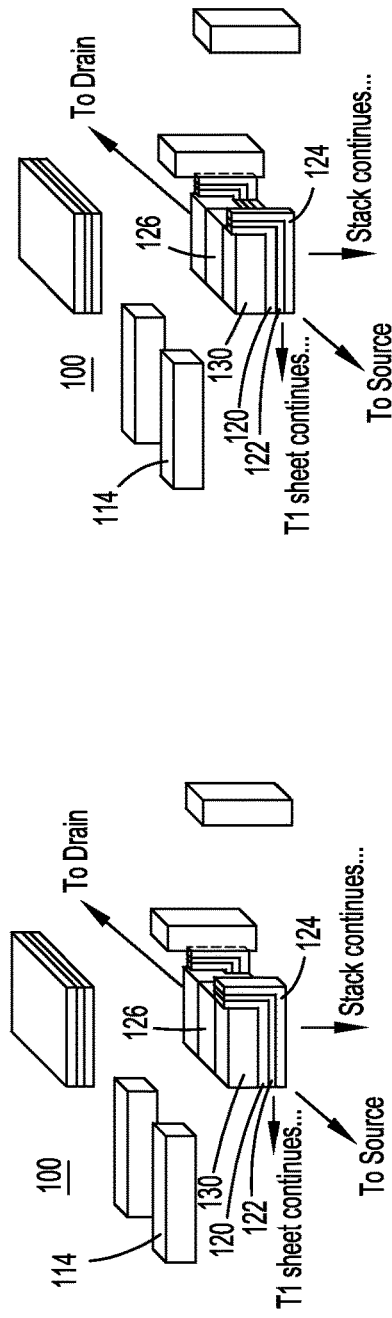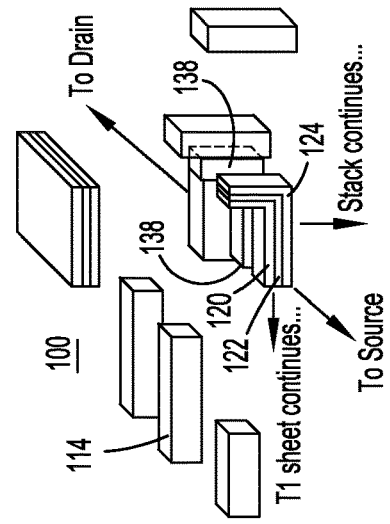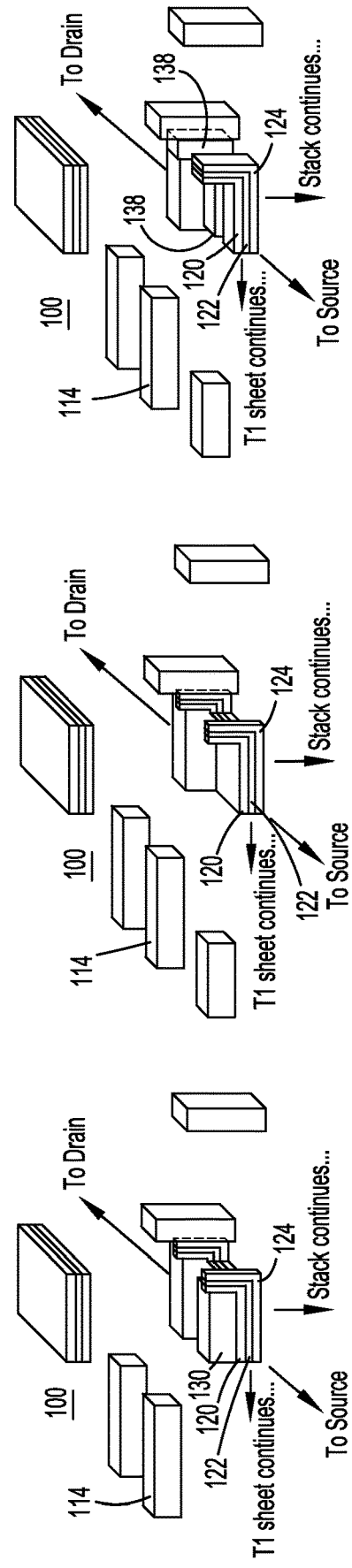

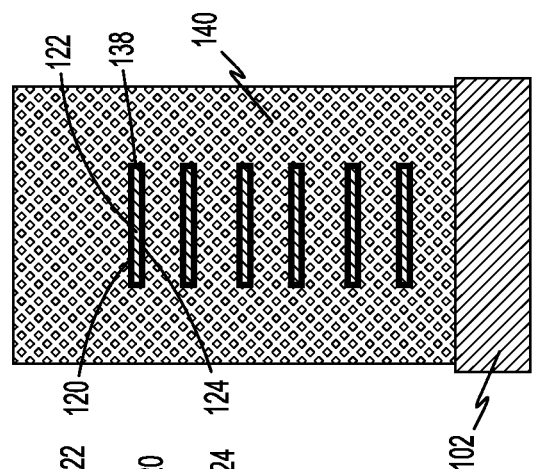
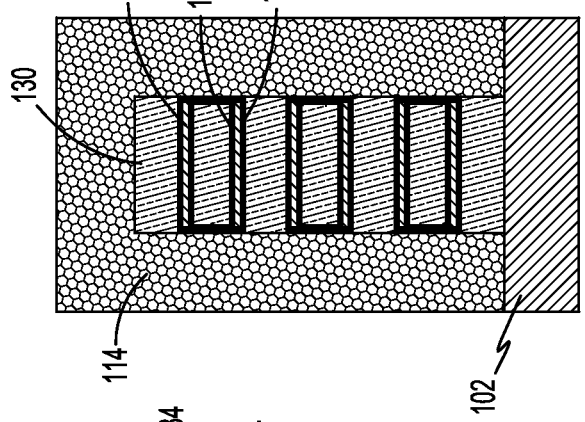
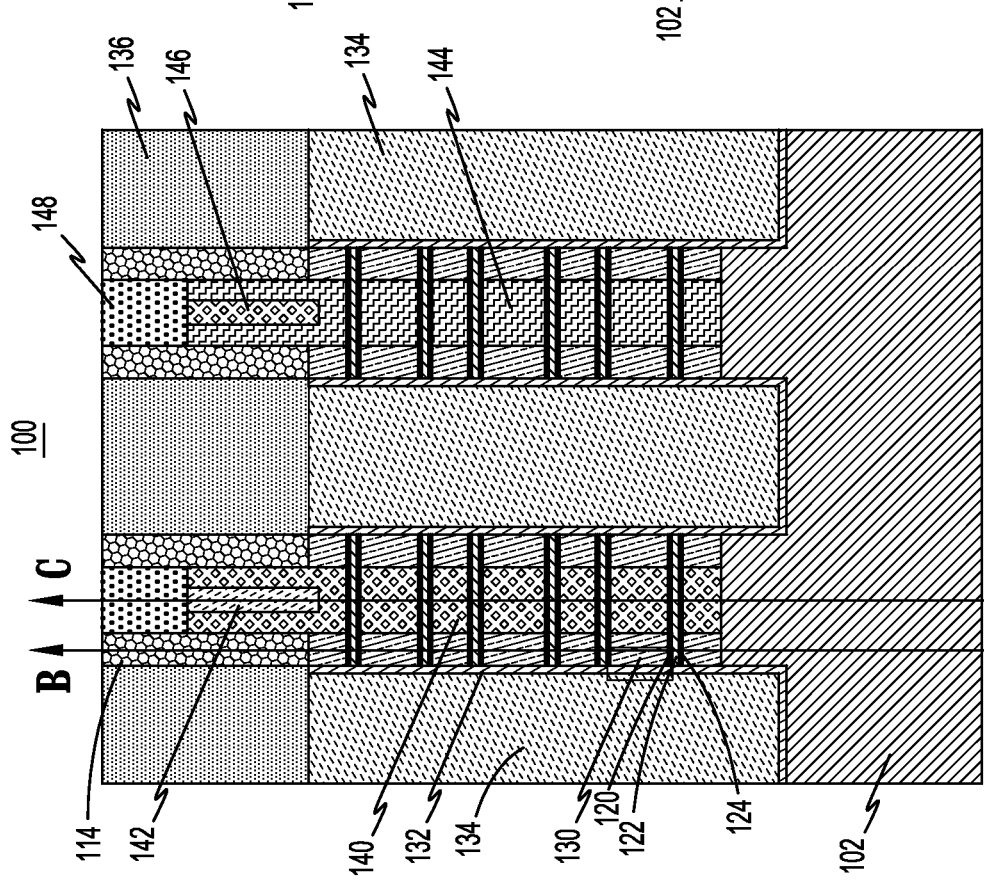
FIG. 12C
FIG. 12B
FIG. 12A

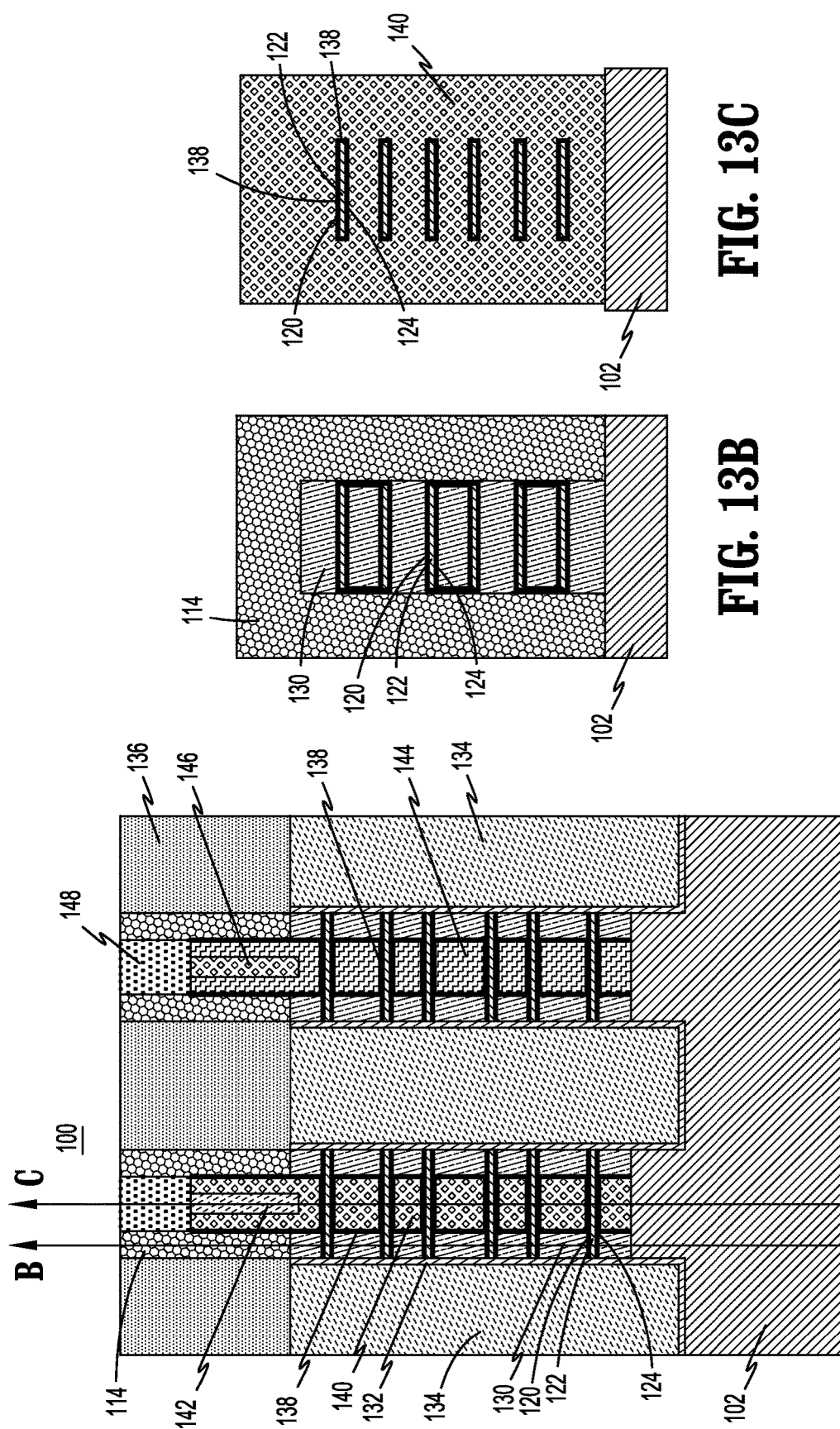

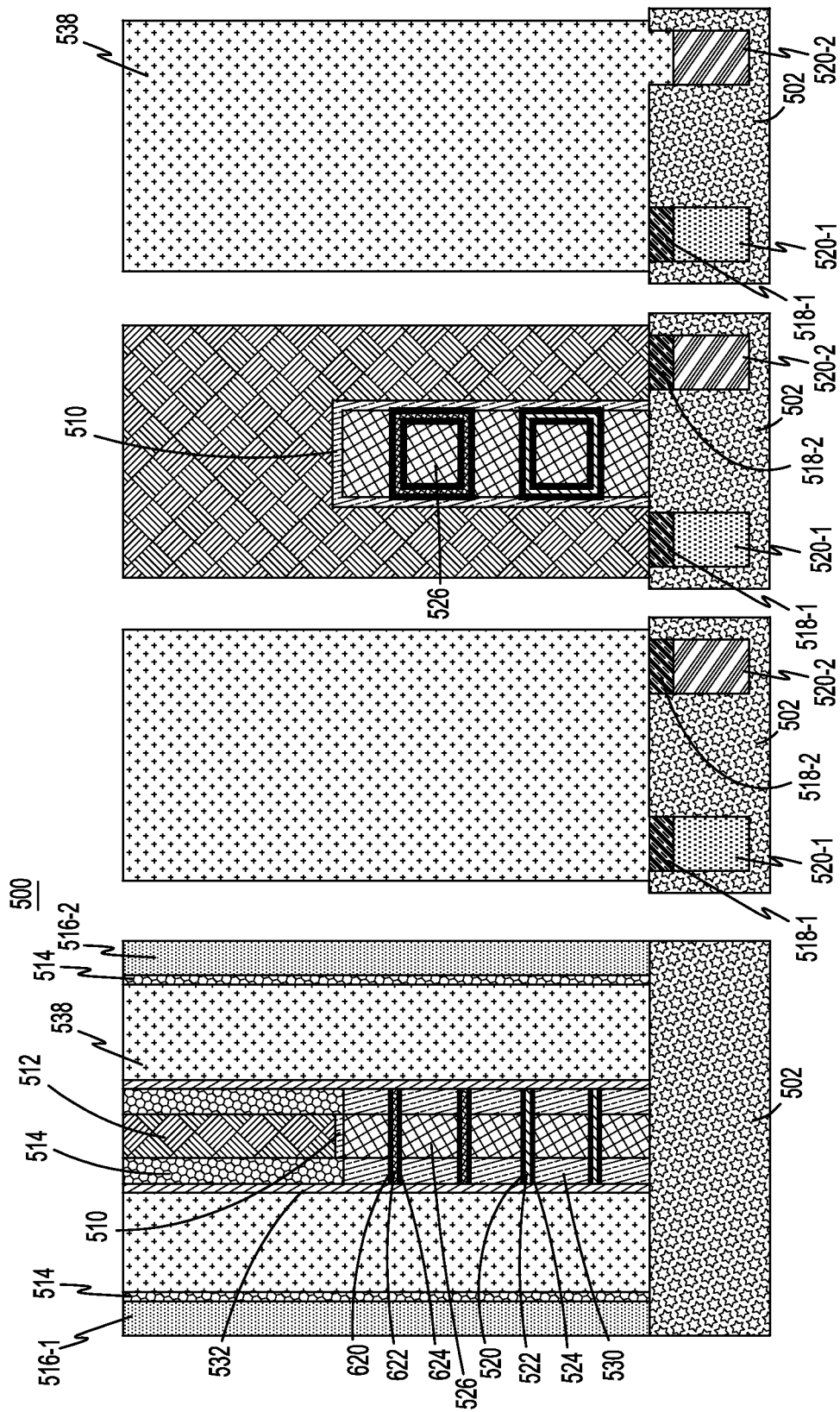

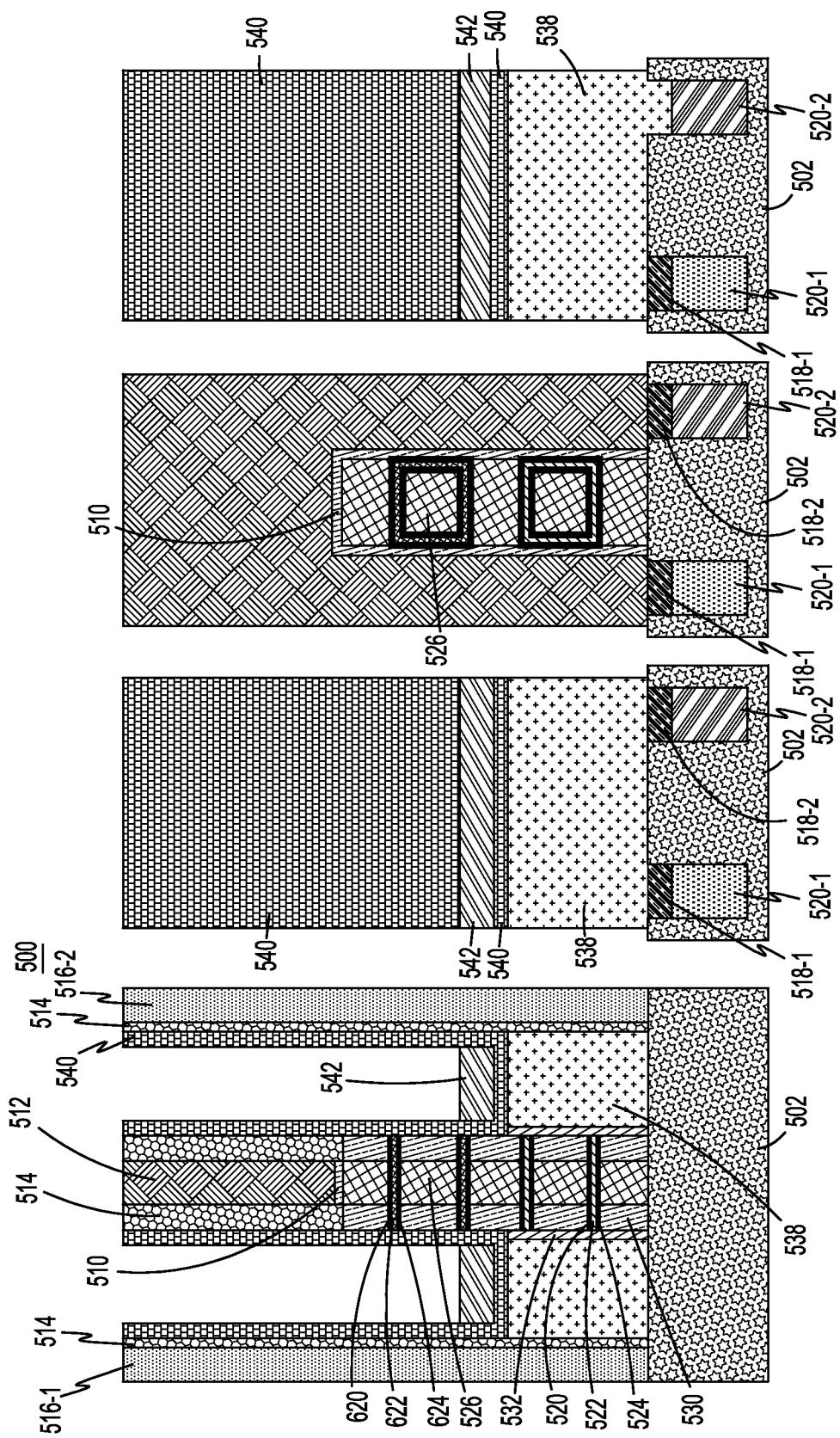

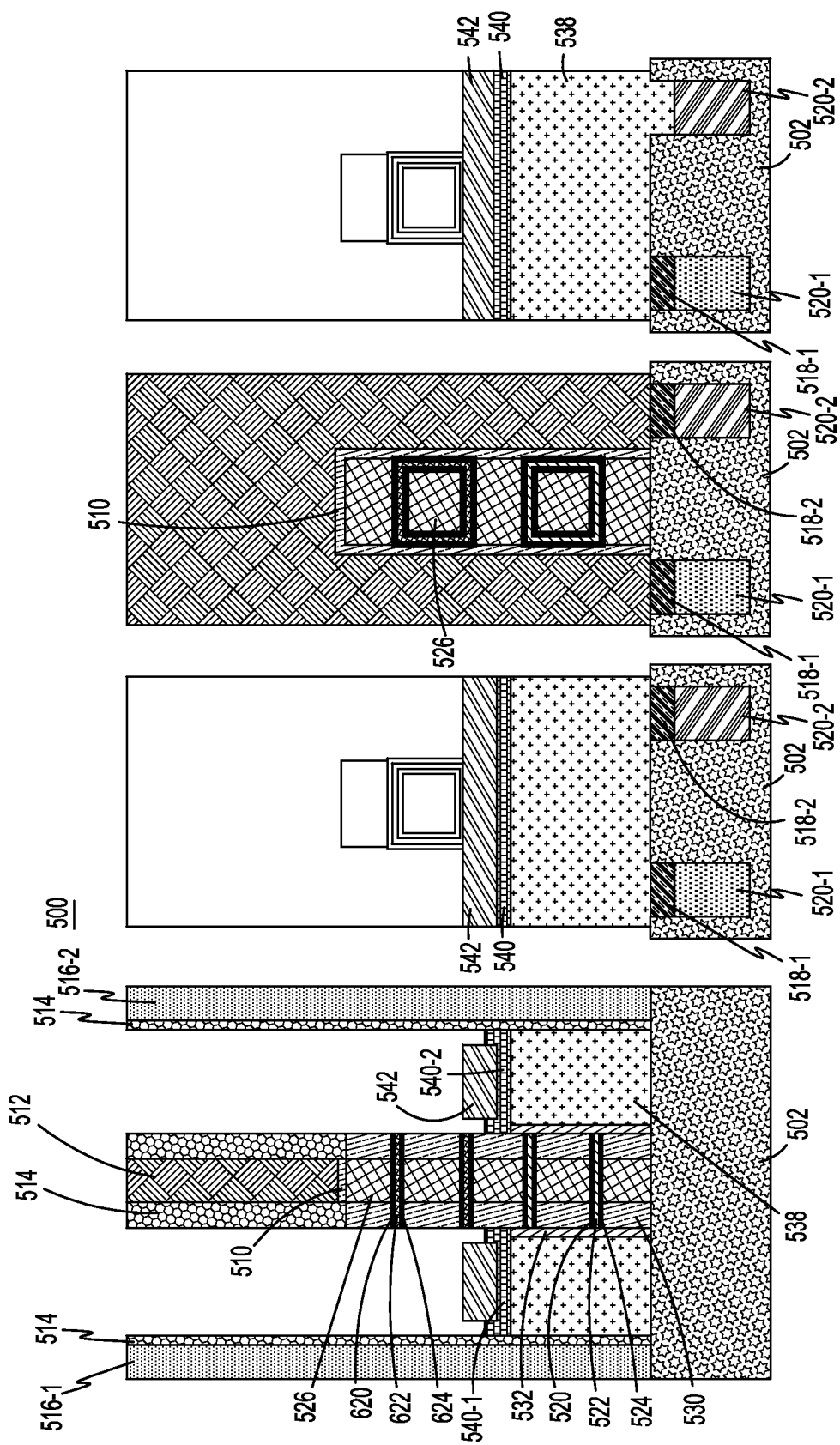

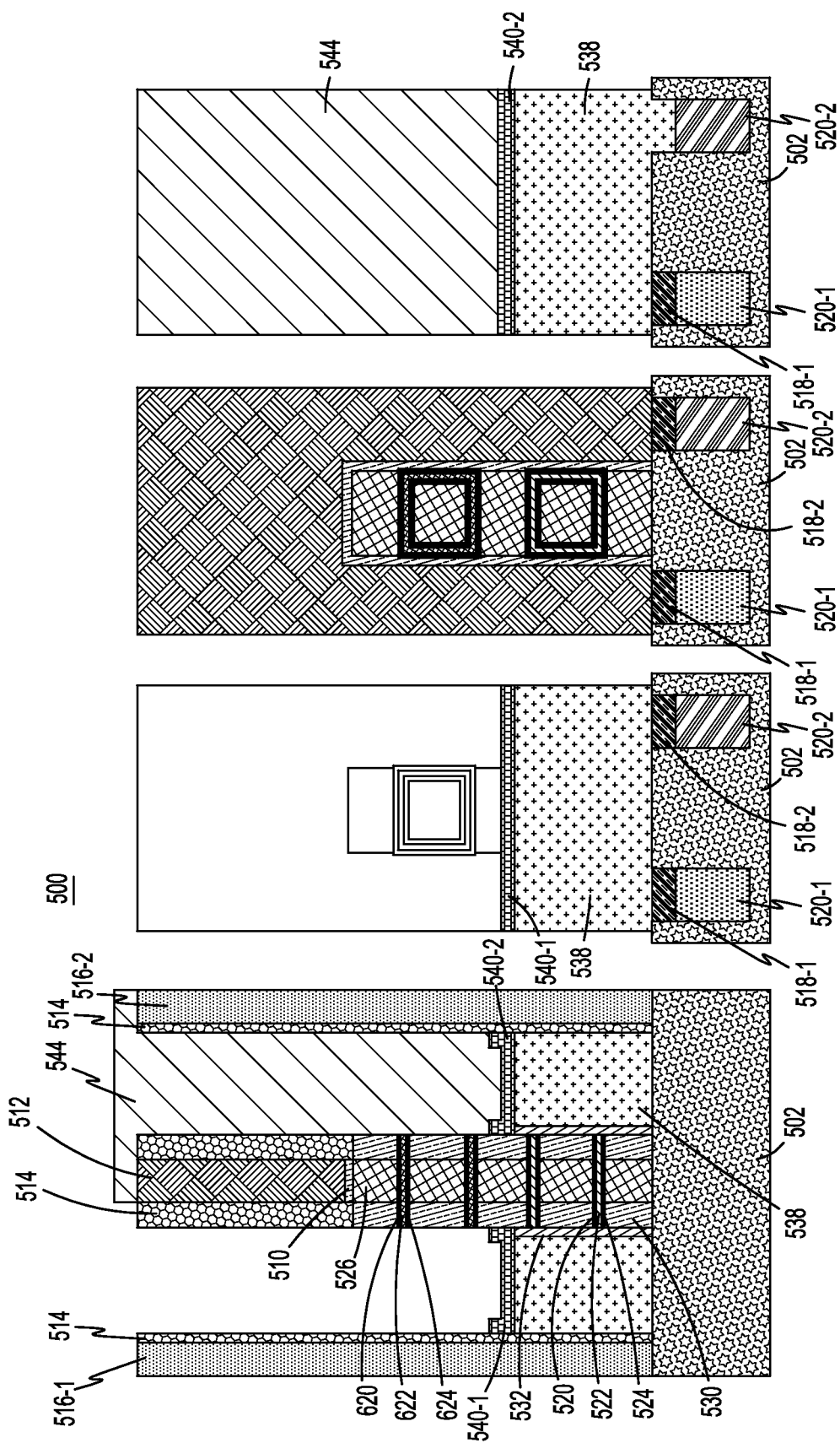

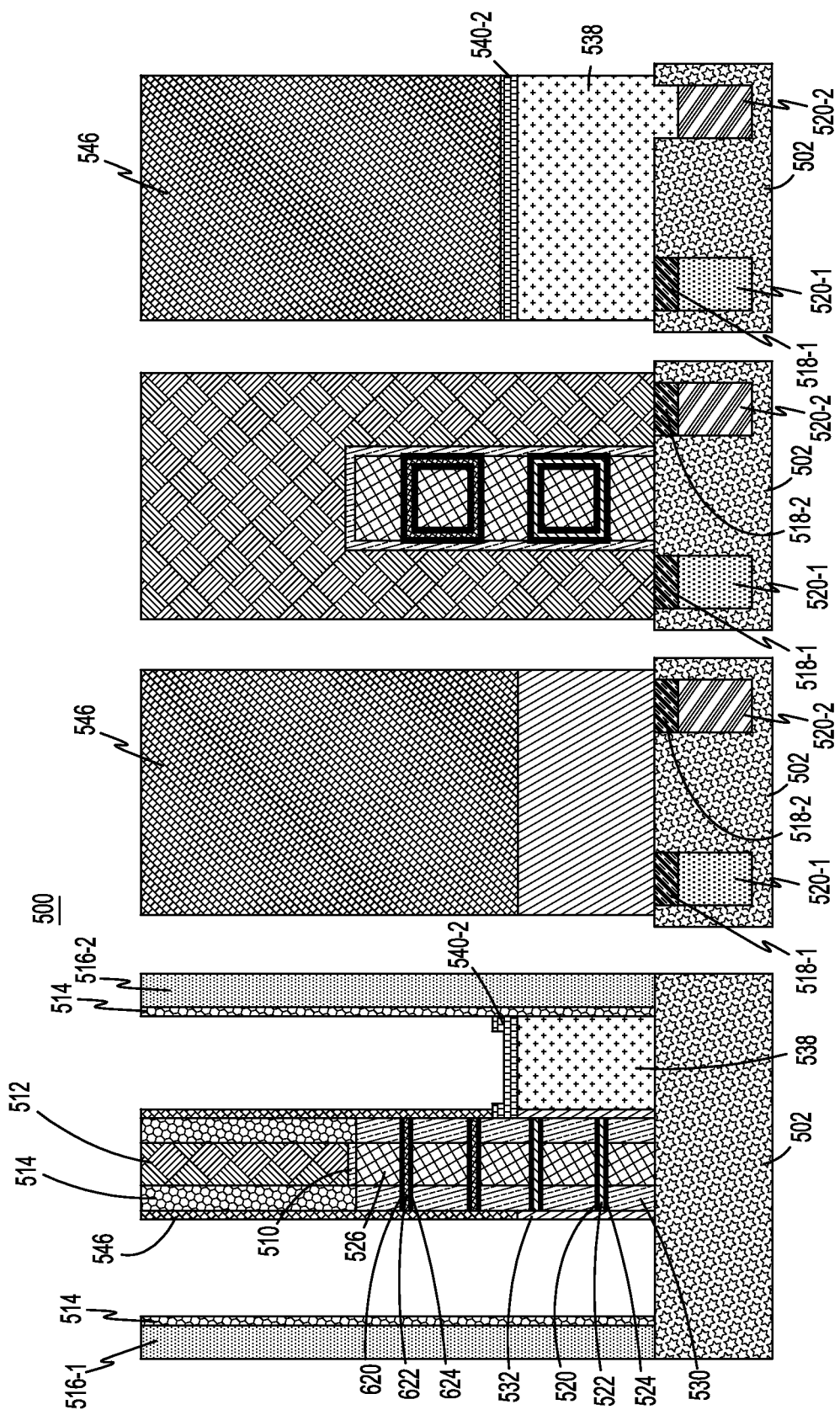

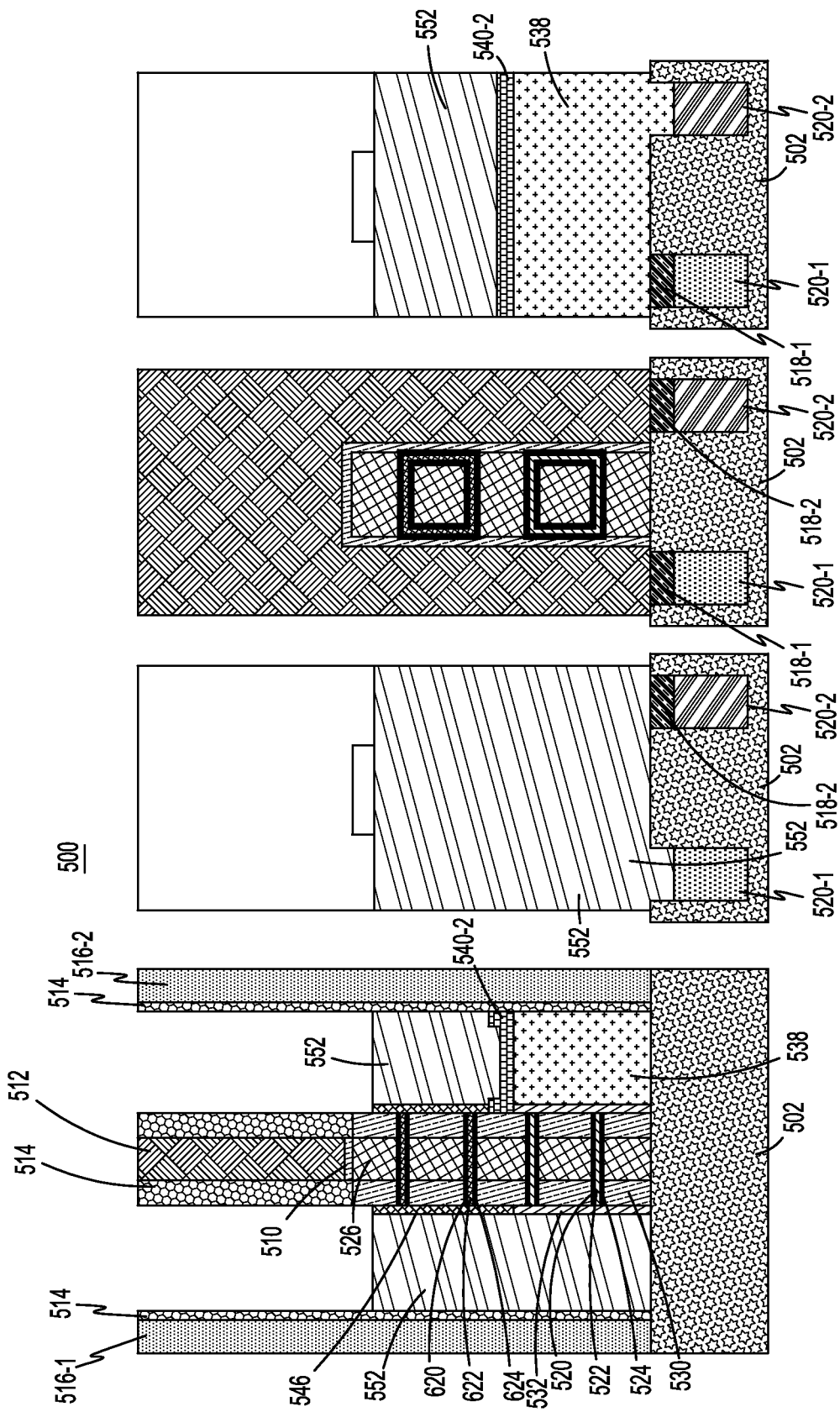

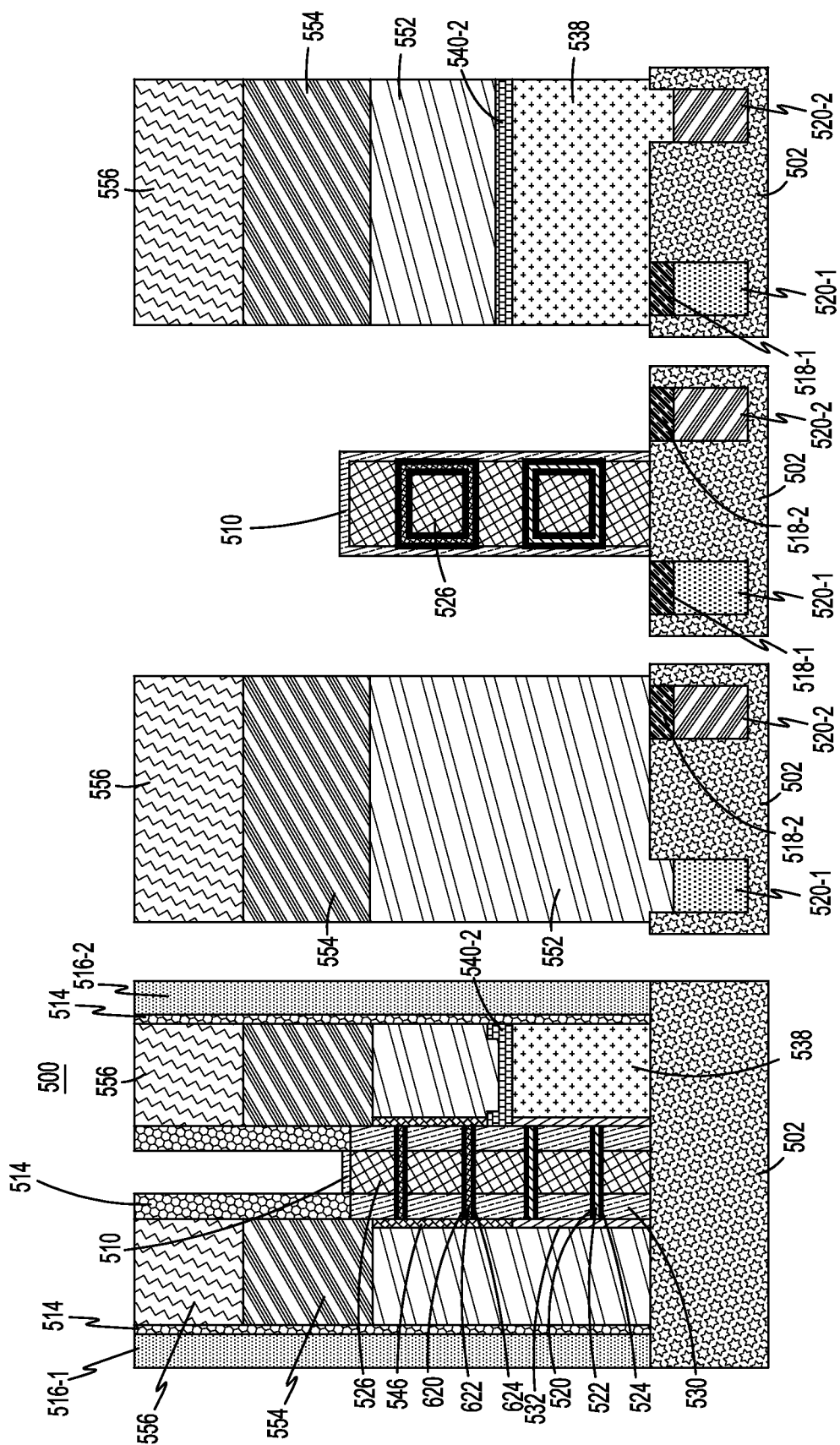

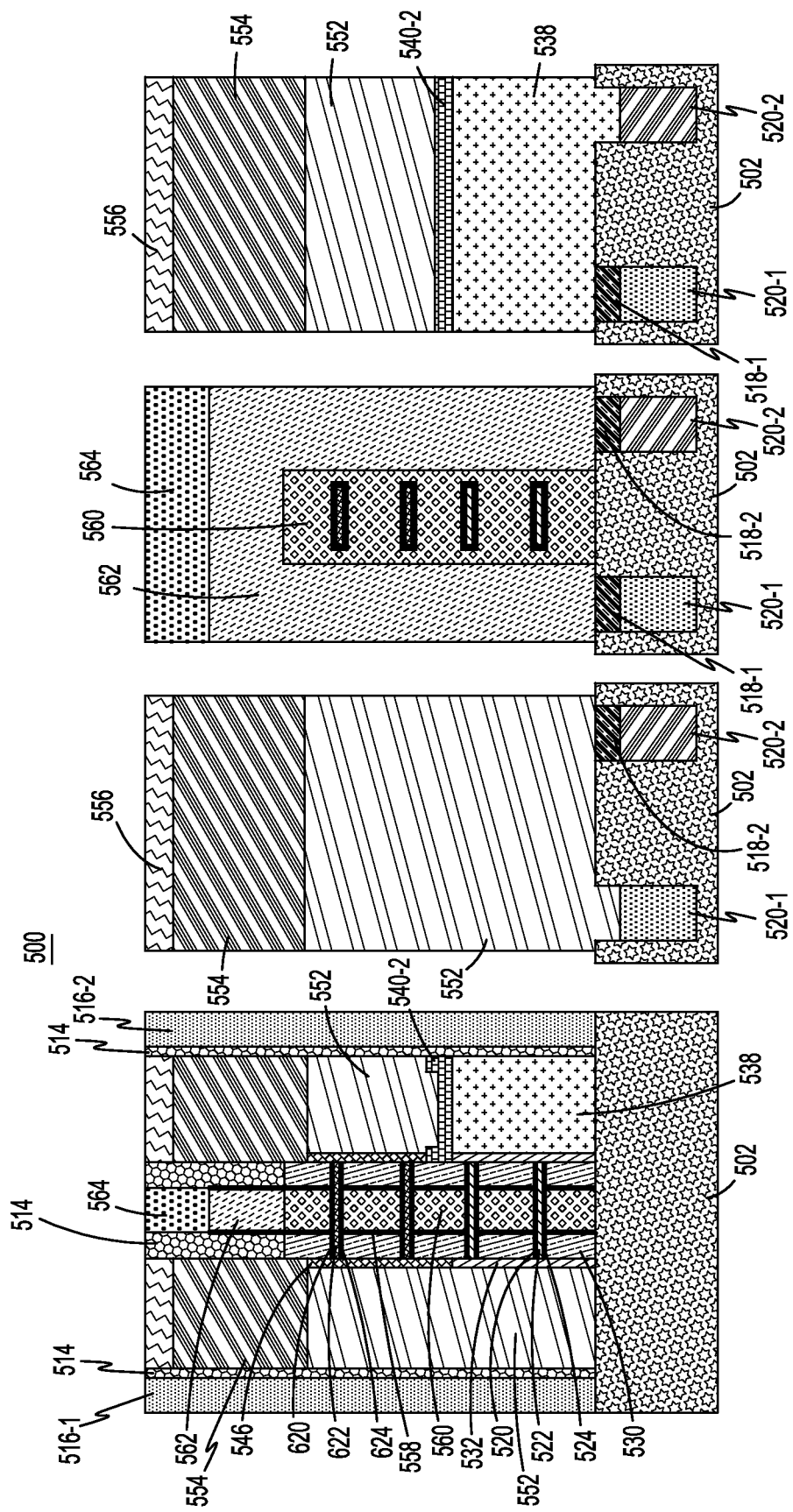

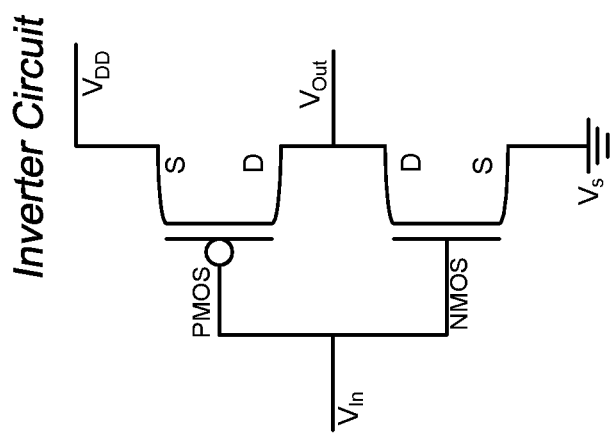
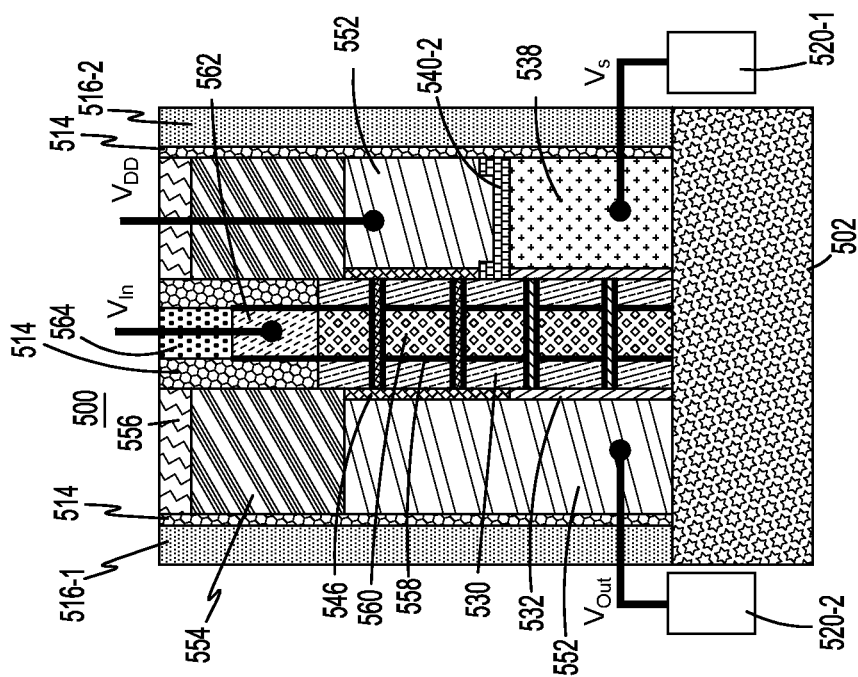
FIG. 43

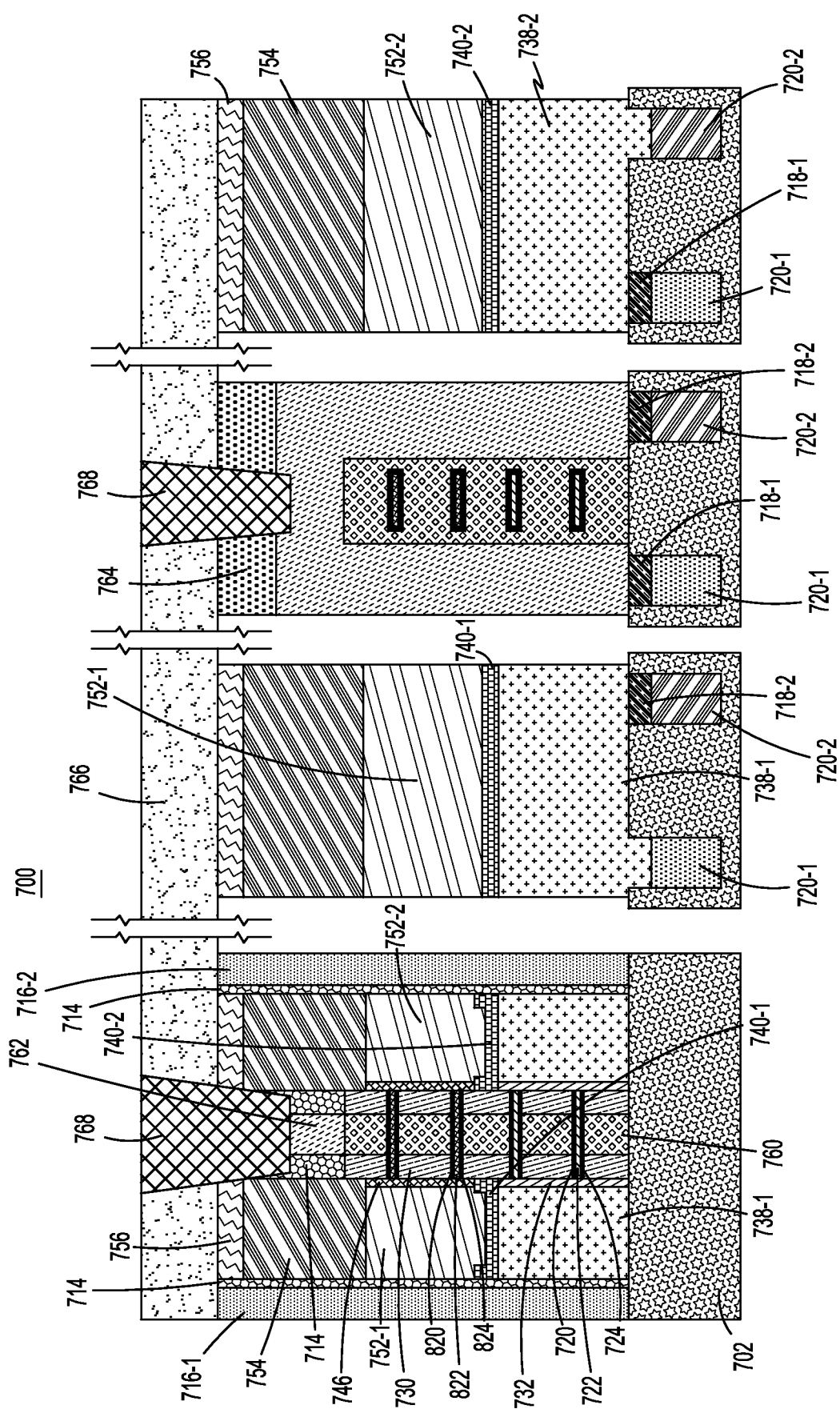

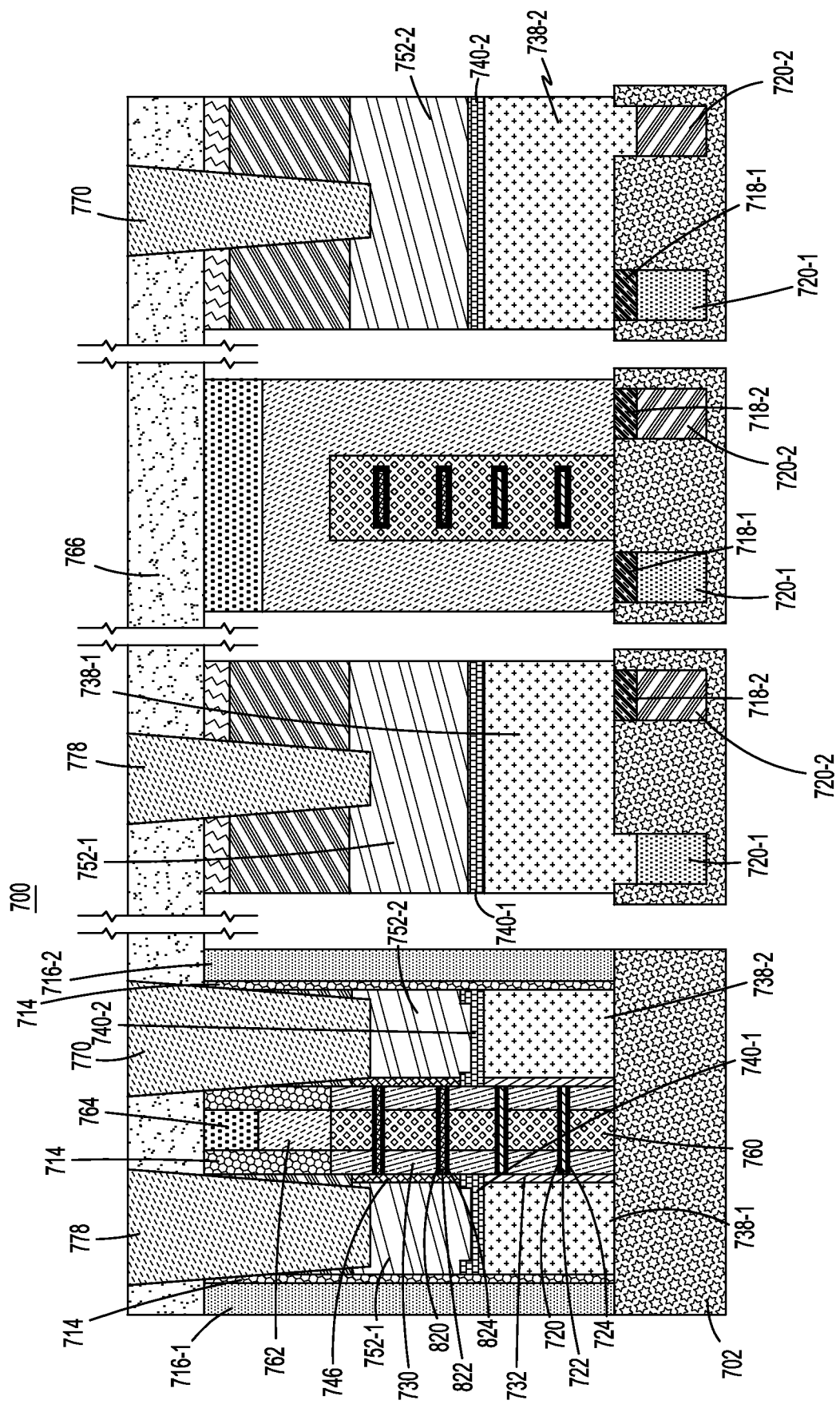

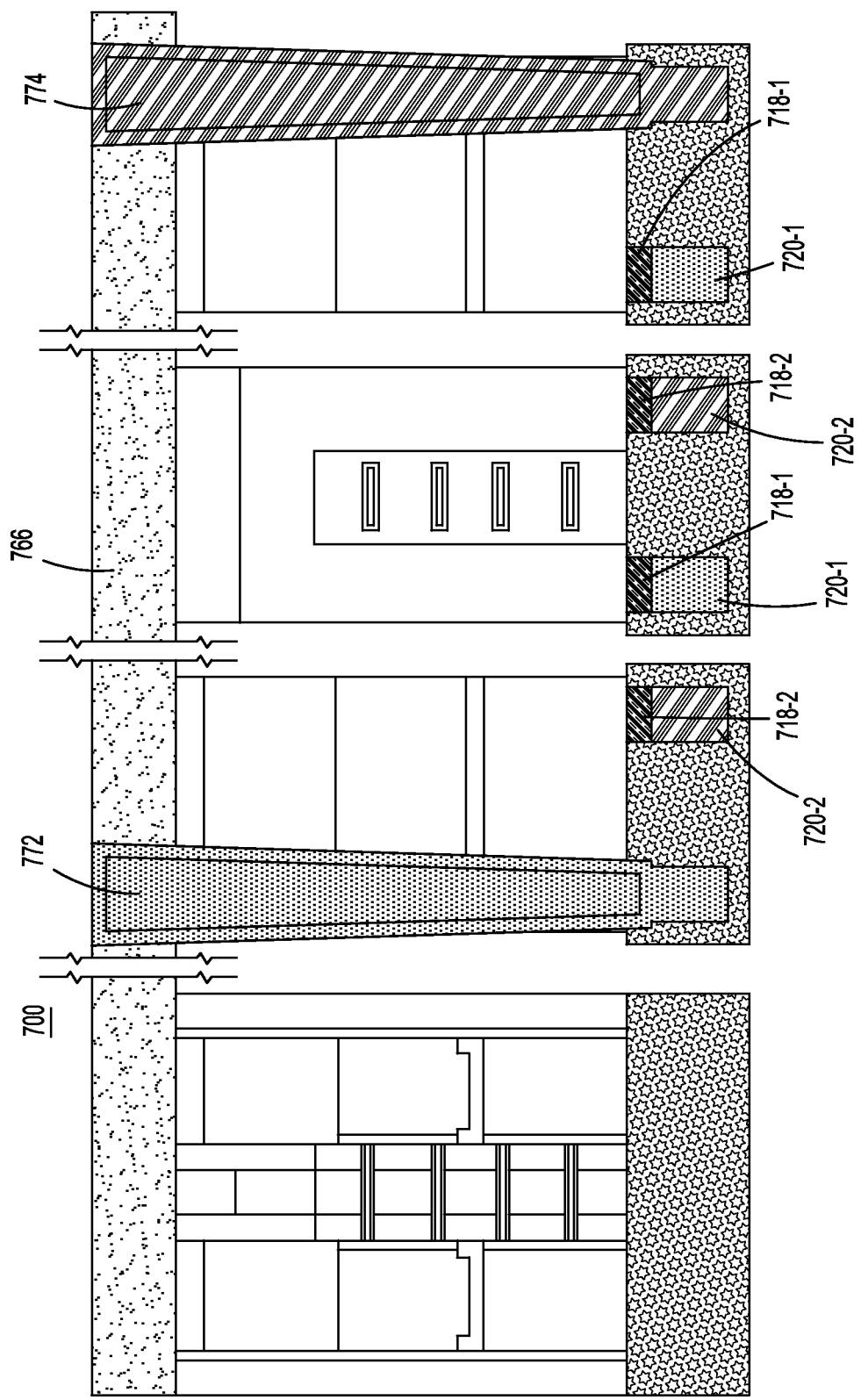

SEMICONDUCTOR STRUCTURE HAVING TWO-DIMENSIONAL CHANNEL

BACKGROUND

Continued innovations in semiconductor process technologies are enabling higher integration densities and device scaling. As semiconductor field-effect transistor (FET) device structures are scaled to smaller dimensions to provide increased device width per footprint area, non-planar FET devices such as nanosheet devices are a viable option for continued complementary metal-oxide-semiconductor (CMOS) scaling. In general, a nanosheet device has a device channel comprising one or more nanosheet layers in a stacked configuration. In nanosheet devices, a common gate structure is formed above and below each nanosheet layer in the stacked configuration, thereby increasing the FET device width (or channel width) and thus the drive current, for a given footprint area. However, nanosheet devices shows extendibility limitations beyond 40 nm contacted poly pitch (CPP) due to gate-to-gate pinch-off risk at the inner spacer formation. One way to enable sub-40 nm CPP is to scale the gate length below the current effective anchor point of 12 nm. However, the current hardware with a 5 nm thick silicon (Si) sheet may face a short channel effect limitation below a 12 nm gate work function metal (WFM) width while reducing the Si sheet thickness below 5 nm to improve electrostatic control is also undesirable since quantum confinement effects start to degrade performance.

SUMMARY

The disclosed embodiments include semiconductor structures comprising thin multi-layer channel stacks and techniques for fabricating semiconductor structures comprising thin multi-layer channel stacks.

For example, one embodiment includes a semiconductor structure which comprises a gate structure comprising a multi-layer channel stack. The multi-layer channel stack comprises a first dielectric layer, a second dielectric layer, and a channel layer disposed between the first and second dielectric layers. The semiconductor structure further comprises a first source/drain region disposed on a first side of the gate structure and in electrical contact with a first end portion of the multi-layer channel stack and a second source/drain region disposed on a second side of the gate structure and in electrical contact with a second end portion of the multi-layer channel stack.

Another embodiment includes a semiconductor structure which comprises a gate structure comprising a first multi-layer channel stack and a second multilayer channel stack spaced apart by an inner spacer. Each of the first and second multi-layer channel stacks comprises a first dielectric layer, a second dielectric layer and a channel layer disposed between the first and second dielectric layers. The channel layer of the first multi-layer channel stack comprises a first material that is configured for use with one of an n-type field effect transistor and a p-type field effect transistor and the channel layer of the second multi-layer channel stack comprising a second material that is configured for use with the other of the n-type field effect transistor and a p-type field effect transistor.

Another embodiment includes a method of fabricating a semiconductor structure which includes forming a sacrificial stack structure comprising a first sacrificial layer, a second sacrificial layer and a third sacrificial layer disposed between the first sacrificial layer and the second sacrificial layer. The method further includes removing the third sacrificial layer and forming multi-layer channel stacks on the surfaces of the first and second sacrificial layers that are exposed by the removal of the third sacrificial layer. Each multi-layer channel stack comprises a first dielectric layer, a second dielectric layer and a channel layer formed between the first dielectric layer and the second dielectric layer. The method further includes forming a fourth sacrificial layer between the multi-layer channel stacks and laterally etching the fourth sacrificial layer to recess the fourth sacrificial layer relative to end portions of the multi-layer channel stacks. The method further includes forming sidewall spacers in the recesses between the multi-layer channel stacks and forming a metal-based source/drain region in electrical contact with the channel layers of the multi-layer channel stacks.

Other embodiments will be described in the following detailed description of embodiments, which is to be read in conjunction with the accompanying figures.

BRIEF DESCRIPTION OF THE DRAWINGS

FIGS. 10A-10J are three-dimensional projection views of the semiconductor structure of FIGS. 9A-9C illustrating the semiconductor structure during various steps of a gate replacement process.

FIGS. 12A-12C are schematic cross-sectional views of the semiconductor structure of FIGS. 11A-11C after the gate replacement process has been performed according to an aspect of the first embodiment including the removal of the sacrificial layer, formation of a gate dielectric layer and the formation of gate conductor layers, gate contacts and sacrificial gate caps.

FIGS. 13A-13C are schematic cross-sectional views of the semiconductor structure of FIGS. 11A-11C after the gate replacement process has been performed according to another aspect of the first embodiment in which a gate dielectric layer is formed prior to the replacement of the sacrificial layer with the gate conductor layers, gate contacts and sacrificial gate caps.

FIGS. 33A through 33D are schematic cross-sectional views of the semiconductor structure of FIGS. 32A through 32D after removal of the exposed buried power rail (BPR) capping layer and the formation of source/drain regions in electrical contact with the BPR.

FIGS. 34A through 34D are schematic cross-sectional views of the semiconductor structure of FIGS. 33A through 33D after recessing the contact layer and source/drain regions to a level below the inner dielectric layers, channel layers and outer dielectric layers, the formation of a source/drain spacer, the formation of an ILD and the recessing of the ILD.

FIGS. 35A through 35D are schematic cross-sectional views of the semiconductor structure of FIGS. 34A through 34D after recessing the source/drain spacer below the level of the bottom most tri-layer stack of inner dielectric layers, channel layers and outer dielectric layers to expose the inner dielectric layers, channel layers and outer dielectric layers and a portion of the inner spacer disposed between the bottom most tri-layer stack of inner dielectric layers, channel layers and outer dielectric layers and the top most tri-layer stack of inner dielectric layers 520, channel layers and outer dielectric layers.

FIGS. 36A through 36D are schematic cross-sectional views of the semiconductor structure of FIGS. 35A through 35D after removal of the ILD 542 and the formation of an etch mask that is patterned to expose one side of the gate structure while protecting the other side of the gate structure.

FIGS. 37A through 37D are schematic cross-sectional views of the semiconductor structure of FIGS. 36A through 36D after removal of the portion of the source/drain spacer on the side of the gate structure that was exposed by the etch mask, the removal of the etch mask, the formation of a contact layer on the semiconductor structure including on the remaining portion of the source/drain spacer, the source/drain region that was exposed by removal of the portion of the source/drain spacer on that side of the gate structure, and on the sidewalls of the gate structure including on inner spacers, inner dielectric layers, channel layers and outer dielectric layers and sidewall spacers, the etching of the contact layer to expose the portion of the source/drain spacer and the source/drain region and the removal of the source/drain region.

FIGS. 40A through 40D are schematic cross-sectional views of the semiconductor structure of FIGS. 39A through 39D after removal of the exposed BPR capping layer, formation of source/drain regions in electrical contact with the BPR and recessing of the contact layer and source/drain regions to a level above the upper most tri-layer stack of inner dielectric layers, channel layers and outer dielectric layers and below the sidewall spacer.

FIGS. 41A through 41D are schematic cross-sectional views of the semiconductor structure of FIGS. 40A through 40D after the formation of an ILD and capping layer and the removal of dummy gate electrodes.

FIGS. 42A-42D are schematic cross-sectional views of the semiconductor structure of FIGS. 41A-41D after the gate replacement process has been performed including the removal of dummy gate dielectric layers, the removal of and replacement of sacrificial layer with a gate conductor layers, a gate contact and sacrificial gate cap.

FIG. 43 is a schematic cross-sectional view of the semiconductor structure according to FIG. 42A illustrating an inverter complimentary FET (CFET) circuit formed by the semiconductor structure.

FIG. 44 is a top-down view and FIGS. 45A through 47D are schematic cross-sectional views of the semiconductor structure of FIGS. 42A-42D after the formation of middle-of-line (MOL) contacts.

FIG. 53 is a top-down view and FIGS. 54A through 56D are schematic cross-sectional views of the semiconductor structure of FIGS. 51A-51D after the formation of MOL contacts.

DETAILED DESCRIPTION

Embodiments of the invention will now be described in further detail below. Devices and methods are provided to fabricate nanosheet field-effect transistor devices having buried power rails under active devices utilizing diffusion break contacts.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The terms "electrical contact" and "electrical communication" as used herein refer to direct contact between two elements or an electrical connection between two elements via one or more intermediate structures.

FIGS. 1 through 14C schematically illustrate an example method for fabricating semiconductor structure 100 according to a first illustrative embodiment.

Figure 1:
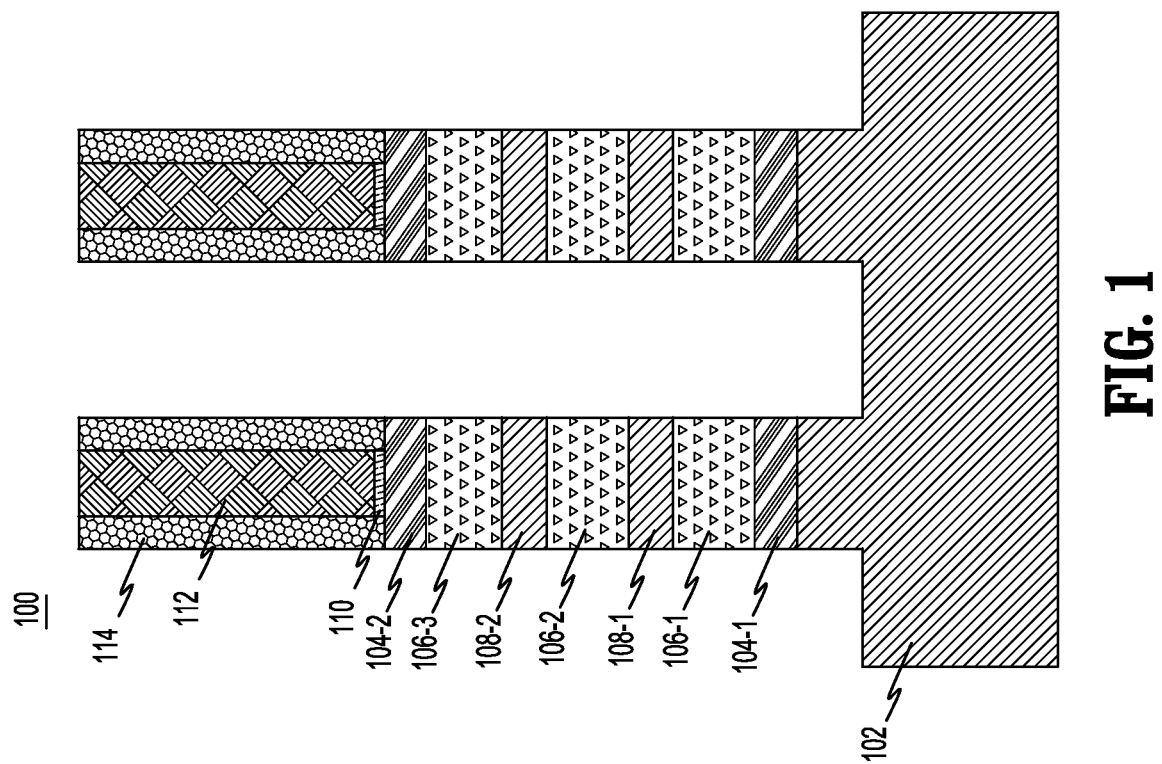
FIG. 1 is a schematic cross-sectional view of a semiconductor structure according to a first illustrative embodiment.

FIG. 1 is schematic cross-sectional view of the semiconductor structure 100 at an intermediate stage of fabrication. Semiconductor structure 100 comprises a semiconductor substrate 102, a nanosheet stack structure comprising sacrificial layers 104-1 and 104-2, sacrificial layers 106-1, 106-2 and 106-3 and sacrificial layers 108-1 and 108-2, dummy gate dielectric layers 110, dummy gate electrodes 112 and sidewall spacers 114. While not illustrated, gate capping layers (not shown) may also be disposed on the dummy gate electrodes 112.

While the semiconductor substrate 102 is illustrated as a generic substrate layer, it is to be understood that the semiconductor substrate 102 may comprise one of different types of semiconductor substrate structures and materials. For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g., III-V), etc. In another embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure.

Sacrificial layers 104-1 and 104-2 are also referred to collectively and individually as sacrificial layers 104. Sacrificial layers 106-1 through 106-3 are also referred to collectively and individually as sacrificial layers 106. Sacrificial layers 108-1 and 108-2 are also referred to collectively and individually as sacrificial layers 108. The sacrificial layers 104, 106 and 108 of the nanosheet stack structure comprise epitaxial layers that are sequentially grown.

In one embodiment, the epitaxial sacrificial layers 104, 106 and 108 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the epitaxial sacrificial layers 104, 106 and 108 will depend on various factors such as the desired level of etch selectivity between the sacrificial layers, as well as providing sufficient lattice matching between the materials of the sacrificial layers to ensure proper (e.g., defect-free) epitaxial growth of the crystalline sacrificial layers 104, 106 and 108.

For example, in one embodiment, one of sacrificial layers 104, 106 and 108 are formed of epitaxial silicon (Si) while the other sacrificial layers 106 and 108 are formed of epitaxial silicon-germanium (SiGe) alloys having varying concentrations of Ge. This allows the sacrificial layers 104, 106 and 108 to be etched selective to each other. In some embodiments, sacrificial layers 104 comprise an SiGe alloy having a range of about 25% to 40% Ge, sacrificial layers 106 comprise an SiGe alloy having a range of about 50% to about 90% Ge and sacrificial layers 108 comprise Si or an SiGe alloy having a range of about 5% to about 15% Ge. In an example embodiment, sacrificial layers 104 comprise an SiGe alloy having about 25% Ge, sacrificial layers 106 comprise an SiGe alloy having about 60% Ge and sacrificial layers 108 comprise Si. In some embodiments, other materials that are selectively etchable relative to each other may be utilized for the sacrificial layers 104, 106 and 108.

While the nanosheet stack structure is shown to include two sacrificial layers 104, three sacrificial layers 104 and two sacrificial layers 104, in other embodiments, the nanosheet stack structure can be fabricated with more or less than two sacrificial layers 104, three sacrificial layers 104 and two sacrificial layers 104.

With continued reference to FIG. 1, the sacrificial layers 104, 106 and 108 may be formed with a thickness that defines the spacing size in which high-k dielectric material and work function metal will be formed. In one embodiment, the thickness of the sacrificial layers 104 is in a range of about 4 nm to about 8 nm, the thickness of the sacrificial layers 106 is in a range of about 8 nm to about 15 nm and the thickness of the sacrificial layers 108 is in a range of about 4 nm to about 8 nm. In some embodiments, other thicknesses for each of sacrificial nanosheet layers 104, 106 and 108 may be used.

Dummy gate dielectrics 110, dummy gate electrodes 112 and sidewall spacers 114 may be formed using standard deposition and lithographic processes.

For example, a conformal layer of silicon oxide may be deposited over the semiconductor structure 100 to form a dummy gate dielectric layer followed by a blanket deposition of a sacrificial material such as polysilicon or amorphous silicon material to form a dummy gate electrode layer. In some embodiments, a CMP process is performed to planarize one or both of the deposited materials. A hard mask layer is formed on the planarized surface of the polysilicon layer by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers.

The hard mask layer is then patterned to form a gate capping layers (not shown) which defines an image of the dummy gate structure. The gate capping layers are then utilized as an etch hardmask to anisotropically etch (e.g., RIE) the sacrificial polysilicon layer and silicon oxide layer to thereby form the dummy gate dielectrics 110 and dummy gate electrodes 112 of the gate structures. In illustrative embodiments, the etching chemistry for patterning the dummy gate dielectrics 110 and dummy gate electrodes 112 is selective to the gate capping layers and the sacrificial layer 104-2.

The sidewall spacers 114 are formed by depositing a conformal layer of dielectric material over the entire surface of the semiconductor structure 100. The conformal layer of dielectric material can be formed of SiN, SiCN, SION, BN, SiBN, SiBCN, SiOC, SiOCN, or any other type of dielectric material that is commonly used to form insulating sidewall spacers of FET devices, and deposited using known techniques such as atomic layer deposition (ALD), CVD and PVD. The conformal layer of dielectric material is then patterned by performing an anisotropic dry etch process, such as RIE, to etch down the conformal layer of dielectric material in a vertical direction. This etch process is performed selective to the materials of the sacrificial layer 104-2 and gate capping layers (not shown). The etch process results in the formation of the sidewall spacers 114 on the dummy gate dielectrics 110 and dummy gate electrodes 112, which surround the sidewall surfaces of the dummy gate dielectrics 110 and dummy gate electrodes 112. In one embodiment, the thickness of the sidewall spacers 114 is in a range of about 3 nm to about 10 nm, although the sidewall spacer 114 can be formed with other thickness ranges. During the etch process to form the sidewall spacer 114, the portions of the conformal layer of dielectric material on the lateral surfaces of the semiconductor structure 100, e.g., on the upper surfaces of the sacrificial layer 104-2 and gate capping layers (not shown), will be etched away, exposing the upper surfaces of the sacrificial layer 104-2 and gate capping layers (not shown).

An etch process is utilized to recess the exposed portion of the nanosheet stack structure down into the semiconductor substrate 102 according to a pattern defined by sidewall spacers 114 and gate capping layers (not shown). For example, dry or wet etching techniques may be utilized to recess the exposed portion of the nanosheet stack structure and the semiconductor substrate 102 according to the pattern in one or more steps. The etch chemistry that is used to perform the recess may be selective to one or more of the materials of the gate capping layers and sidewall spacer 114. In some embodiments, a directional RIE process is utilized to recess the exposed portion of the nanosheet stack structure down into the semiconductor substrate 102 according to the pattern with the chemistry being selective to the material of the gate capping layers and sidewall spacer 114.

Figure 2:
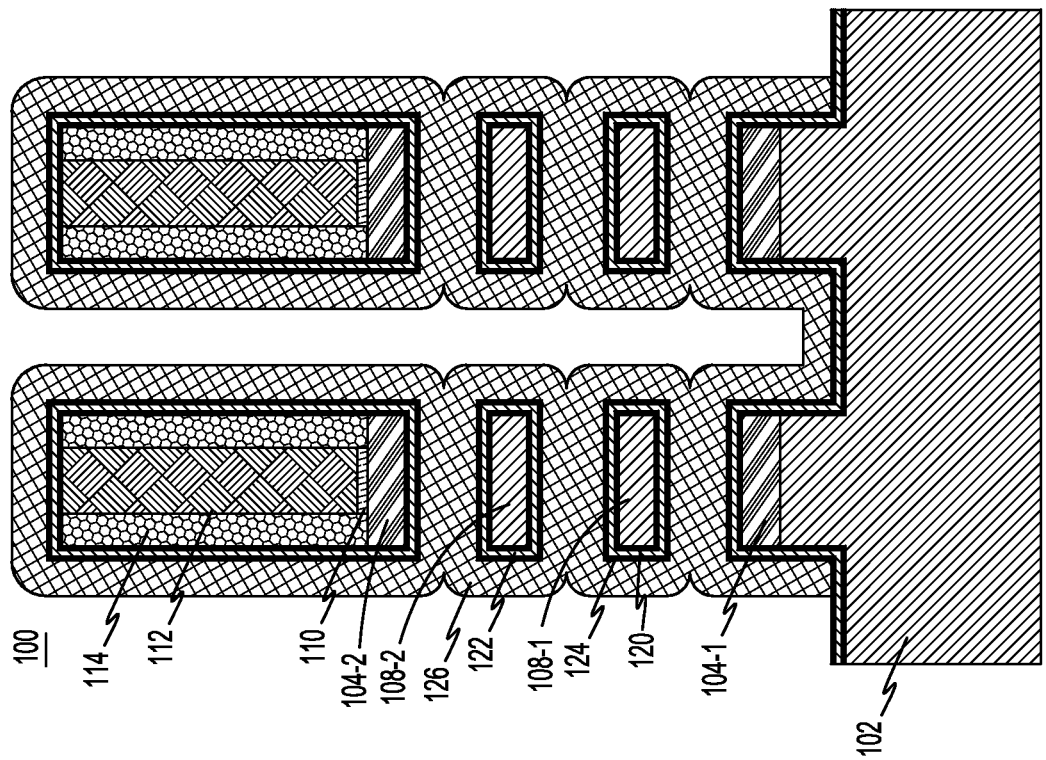
FIG. 2 is schematic cross-sectional view of the semiconductor structure of FIG. 1 after the removal of the sacrificial layers, the deposition of an inner dielectric layer, the deposition of a channel layer, the deposition of an outer dielectric layer and the deposition of a sacrificial layer.

FIG. 2 is schematic cross-sectional view of the semiconductor structure 100 of FIG. 1 after the removal of the sacrificial layers 106, the deposition of an inner dielectric layer 120, the deposition of a channel layer 122, the deposition of an outer dielectric layer 124 and the deposition of a sacrificial layer 126.

One or more etch processes are utilized to remove the sacrificial layers 106. In some embodiments, dry or wet etch processes may be utilized to etch the sacrificial layers 106 without removing the other layers of the nanosheet stack structure. For example, the etch chemistry and process may be selective to the materials of the semiconductor substrate 102, sacrificial layers 104 and 108, gate capping layers (not shown) and sidewall spacers 114. For example, the etch chemistry may be configured to remove the SiGe alloy concentration of the sacrificial layers 106, e.g., about 50% to about 90% Ge, while being selective to the lower concentrations of Ge found in sacrificial layers 104, e.g., about 25% to 40% Ge, and sacrificial layers 108, Si or about 5% to about 15% Ge. In some embodiments, a dry vapor phase etch process may be utilized to remove the sacrificial layers 106. In one embodiment, the SiGe material of the sacrificial layers 106 can be selectively etched (with high etch selectivity) using a gas phase HCl (hydrochloric acid) or wet etch solution to laterally etch the SiGe material of the sacrificial layers 106 selective to the Si and SiGe material of the sacrificial layers 104 and 108. The gas phase HCl (hydrochloric acid) provides high etch selectivity when, for example, the sacrificial layers 104 and 108 are formed of Si or SiGe with a lower Ge concentration than the SiGe material of the sacrificial layers 106.

Inner dielectric layer 120 comprises, for example, a high-K dielectric layer including, but not necessarily limited to, HfO2 (hafnium oxide), ZrO2 (zirconium dioxide), hafnium zirconium oxide, Al2O3 (aluminum oxide), and Ta2O5 (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In one embodiment, the dielectric material for the inner dielectric layer 120 is conformally deposited using a highly conformal deposition process, such as ALD. Other deposition methods such as CVD and PVD can be utilized to deposit a highly conformal layer of dielectric material on the semiconductor structure 100. In some embodiments, the inner dielectric layer 120 is deposited as a thin layer, e.g., having a thickness in a range of about 0.5 nm to about 2 nm and in an illustrative embodiment about 1 nm to about 1.5 nm.

In some embodiments, channel layer 122 comprises channel materials including, but not necessarily limited to, Titanium (Ti)-based materials, Tungsten (W)-based materials, Molybdenum (Mo)-based materials, graphene-based materials, III-V-based materials or other materials. Some example materials include Tungsten disulfide ($WS_2$), Tungsten diselenide ($WSe_2$), Molybdenum disulfide ($MoS_2$), Molybdenum diselenide ($MoSe_2$), Tungsten ditelluride ($WTe_2$) and Molybdenum ditelluride ($MoTe_2$), Indium tin oxide (ITO), Indium Aluminum-doped Zinc Oxide (IAZO) or other materials deposited or formed in a thin layer, e.g., a two-dimensional (2D) layer such as a mono layer or bi-layer deposition, having a thickness in a range of about 0.3 nm to about 2 nm or less. In some embodiments, the material used for the channel layer 122 may be selected based on the type of semiconductor structure 100, e.g., nFET or pFET. In one embodiment, the material for the channel layer 122 is conformally deposited using a highly conformal deposition process, such as ALD. Other deposition methods such as CVD and PVD can be utilized to deposit a highly conformal thin layer of channel material on the inner dielectric layer 120.

Outer dielectric layer 124 comprises, for example, a high-K dielectric layer including, but not necessarily limited to, HfO2 (hafnium oxide), ZrO2 (zirconium dioxide), hafnium zirconium oxide, Al2O3 (aluminum oxide), and Ta2O5 (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In one embodiment, the dielectric material for the outer dielectric layer 124 is conformally deposited using a highly conformal deposition process, such as ALD. Other deposition methods such as CVD can be utilized to deposit a highly conformal layer of dielectric material to cover exposed portions of the channel layer 122. In some embodiments, the outer dielectric layer is deposited as a thin layer, e.g., having a thickness in a range of about 0.5 nm to about 2 nm and in an illustrative embodiment about 1 nm to about 1.5 nm.

In illustrative embodiments, the combined thickness of inner dielectric layer 120, channel layer 122 and outer dielectric layer 124 is about 3 nm to 4 nm or less.

Sacrificial layer 126 comprises, for example, a material that is selectively etchable to the outer dielectric layer 124. In some embodiments, non-limiting examples of materials that may be utilized for sacrificial layer 126 may comprise $Al_2O_3$, AlN, $La_2O_3$, $TiO_2$, GaN, $SiO_2$, $GeO_2$, $Ge_2N_3$ or other materials that can be conformally deposited and are able to withstand selective etching of sacrificial layers 104 and 108. In one embodiment, the material for sacrificial layer 126 is conformally deposited using a highly conformal deposition process, such as ALD, to ensure that the recesses are sufficiently filled with dielectric material. Other deposition methods such as CVD and PVD can be utilized to deposit a highly conformal layer of sacrificial material to fill the recesses.

Figure 3:
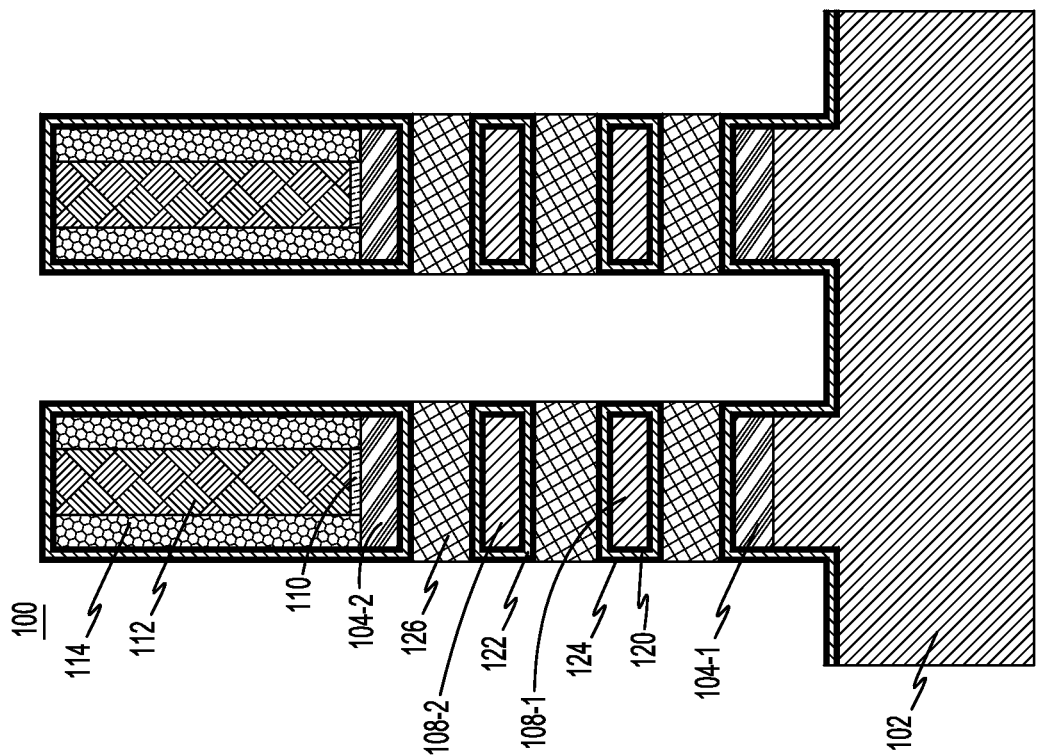
FIG. 3 is schematic cross-sectional view of the semiconductor structure of FIG. 2 after trimming the sacrificial layer in the channels between the gate structures.

FIG. 3 is schematic cross-sectional view of the semiconductor structure 100 of FIG. 2 after trimming the sacrificial layers 126 in the channels between the gate structures. The sacrificial layers 126 are trimmed using known etching techniques and etch chemistries. For example, the sacrificial layers 126 can be trimmed using a direction RIE or wet etch that is selective to, e.g., outer dielectric layer 124. As seen in FIG. 3, the trimming leaves the sacrificial layers 126 in the nanosheet stack structure between the outer dielectric layer 124.

Figure 4:
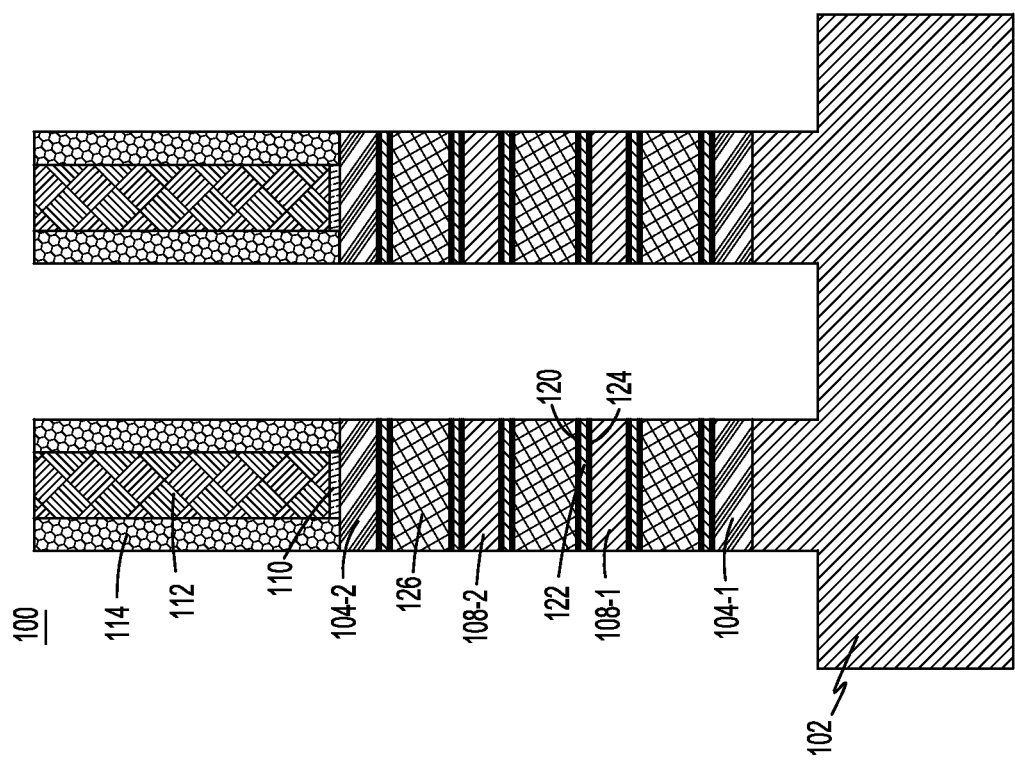
FIG. 4 is schematic cross-sectional view of the semiconductor structure of FIG. 3 after etching the inner dielectric layer, channel layer, outer dielectric layer and sacrificial layer based on a pattern defined by the sidewall spacers.

FIG. 4 is schematic cross-sectional view of the semiconductor structure 100 of FIG. 3 after etching the inner dielectric layer 120, channel layer 122, outer dielectric layer 124 and sacrificial layer 126 based on a pattern defined by the sidewall spacers 114. The etching may be performed in one or more etch processes. For example, dry or wet etching techniques may be utilized to remove the inner dielectric layer 120, channel layer 122, outer dielectric layer 124 and sacrificial layer 126 according to the pattern in one or more steps while leaving the inner dielectric layer 120, channel layer 122, outer dielectric layer 124 and sacrificial layer 126 under the gate structures. The etch chemistry that is used to perform the etching may be selective to one or more of the materials of the gate capping layers and sidewall spacer 114. In some embodiments, a directional RIE process is utilized to remove the inner dielectric layer 120, channel layer 122, outer dielectric layer 124 and sacrificial layer 126 according to the pattern with the chemistry being selective to the material of the gate capping layers, sidewall spacer 114 and semiconductor substrate 102.

Figure 5:
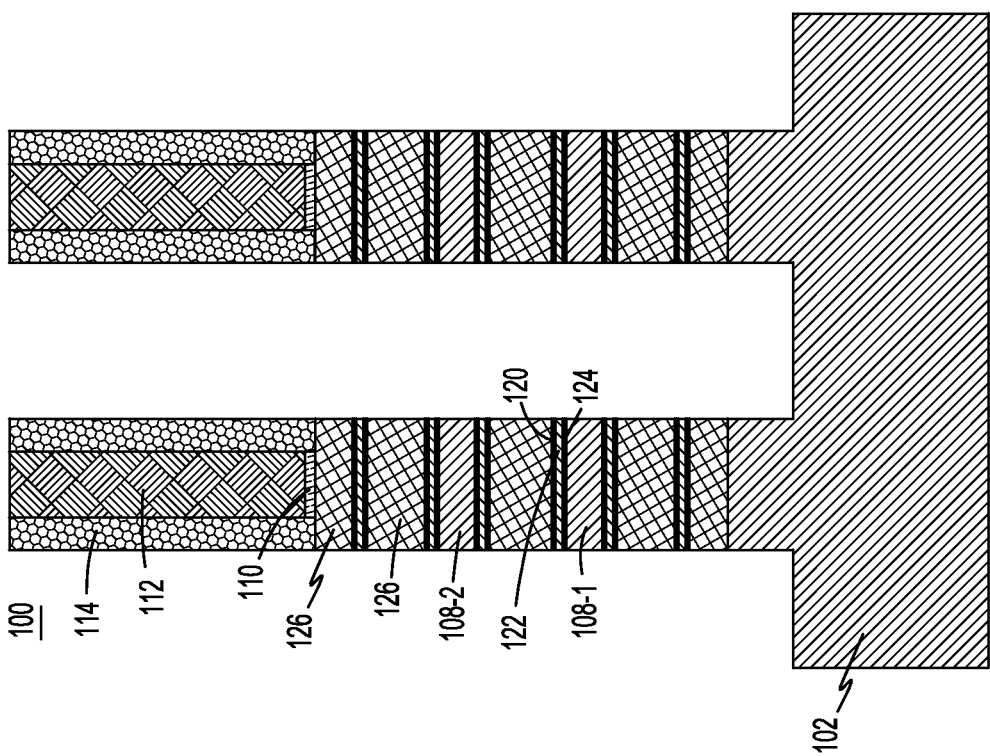
FIG. 5 is schematic cross-sectional view of the semiconductor structure of FIG. 4 after removing the sacrificial layers, forming additional material for sacrificial layer and etching the additional sacrificial layer based on a pattern defined by the sidewall spacers.

FIG. 5 is schematic cross-sectional view of the semiconductor structure 100 of FIG. 4 after removing the sacrificial layers 104, forming additional material for sacrificial layer 126 and etching the additional sacrificial layer 126 based on a pattern defined by the sidewall spacers 114.

One or more etch processes are utilized to remove the sacrificial layers 104. In some embodiments, dry or wet etch processes may be utilized to etch the sacrificial layers 104 without removing the other layers of the nanosheet stack structure. For example, the etch chemistry and process may be selective to the materials of the semiconductor substrate 102, sacrificial layers 108, gate capping layers (not shown) and sidewall spacers 114. For example, the etch chemistry may be configured to remove the SiGe alloy concentration of the sacrificial layers 104, e.g., about 25% to 40% Ge, while being selective to the lower concentration of Ge found in sacrificial layers 108, e.g., Si or about 5% to about 15% Ge. In some embodiments, a dry vapor phase etch process may be utilized to remove the sacrificial layers 104. In one embodiment, the SiGe material of the sacrificial layers 104 can be selectively etched (with high etch selectivity) using a gas phase HCl (hydrochloric acid) or wet etch solution to laterally etch the SiGe material of the sacrificial layers 104 selective to the Si or SiGe material of the sacrificial layers 108. The gas phase HCl (hydrochloric acid) provides high etch selectivity when, for example, the sacrificial layers 108 are formed of Si or SiGe with a lower Ge concentration than the SiGe material of the sacrificial layers 104.

Additional sacrificial material for sacrificial layer 126 is conformally deposited using a highly conformal deposition process, such as ALD, to ensure that the recesses exposed by removal of the sacrificial layers 104 are sufficiently filled with dielectric material. Other deposition methods such as CVD and PVD can be utilized to deposit a highly conformal layer of sacrificial material to fill the recesses.

The sacrificial layer 126 is trimmed in a similar manner to that described above using known etching techniques and etch chemistries. For example, the sacrificial layer 126 can be trimmed according to a pattern defined by sidewall spacers 114 using a direction RIE or wet etch that is selective to, e.g., inner dielectric layer 120, channel layer 122, outer dielectric layer 124, semiconductor substrate 102 and sidewall spacers 114.

Figure 6:
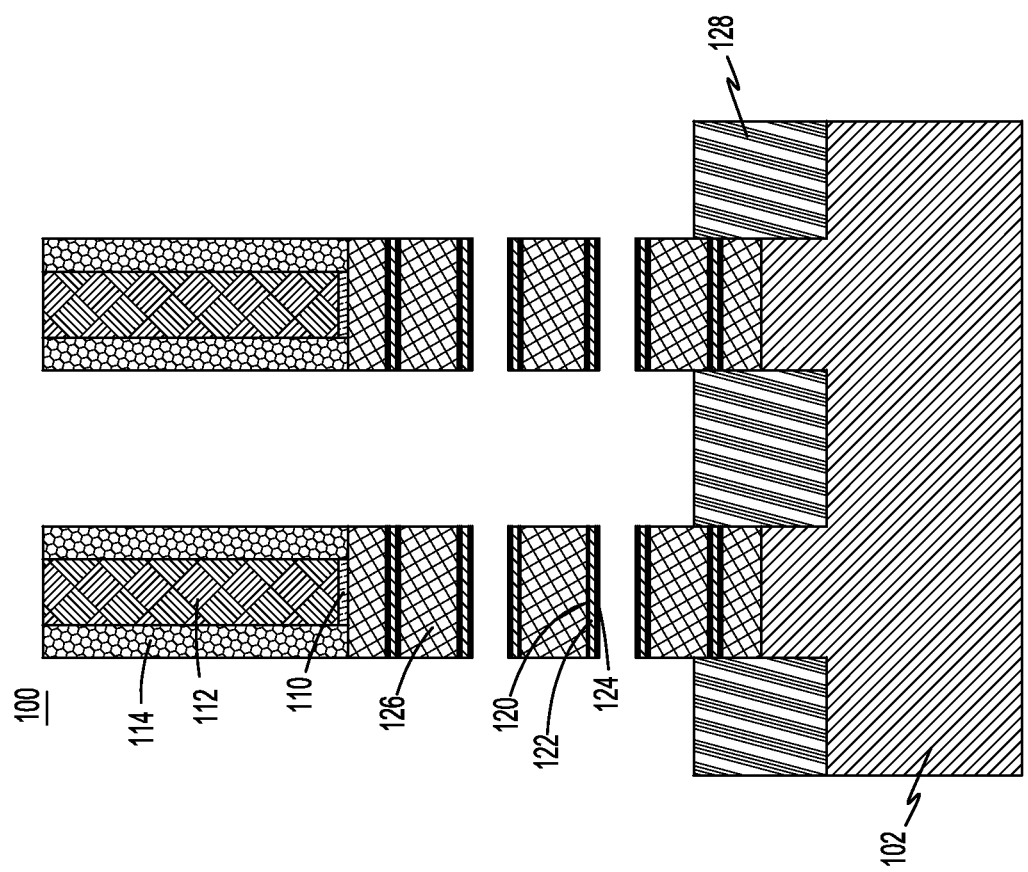
FIG. 6 is schematic cross-sectional view of the semiconductor structure of FIG. 5 after forming an etch mask, recessing the etch mask below the sacrificial layers to expose the sacrificial layers and removing the sacrificial layers.

FIG. 6 is schematic cross-sectional view of the semiconductor structure 100 of FIG. 5 after forming an etch mask 128, recessing the etch mask 128 below the sacrificial layers 108 to expose the sacrificial layers 108, and removing the sacrificial layers 108.

An OPL may be coated on the semiconductor structure 100, followed by an etch process to etch OPL down to the desired level to form the etch mask 128 as shown in FIG. 6. The OPL may comprise, for example, a resin material that is applied by spin coating and baked to enhance planarization. The OPL is recessed such that etch mask 128 exposes the sacrificial layers 108. A timed directional etch process, e.g., a directional RIE process, may be utilized to etch the OPL down to the desired level. For example, the etch chemistry may be selective to the material of the gate capping layers (not shown), sidewall spacers 114, inner dielectric layer 120, channel layer 122, outer dielectric layer 124 and sacrificial layer 126. In some embodiments, the OPL may be recessed using for example, a plasma etch process or ash process.

One or more etch processes are utilized to remove the sacrificial layers 108. In some embodiments, dry or wet etch processes may be utilized to etch the sacrificial layers 108 without removing the other layers of the nanosheet stack structure. For example, the etch chemistry and process may be selective to the materials of the gate capping layers (not shown), sidewall spacers 114, inner dielectric layer 120, channel layer 122, outer dielectric layer 124, sacrificial layer 126 and etch mask 128. In some embodiments, a dry vapor phase etch process may be utilized to remove the sacrificial layers 108. In one embodiment, the sacrificial layers 108 can be selectively etched (with high etch selectivity) using a gas phase HCl (hydrochloric acid) or wet etch solution to laterally etch the material of the sacrificial layers 108.

Figure 7:
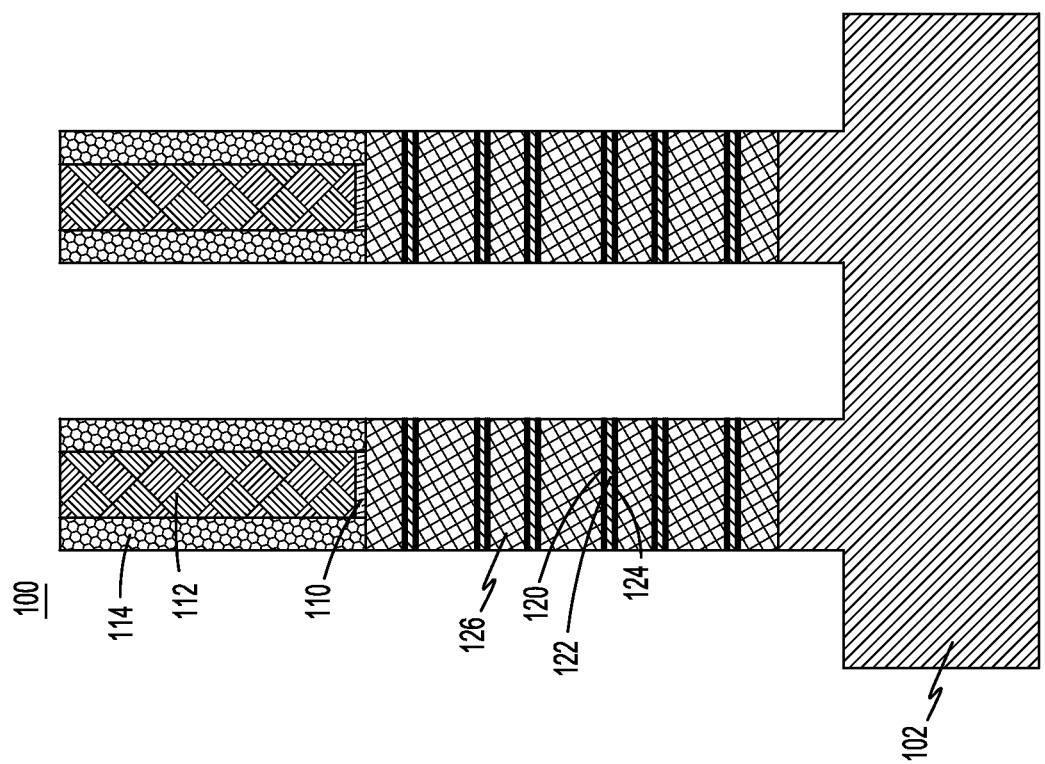
FIG. 7 is schematic cross-sectional view of the semiconductor structure of FIG. 6 after removing the etch mask, forming additional material for sacrificial layer and etching the additional sacrificial layer based on a pattern defined by the sidewall spacers.

FIG. 7 is schematic cross-sectional view of the semiconductor structure 100 of FIG. 6 after removing the etch mask 128, forming additional material for sacrificial layer 126 and etching the additional sacrificial layer 126 based on a pattern defined by the sidewall spacers 114.

Etch mask 128 may be removed using, for example, a plasma etch process or ash process.

Additional sacrificial material for sacrificial layer 126 is conformally deposited using a highly conformal deposition process, such as ALD, to ensure that the recesses exposed by removal of the sacrificial layers 108 are sufficiently filled with dielectric material. Other deposition methods such as CVD and PVD can be utilized to deposit a highly conformal layer of sacrificial material to fill the recesses.

The sacrificial layer 126 is trimmed in a similar manner to that described above using known etching techniques and etch chemistries. For example, the sacrificial layer 126 can be trimmed according to a pattern defined by sidewall spacers 114 using a direction RIE or wet etch that is selective to, e.g., inner dielectric layer 120, channel layer 122, outer dielectric layer 124, semiconductor substrate 102 and sidewall spacers 114.

Figure 8:
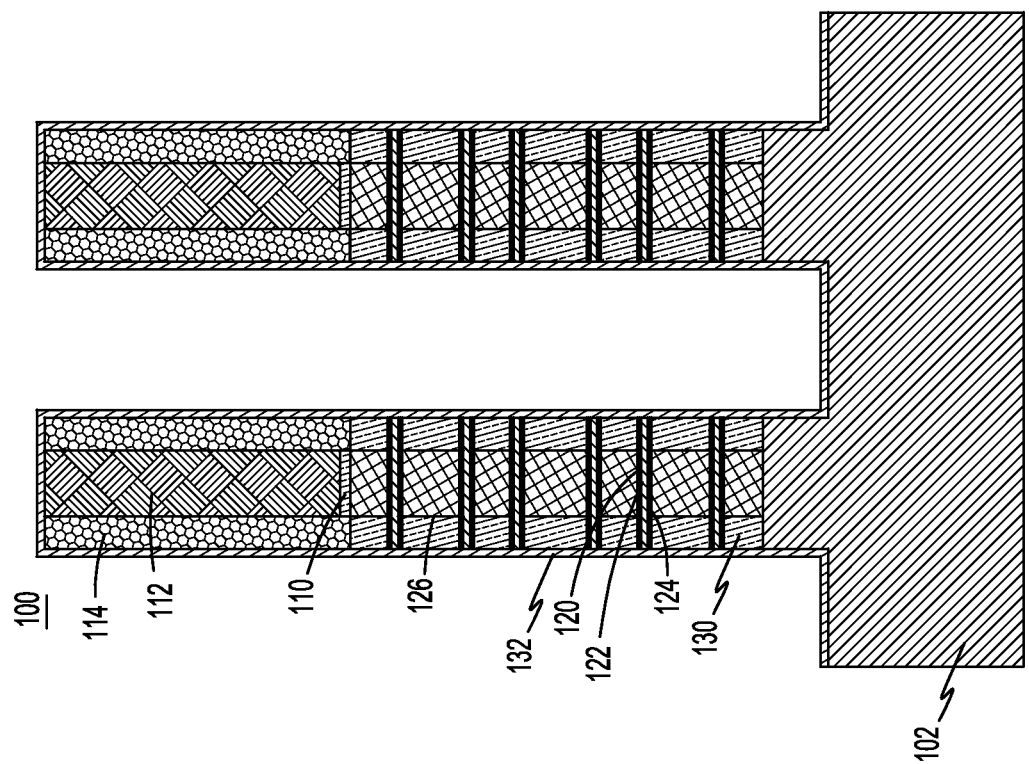
FIG. 8 is schematic cross-sectional view of the semiconductor structure of FIG. 7 after recessing sacrificial layer to form inner spacers and forming a contact layer.

FIG. 8 is schematic cross-sectional view of the semiconductor structure 100 of FIG. 7 after recessing sacrificial layer 126 to form inner spacers 130 and forming a contact layer 132. In one embodiment, the inner spacers 130 are formed by a process which comprises laterally recessing exposed sidewall surfaces of the sacrificial layer 126 of the nanosheet stack structure to form recesses in the sidewalls of the nanosheet stack structure. As shown in FIG. 8, the exposed sidewall surfaces of the sacrificial layers 126 are laterally recessed to a pre-determined depth. The amount of lateral recess is controlled through a timed etch. In one embodiment, the depth of the recess is substantially equal to the thickness of the adjacent sidewall spacer 114. In some embodiments, the depth of the recess may be about 4 nm to about 8 nm and in illustrative embodiments about 6 nm.

The lateral etch process can be performed using an isotropic wet etch process with an etch solution that is suitable to etch the material of the sacrificial layer 126 selective to the inner dielectric layer 120, channel layer 122, outer dielectric layer 124, semiconductor substrate 102 and sidewall spacers 114 and other exposed elements. In another embodiment, an isotropic dry plasma etch process can be performed to laterally etch the exposed sidewall surfaces of the sacrificial layer 126 selective to the inner dielectric layer 120, channel layer 122, outer dielectric layer 124, semiconductor substrate 102 and sidewall spacers 114 and other exposed elements.

The recesses are then filled with dielectric material to form the inner spacers 130 (or embedded spacers) on the sidewalls of the nanosheet stack structure. In one embodiment, the inner spacers 130 are formed by depositing a conformal layer of dielectric material over the semiconductor structure 100 until the recesses are filled with dielectric material, followed by an etch back to remove the excess dielectric material. The inner spacers 130 can be formed of SiN, SiBCN, SiOCN, SiOC, $SiO_2$, SiW or any other type of dielectric material (e.g., a low-k dielectric material having a k of less than 5) which is commonly used to form insulating gate sidewall spacers of FET devices. In some embodiments, the dielectric material that is used to form inner spacers 130 comprises an oxide on which the 2D channel material can be functionalized. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the nanosheet stack structure and expose the inner dielectric layer 120, channel layer 122 and outer dielectric layer 124 while leaving the dielectric material in the recesses to form the inner spacers 130. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), or any combination thereof.

Contact layer 132 comprises a contact material that is configured for electrically connecting the channel layer 122 to a metal-based source/drain region with as small an amount of contact resistance as possible. In some embodiments, contact layer 132 comprises a Bismuth (Bi)-based material, an Antimony-based material or other metal-based material. The contact layer 132 is formed using, for example, deposition techniques including, but not limited to, CVD, PECVD, RFCVD, PVD, ALD, MLD, MBD, PLD, LSMCD, sputtering, and/or plating. In an illustrative embodiment, contact material is deposited on the semiconductor structure 100 including on semiconductor substrate 102, the exposed surfaces of sidewall spacers 114, inner dielectric layer 120, channel layer 122, outer dielectric layer 124 and inner spacers 130 to form contact layer 132 in electrical contact with channel layer 122, for example, as seen in FIG. 8.

In some embodiments the contact material that is utilized to form contact layer 132 may be selected based on the type of semiconductor structure 100, e.g., a n-type or p-type semiconductor structure 100. The contact layer 132 provides a low resistance contact between the source/drain regions 134 and the channel layer 122. In some embodiments, contact layer 132 is formed as a dual layer contact that comprises, for example, a layer of the same material that is used for the channel layer 122 and a layer of a semimetal contact such as, e.g., bismuth or antimony. In other embodiments contact layer 132 comprises a single material layer, for example, a layer of the channel material only or a layer of the semimetal material. In addition, the contact layer reduces the Schottky barrier between the channel layer 122 and the metal-based source/drain regions that are formed later.

Figure 9C:
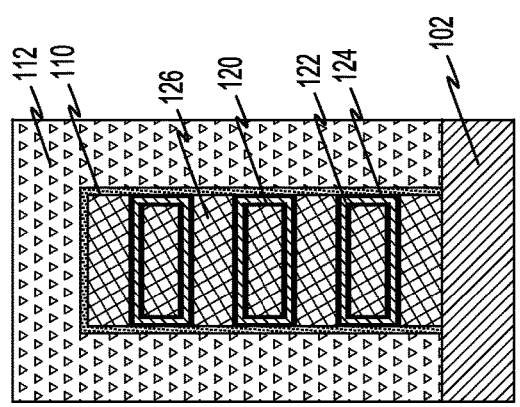
FIGS. 9A-9C are schematic cross-sectional views of the semiconductor structure of FIG. 8 after forming source/drain regions, recessing the source/drain regions and forming an inter-layer dielectric (ILD) over the recessed source/drain regions.
Figure 9B:
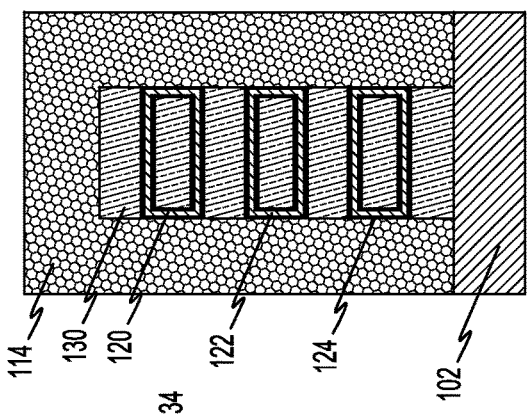
Figure 9A:
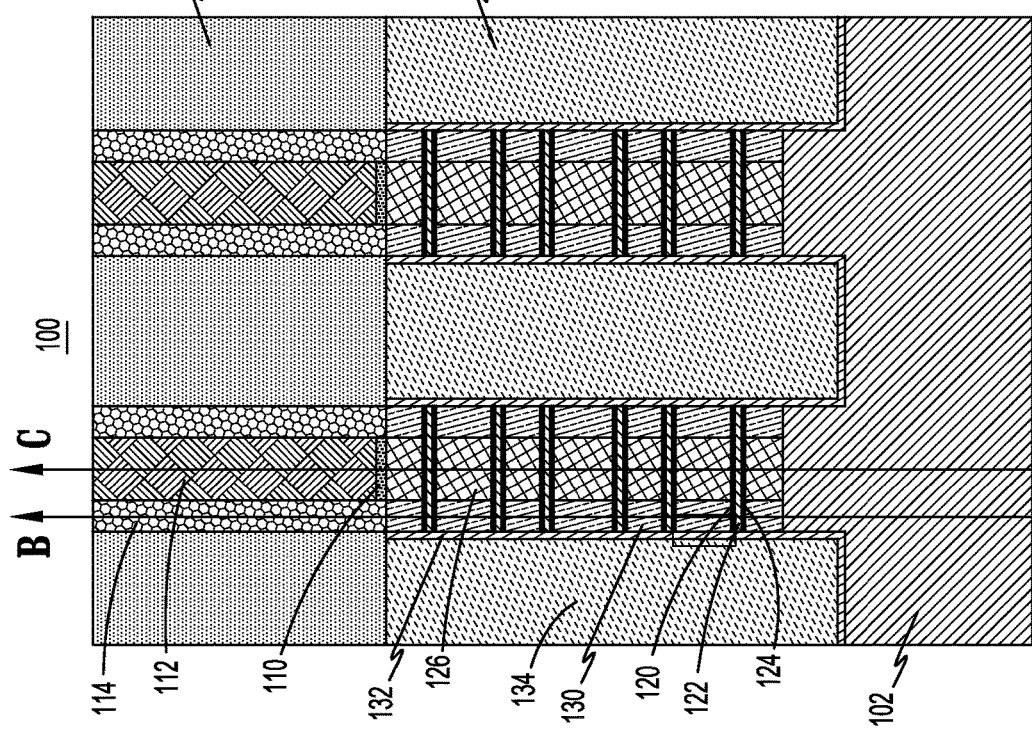

FIGS. 9A-9C are schematic cross-sectional views of the semiconductor structure 100 of FIG. 8 after forming source/drain regions 134, recessing the source/drain regions 134 and forming an inter-layer dielectric (ILD) 136 over the recessed source/drain regions 134. FIG. 9B is taken along section line B-B of FIG. 9A and FIG. 9C is taken along section line C-C of FIG. 9A.

The source/drain regions 134 comprise metal-based materials that are formed using standard deposition techniques. In an illustrative embodiment, source/drain regions 134 comprise a metal-based material for either an nFET device or a pFET device. For nFET devices, the metal-based material may comprise titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the metal-based material may comprise TiN, tantalum nitride (TaN), or another suitable material. In some embodiments, the pFET metal-based material may comprise may include a metal stack, where a thicker barrier layer (e.g., of TiN, TaN, etc.) is formed followed by a metal-based material such as Ti, Al, TiAl, TiAlC, or any combination of Ti and Al alloys. Other metal-based materials that may be used for either the nFET or pFET devices may include, but are not limited to W, Co, Bi, Sb, Al, Sn, In, Mo or other metal-based materials. It should be appreciated that various other materials may be used for the source/drain regions 134 as desired.

The source/drain regions 134 are formed using, for example, deposition techniques including, but not limited to, CVD, PECVD, RFCVD, PVD, ALD, MLD, MBD, PLD, LSMCD, sputtering, and/or plating. In an illustrative embodiment, source/drain regions 134 are deposited on the contact layer 132, for example, as seen in FIGS. 9A-9C. Excess metal-based materials may be removed using, for example, etching or CMP processes.

Source/drain regions 134 may be recessed, e.g., down to the bottom of the sidewall spacers 114, using one or more etch processes. For example, an isotropic wet etch process may be used to recess the source/drain regions 134.

ILD 136 may be formed, for example, by the deposition of a dielectric material, including, but not limited to SiOx, low temperature oxide (LTO), high temperature oxide (HTO), flowable oxide (FOX) or some other dielectric, on the source/drain regions 134. The ILD 136 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD 136 and planarize the resulting structure. The planarization can be performed down to the dummy gate electrodes 112 such that the gate capping layers (not shown) are removed and the dummy gate electrodes 112 are exposed. In accordance with an exemplary embodiment, the ILD 136 electrically isolates the different gate structures from each other.

FIGS. 10A-10J are three-dimensional projection views of the semiconductor structure 100 of FIGS. 9A-9C illustrating the semiconductor structure during various steps of a gate replacement process. FIGS. 10A-10J will now be described with reference also to FIGS. 9A through 13C.

Figure 10A:
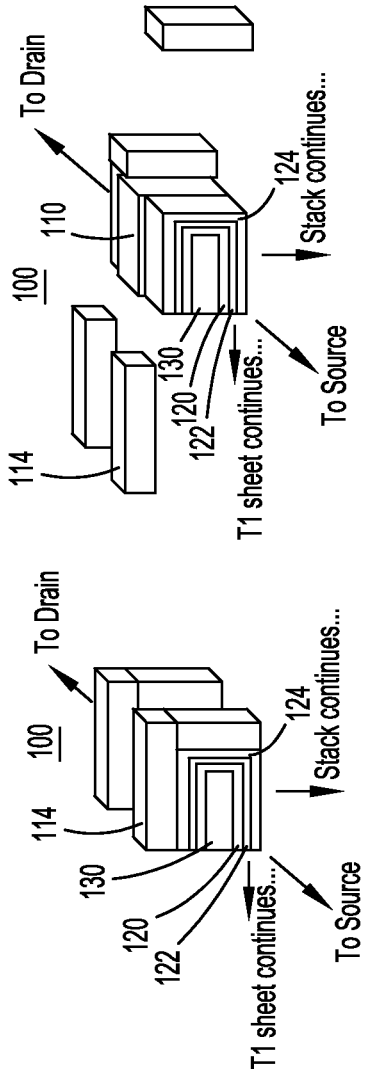

FIG. 10A corresponds to the stage of fabrication shown in FIGS. 9A-9C and illustrates the dummy gate electrodes 112 disposed between the sidewall spacers 114.

Figure 10B:
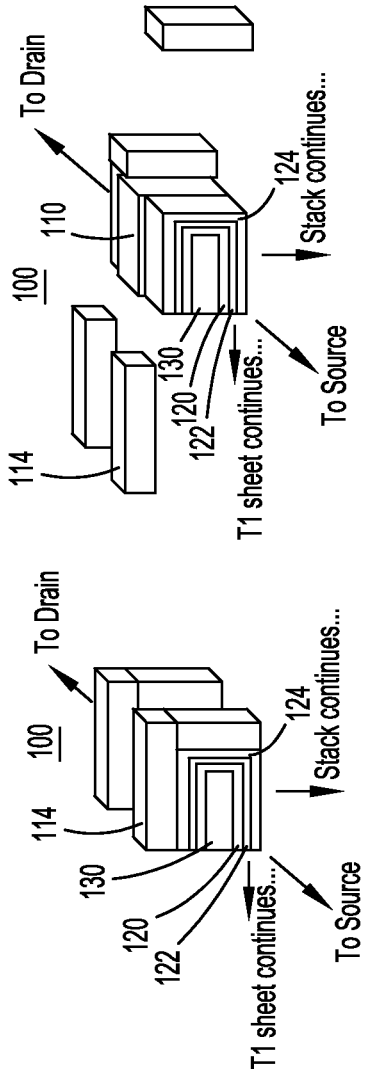
Figure 10C:
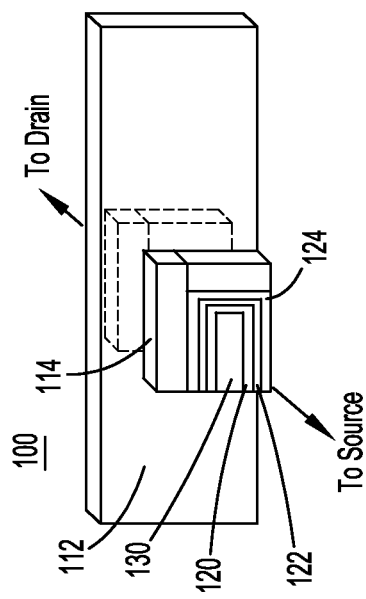
Figure 10D:
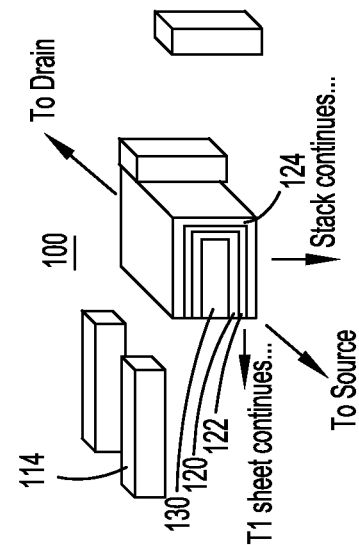
Figure 10E:
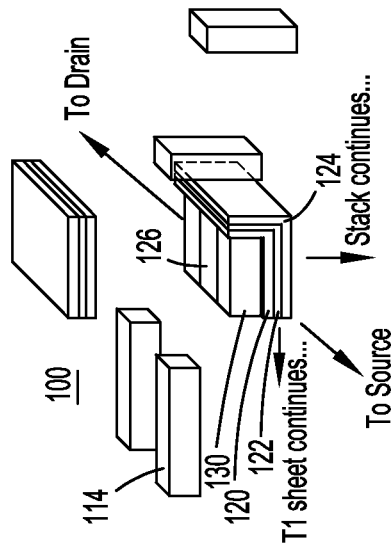
Figure 11A:
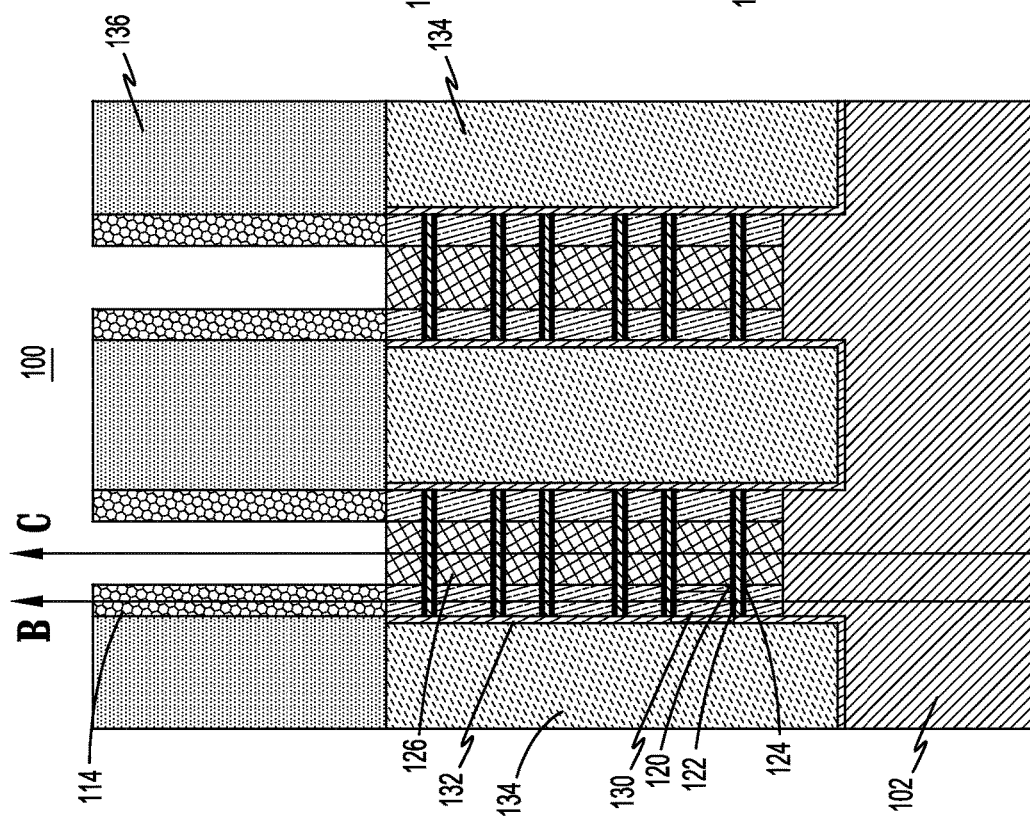
FIGS. 11A-11C are schematic cross-sectional views of the semiconductor structure of FIGS. 9A-9C after removal of the dummy gate electrodes, removal of the dummy gate dielectric layer and indentation of the inner dielectric layer, channel layer and outer dielectric layer to expose the portions of sacrificial layer enclosed therein.
Figure 11B:
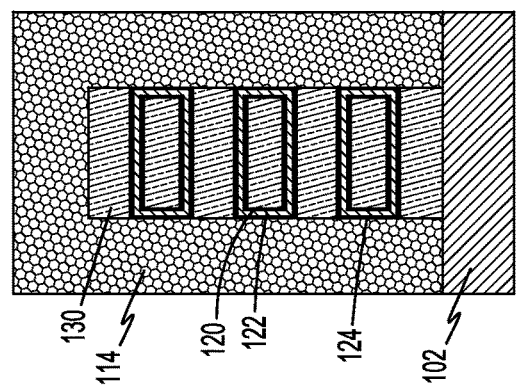
Figure 11C:
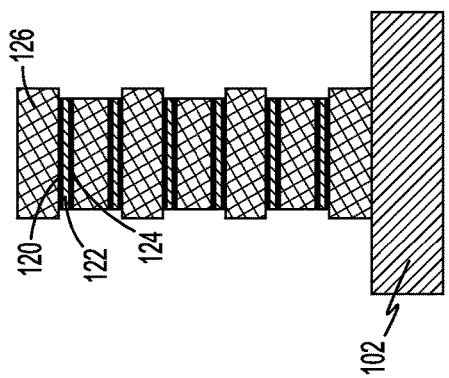

FIGS. 11A-11C are schematic cross-sectional views of the semiconductor structure 100 of FIGS. 9A-9C after removal of the dummy gate electrodes 112, removal of the dummy gate dielectric layer 110 and indentation of the inner dielectric layer 120, channel layer 122 and outer dielectric layer 124 to expose the portions of sacrificial layer 126 enclosed therein. FIG. 11B is taken along section line B-B of FIG. 11A and FIG. 11C is taken along section line C-C of FIG. 11A. FIGS. 10B-10G correspond to the process steps involved in the stage of fabrication shown in FIGS. 11A-11C.

The dummy gate electrodes 112 are etched away using known etching techniques and etch chemistries. For example, the dummy gate material can be removed using a selective dry etch or wet etch process with suitable etch chemistries, including ammonium hydroxide (NH$_4$OH), tetramethylammonium hydroxide (TMAH), or SF6 plasma. The etching of the dummy gate electrodes 112 is selective to, e.g., the ILD 136, dummy gate dielectric layers 110, sidewall spacers 114 and semiconductor substrate 102. The etching of the dummy gate electrodes 112 exposes the dummy gate dielectric layers 110. FIG. 10B illustrates the semiconductor structure 100 with the dummy gate electrodes 112 removed while FIG. 10C illustrates the same stage of fabrication but with the sidewall spacers 114 pulled away to show the exposed dummy gate dielectric layers 110.

The dummy gate dielectric layers 110 can be removed using a selective dry etch or wet etch process with suitable etch chemistries that are selective to the ILD 136, sidewall spacers 114, semiconductor substrate 102, inner dielectric layer 120, channel layer 122 and outer dielectric layer 124 and sacrificial layer 126. FIG. 10D illustrates the semiconductor structure 100 with the dummy gate dielectric layers 110 removed while FIG. 10E illustrates the same stage of fabrication but with the inner dielectric layer 120, channel layer 122 and outer dielectric layer 124 pulled away to show the sacrificial layer 126.

The inner dielectric layer 120, channel layer 122 and outer dielectric layer 124 are indented in the region exposed by removal of the dummy gate dielectric layers 110 using, for example, one or more isotropic RIE, dry etch or wet etch process, as seen in FIGS. 11C and 10F. For example, as seen in FIG. 10F, lateral surfaces of the inner dielectric layer 120, channel layer 122 and outer dielectric layer 124 are etched away to expose the sacrificial layer 126 surrounded by the inner dielectric layer 120, channel layer 122 and outer dielectric layer 124. The etch chemistries may be selective to the ILD 136, sidewall spacers 114 and semiconductor substrate 102.

FIGS. 12A-12C are schematic cross-sectional views of the semiconductor structure 100 of FIGS. 11A-11C after the gate replacement process has been performed according to an aspect of the first embodiment including recessing the inner dielectric layer 120, channel layer 122 and outer dielectric layer 124 relative to the sacrificial layer 126, forming gate dielectric layer 138 in the recesses to enclose the exposed portions of channel layers 122, the removal of sacrificial layer 126 and the formation of gate conductor layers 140 and 144, gate contacts 142 and 146 and sacrificial gate caps 148. FIG. 12B is taken along section line B-B of FIG. 12A and FIG. 12C is taken along section line C-C of FIG. 12A. FIGS. 10H and 10I correspond to the process steps involved in the stage of fabrication shown in FIGS. 12A-12C.

A further etch process is performed to recess the inner dielectric layer 120, channel layer 122 and outer dielectric layer 124, relative to the sacrificial layer 126, for example, as shown in FIG. 10G. The further etch process may utilize the same etch chemistries as the initial indentation shown in FIG. 11C.

In this aspect of the first embodiment, the gate dielectric layer 138 is formed prior to the removal of sacrificial layer 126. The gate dielectric layer 138 comprises, for example, a high-K dielectric layer including, but not necessarily limited to, HfO2 (hafnium oxide), ZrO2 (zirconium dioxide), hafnium zirconium oxide, Al2O3 (aluminum oxide), and Ta2O5 (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In one embodiment, the dielectric material for the gate dielectric layer 138 is conformally deposited using a highly conformal deposition process, such as ALD. Other deposition methods such as CVD and PVD can be utilized to deposit a highly conformal layer of dielectric material to cover exposed portions of the gate structures. Excess material may be removed using standard techniques. As shown in FIGS. 12C and 10J, for example, the exposed channel layer 122 is covered by the gate dielectric layer 138.

Sacrificial layer 126 is selectively etched away to release the inner dielectric layer 120, channel layer 122, outer dielectric layer 124 and gate dielectric layer 138, thereby allowing the opened gate structures to extend into spaces between and adjacent to the inner dielectric layer 120, channel layer 122, outer dielectric layer 124 and gate dielectric layer 138.

The sacrificial layer 126 can be etched away selective to the inner dielectric layer 120, channel layer 122, outer dielectric layer 124 and gate dielectric layer 138 using a wet etch process that is selective to inner dielectric layer 120, channel layer 122, outer dielectric layer 124, gate dielectric layer 138, sidewall spacers 114, inner spacers 130 and semiconductor substrate 102.

The gate conductor layers 140 and 144 may include a metal gate or work function metal (WFM). In an illustrative embodiment, gate conductor layers 140 and 144 comprise a WFM for either an nFET device or a pFET device. For nFET devices, the WFM for the gate conductor may comprise titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may comprise TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor layers 140 and 144 as desired. In illustrative embodiments, the material of gate conductor layer 140 is different than the material of gate conductor layer 144. In an illustrative embodiment, gate conductor layers 140 and 144 are deposited on the semiconductor structure 100 and within the nanosheet stack structure, for example, as seen in FIGS. 12A and 12B.

The gate structures further include gate contacts 142 and 146 including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited in channels etched into the gate conductor layers 140 and 144. For example, a lithographic process may be utilized to pattern the gate conductor layers 140 and 144 and etch the channels for the gate contacts 142 and 146.

Sacrificial gate caps 148 are formed by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers.

The gate conductor layers 140 and 144, gate contacts 142 and 146 and sacrificial gate caps 148 can be deposited using, for example, CVD, PECVD, RFCVD, PVD, ALD, MLD, MBD, PLD, LSMCD, and/or sputtering, followed by planarization by, for example, CMP.

FIGS. 13A-13C are schematic cross-sectional views of the semiconductor structure 100 of FIGS. 11A-11C in another aspect of the first embodiment after the gate replacement process has been performed. In this aspect, the same processes as the aspect of FIGS. 12A-12C are performed except that the sacrificial layer 126 is etched away prior to the formation of the gate dielectric layer 138 and the gate dielectric layer 138 is formed on the exposed surfaces of the inner and outer dielectric layers 120 and 124, on the channel layers 122, on the inner spacers 130, on the semiconductor substrate 102 and on the sidewall spacers 114 prior to the formation of gate conductor layers 140 and 144, gate contacts 142 and 146 and sacrificial gate caps 148. FIG. 13B is taken along section line B-B of FIG. 13A and FIG. 13C is taken along section line C-C of FIG. 13A.

The sacrificial layer 126 is removed using the processes and techniques described above and the gate dielectric layer 138 is then formed in a similar manner to that described above except the gate dielectric layer 138 in this aspect is deposited on the exposed surfaces of the inner and outer dielectric layers 120 and 124, the channel layers 122, the inner spacers 130, the semiconductor substrate 102 and the sidewall spacers 114. Gate conductor layers 140 and 144, gate contacts 142 and 146 and sacrificial gate caps 148 are then formed as described above. As shown in FIGS. 13A-13C and 10J, for example, in this aspect of the first embodiment, the outer dielectric layers 124 and inner dielectric layers 120 in the gate channel have increased thickness due to the addition of gate dielectric layer 138.

FIGS. 14 through 22C schematically illustrate an example method for fabricating semiconductor structure 300 according to a second illustrative embodiment. In the second illustrative embodiment, similar features to those found in the first illustrative embodiment will have similar numbers and will be described with reference to the descriptions of those features found above in the first embodiment.

Figure 14:
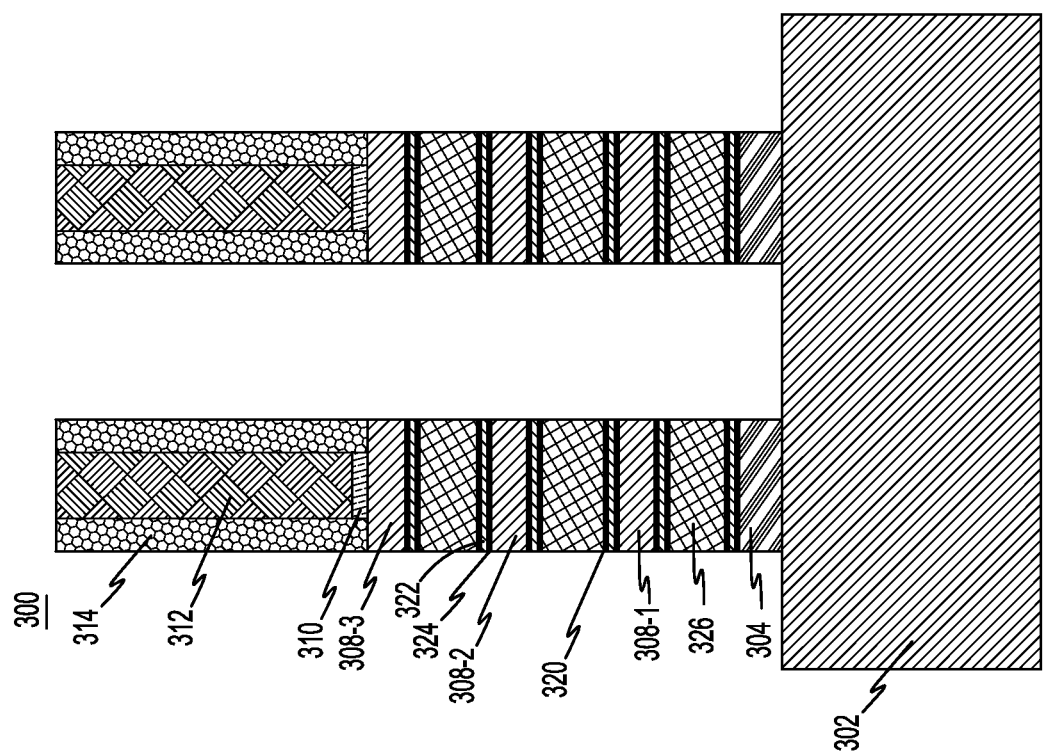
FIG. 14 is schematic cross-sectional view of the semiconductor structure of a second illustrative embodiment at a similar stage of fabrication to FIG. 4 of the first embodiment.

FIG. 14 is schematic cross-sectional view of the semiconductor structure 300 at a similar stage of fabrication to FIG. 4 of the first embodiment and is formed using similar techniques to those described above with reference to semiconductor structure 100. Semiconductor structure 300 comprises a semiconductor substrate 302, a nanosheet stack structure comprising a sacrificial layer 304 sacrificial layers 308-1, 308-2 and 308-3, dummy gate dielectric layers 310, dummy gate electrodes 312, sidewall spacers 314, inner dielectric layers 320, channel layers 322, outer dielectric layers 324 and sacrificial layer 126. While not illustrated, gate capping layers (not shown) may also be disposed on the dummy gate electrodes 312.

As seen in FIG. 14, in the second illustrative embodiment, only one sacrificial layer 304 is present on the bottom and an additional sacrificial layer 308-3 replaces the second sacrificial layer 104-2 of the first illustrative embodiment. For example, in the second illustrative embodiment there may be one sacrificial layer 304 and three sacrificial layers 308 with the sacrificial layers corresponding to sacrificial layers 106-1 through 106-3 having already been replaced with sacrificial layer 326 at the stage of fabrication illustrated in FIG. 14. In addition, the semiconductor substrate 302 as shown in FIG. 14 has not been recessed, unlike in the first embodiment.

Figure 15:
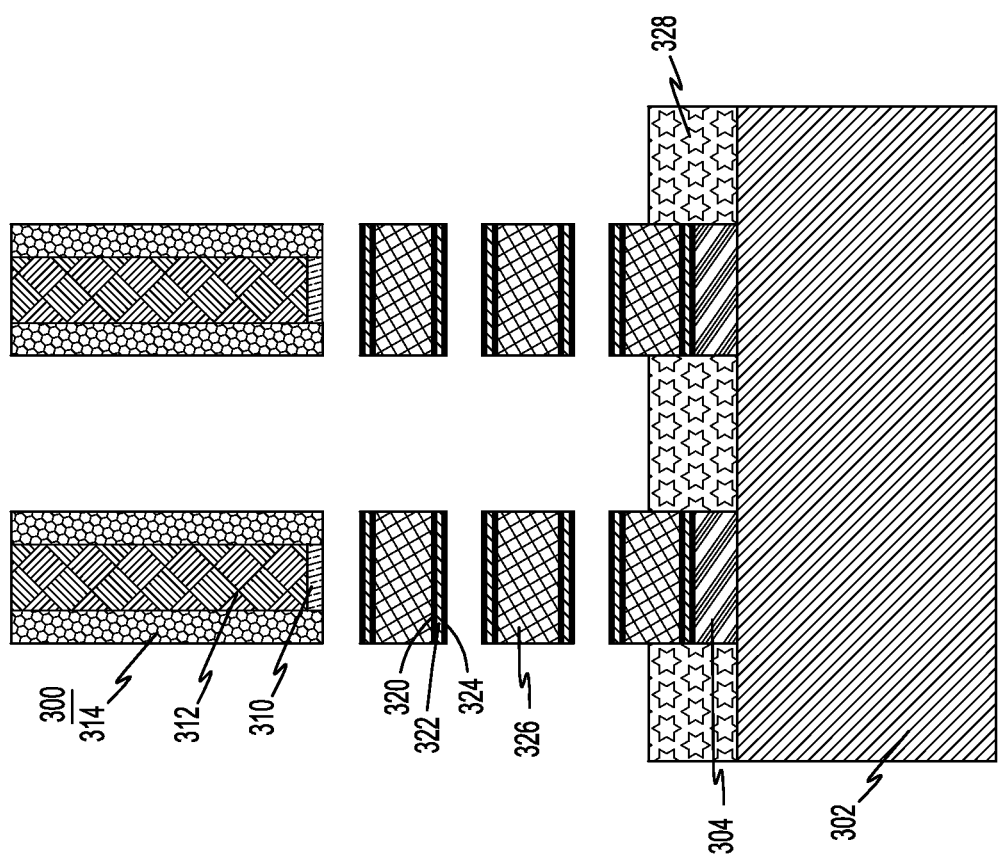
FIG. 15 is schematic cross-sectional view of the semiconductor structure of FIG. 14 after forming an etch mask, recessing the etch mask below the sacrificial layers to expose the sacrificial layers, and removing the sacrificial layers.

FIG. 15 is schematic cross-sectional view of the semiconductor structure 300 of FIG. 14 after forming an etch mask 328, recessing the etch mask 328 below the sacrificial layers 308 to expose the sacrificial layers 308, and removing the sacrificial layers 308, for example using the processes described above with reference to FIG. 6. In the second embodiment, the etch mask 328 protects the sacrificial layer 304 while exposing the sacrificial layers 308. In particular, in the second embodiment, the sacrificial layers 308 are removed prior to removal of the sacrificial layer 304.

Figure 16:
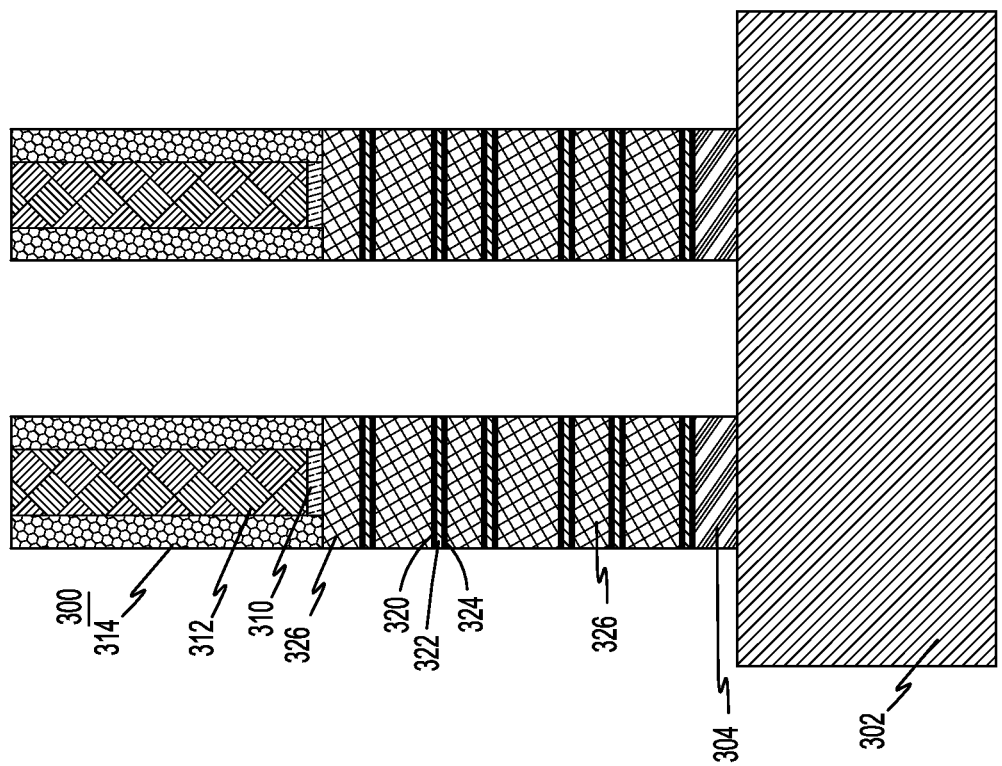
FIG. 16 is schematic cross-sectional view of the semiconductor structure of FIG. 15 after removing the etch mask, forming additional material for sacrificial layer and etching the additional sacrificial layer based on a pattern defined by the sidewall spacers.

FIG. 16 is schematic cross-sectional view of the semiconductor structure 300 of FIG. 15 after removing the etch mask 328, forming additional material for sacrificial layer 326 and etching the additional sacrificial layer 326 based on a pattern defined by the sidewall spacers 314, for example using the processes described above with reference to FIG. 7. As seen in a comparison of FIGS. 7 and 16, the sacrificial layer 304 is still present.

Figure 17:
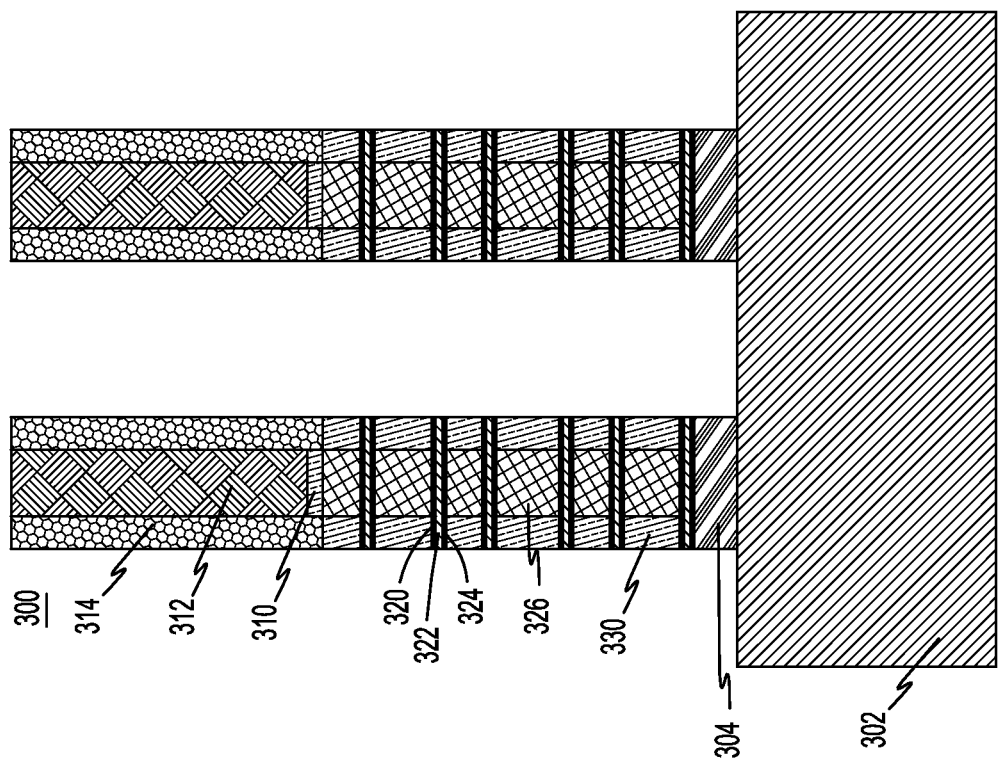
FIG. 17 is schematic cross-sectional view of the semiconductor structure of FIG. 16 after recessing sacrificial layer to form inner spacers.

FIG. 17 is schematic cross-sectional view of the semiconductor structure 300 of FIG. 16 after recessing sacrificial layer 326 to form inner spacers 330, for example using the processes described above with reference to FIG. 8. At this stage of the fabrication process, a contact layer 332 (FIG. 20) is not yet formed in the second embodiment.

Figure 18:
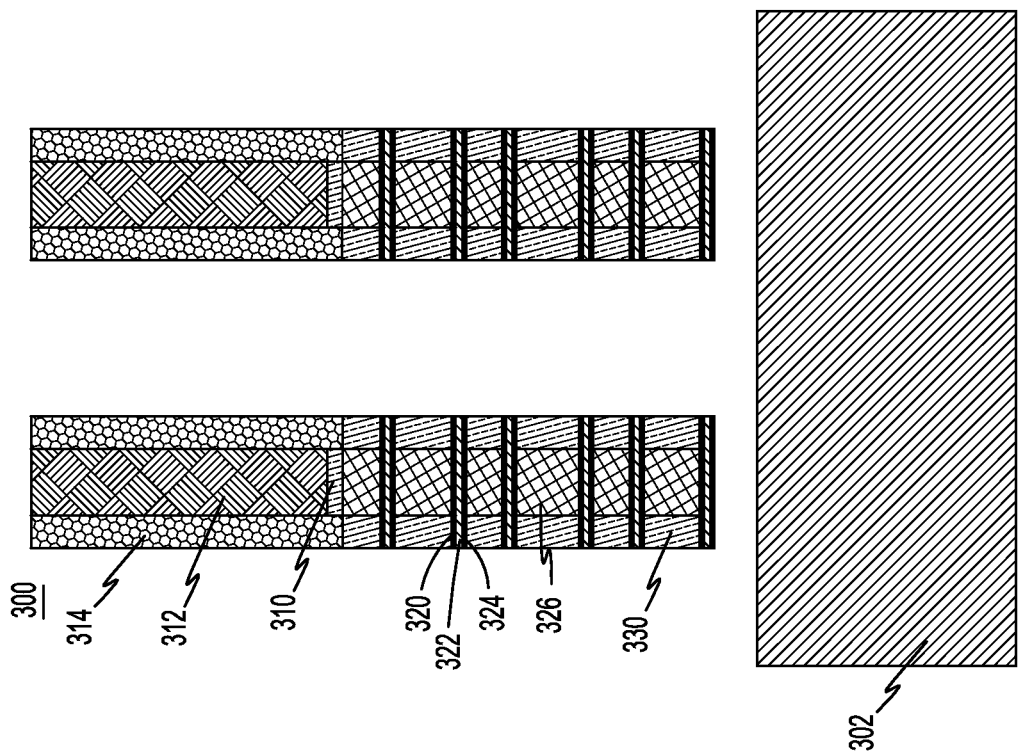
FIG. 18 is schematic cross-sectional view of the semiconductor structure of FIG. 17 after removing the sacrificial layer.

FIG. 18 is schematic cross-sectional view of the semiconductor structure 300 of FIG. 17 after removing the sacrificial layer 304, for example using the processes described above with reference to FIG. 5.

Figure 19:
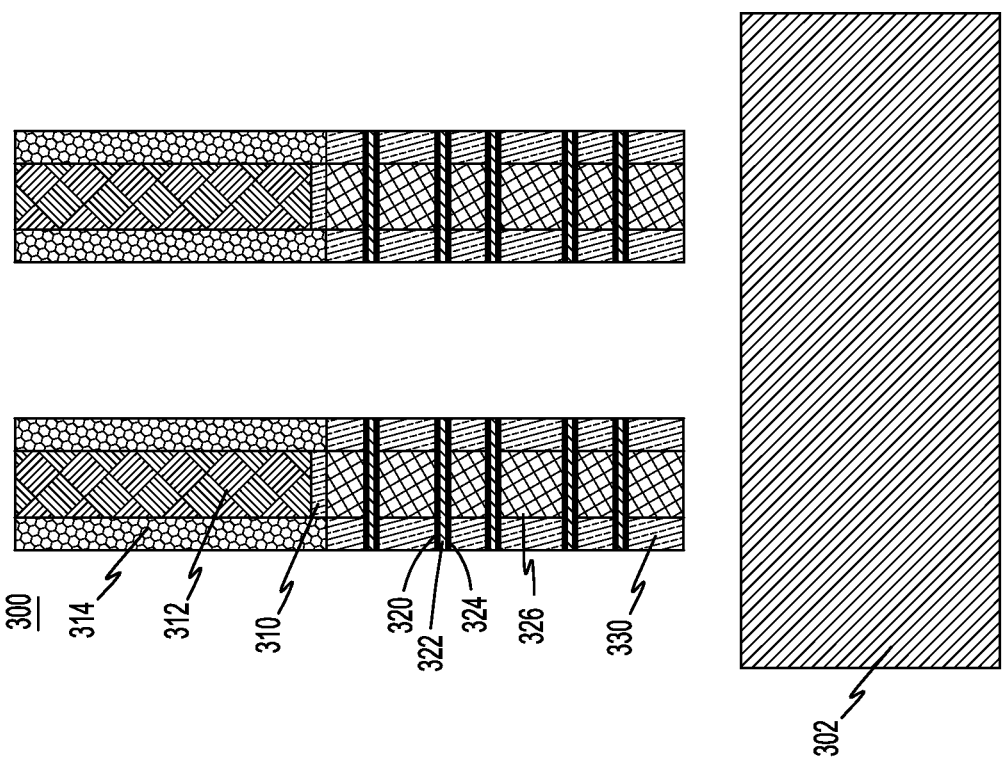
FIG. 19 is schematic cross-sectional view of the semiconductor structure of FIG. 18 after removing the inner dielectric layer, channel layer and outer dielectric layer exposed by removal of the sacrificial layer.

FIG. 19 is schematic cross-sectional view of the semiconductor structure 300 of FIG. 18 after removing the inner dielectric layer 320, channel layer 322 and outer dielectric layer 324 exposed by removal of the sacrificial layer 304. For example, one or more wet or dry etch processes may be utilized to etch away the inner dielectric layer 320, channel layer 322 and outer dielectric layer 324 exposed by removal of the sacrificial layer 304. In some embodiments, exposed portions of the inner dielectric layers 320, channel layers 322 and outer dielectric layers 324 that are disposed between the portions of the sacrificial layer 126 may be slightly etched. As a non-limiting example, if the inner and outer dielectric layers 320 and 324 comprise HfO2, an HCl-based wet chemistry can be used to etch the inner and outer dielectric layers 320 and 324. If the channel layer comprises MoS2, it can be etched with dry isotropic SF6+N2 or XeF2 type etch chemistries. Exposed ends of the tri-layer stack of the inner dielectric layer 320, channel layer 322 and outer dielectric layer 324 are so small in the area that their etching will be insignificant compared to the bottom exposed layers.

Figure 20:
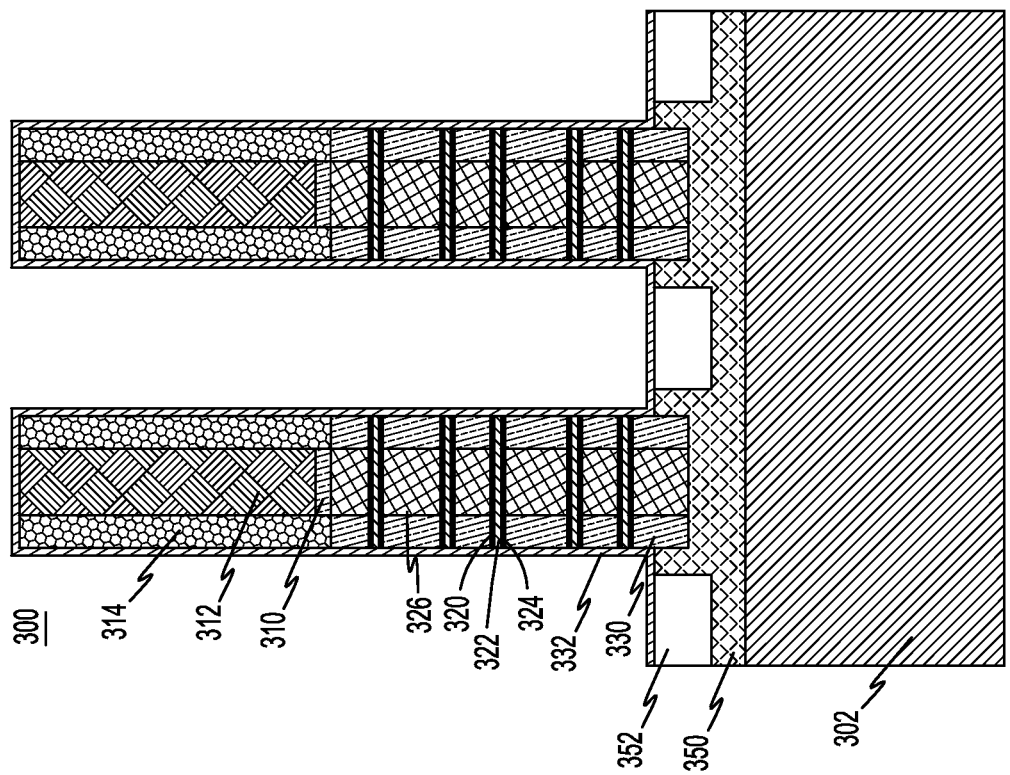
FIG. 20 is schematic cross-sectional view of the semiconductor structure of FIG. 19 after the formation of a bottom dielectric isolation (BDI), ILD and contact layer.

FIG. 20 is schematic cross-sectional view of the semiconductor structure 300 of FIG. 19 after the formation of a bottom dielectric isolation (BDI) 350, ILD 352 and contact layer 332.

A dielectric layer for the BDI 350 is formed on the semiconductor structure 300 over the semiconductor substrate 302, sidewall spacers 314, inner spacers 330, the portion of sacrificial layer 326 exposed by removal of sacrificial layer 304 and the adjacent inner dielectric layers 320, channel layers 322 and outer dielectric layers 324 and the exposed portions of the inner dielectric layers 320, channel layers 322 and outer dielectric layers 324. For example, the dielectric layer may be formed by depositing one or more conformal layers of dielectric material over the exposed surfaces of the semiconductor structure 300 including the exposed surfaces of the nanosheet stack structure. In some embodiments, the dielectric layer is formed of a low-k dielectric material. For example, the dielectric layer can be formed of SiN, SiBCN, SiOCN, SiOC, $SiO_2$ or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses.

A dielectric material for the ILD 352, including, but not limited to SiOx, low temperature oxide (LTO), high temperature oxide (HTO), flowable oxide (FOX) or some other dielectric, is deposited over the dielectric layer for the BDI 350, e.g., using deposition techniques including, but not limited to, CVD, PECVD, RFCVD, PVD, ALD, MLD, MBD, PLD, and/or LSMCD, sputtering, and/or plating.

The dielectric layer for the BDI 350 and the dielectric material for the ILD 352 are then etched back in one or more etch processes to a level below the bottom most tri-layer stack of inner dielectric layers 320, channel layers 322 and outer dielectric layers 324. For example, the dielectric material for the ILD 352 may be etched back to form the ILD 352 using an etch process such as, e.g., a directional RIE process, that is selective to the materials of the sidewall spacers 314 and dielectric layer for the BDI 350. The dielectric layer for the BDI 350 may be etched back to form the BDI 350 using an etch process such as, e.g., a directional RIE process, that is selective to the materials of the sidewall spacers 314, inner spacers 330 and inner dielectric layers 320, channel layers 322 and outer dielectric layers 324. One or both of the etch processes may be timed and in some embodiments, the etching for forming both the BDI 350 and the ILD 352 may be performed as part of the same etch process. As shown in FIG. 20, for example, the BDI 350 and ILD 352 may be etched back to a level that is between a top surface and a bottom surface of the bottom most inner spacer 330. The etching to form the BDI 350 and ILD 352 exposes the sidewall spacers 314, inner spacers 330 and inner dielectric layers 320, channel layers 322 and outer dielectric layers 324.

Contact layer 332 is formed over the BDI 350, ILD 352 and exposed sidewall spacers 314, inner spacers 330 and inner dielectric layers 320, channel layers 322 and outer dielectric layers 324, for example, using the processes described above for the formation of contact layer 132 of FIG. 8.

Figure 21C:
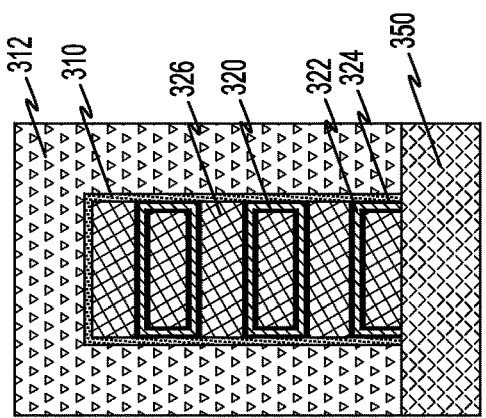
FIGS. 21A-21C are schematic cross-sectional views of the semiconductor structure of FIG. 20 after forming source/drain regions, recessing the source/drain regions and forming an ILD over the recessed source/drain regions.
Figure 21B:
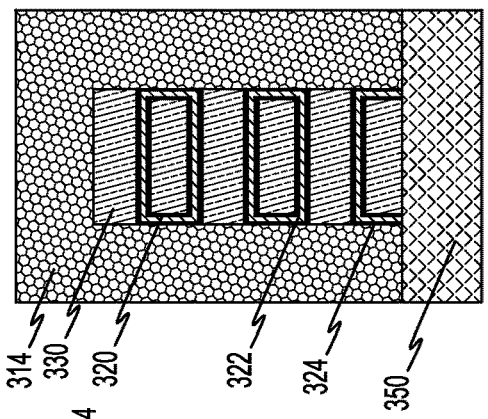
Figure 21A:
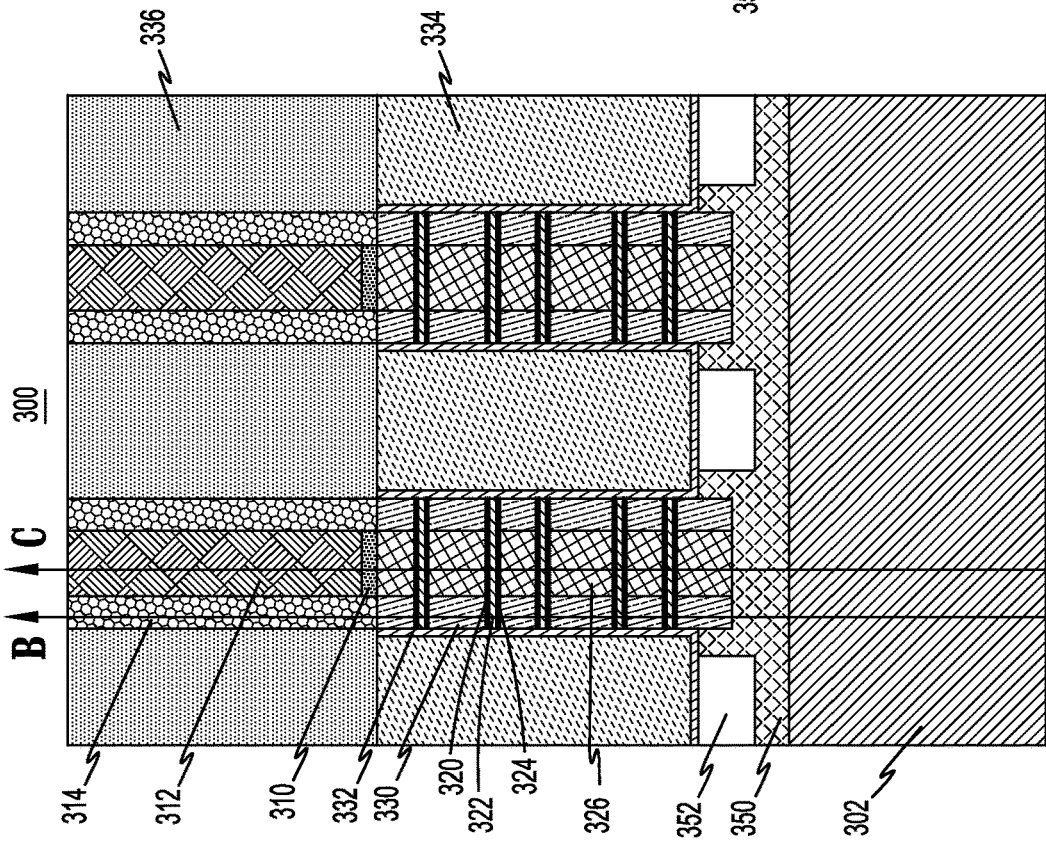

FIGS. 21A-21C are schematic cross-sectional views of the semiconductor structure 300 of FIG. 20 after forming source/drain regions 334, recessing the source/drain regions 334 and forming an inter-layer dielectric (ILD) 336 over the recessed source/drain regions 334. FIG. 21B is taken along section line B-B of FIG. 21A and FIG. 21C is taken along section line C-C of FIG. 21A. The source/drain regions 334 and ILD 336 are formed, for example, using the processes described above for the formation of source/drain regions 134 and ILD 136 of FIGS. 9A-9C.

Figure 22A:
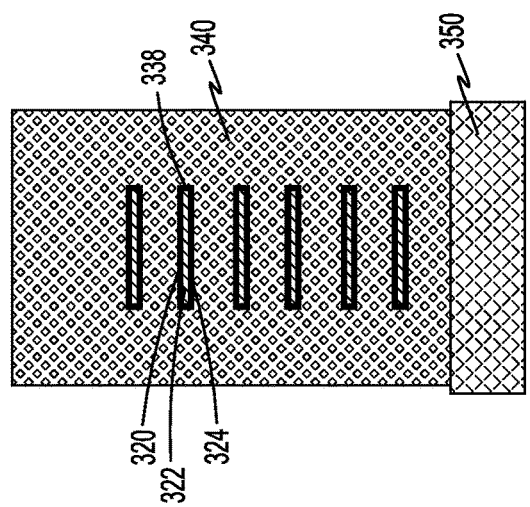
FIGS. 22A-22C are schematic cross-sectional views of the semiconductor structure of FIGS. 21A-21C after the gate replacement process has been performed including the removal of dummy gate electrodes, the removal of dummy gate dielectric layers, the removal and replacement of sacrificial layer with gate conductor layers, gate contacts and sacrificial gate caps.
Figure 22B:
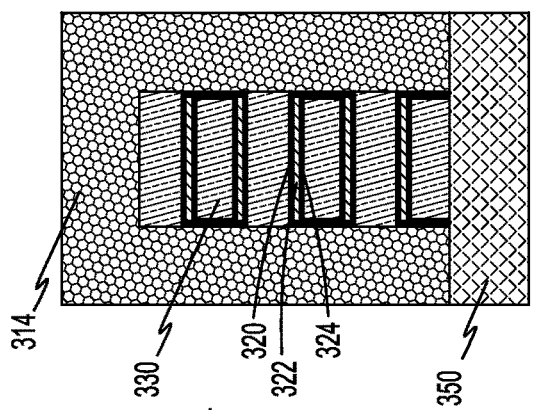
Figure 22C:
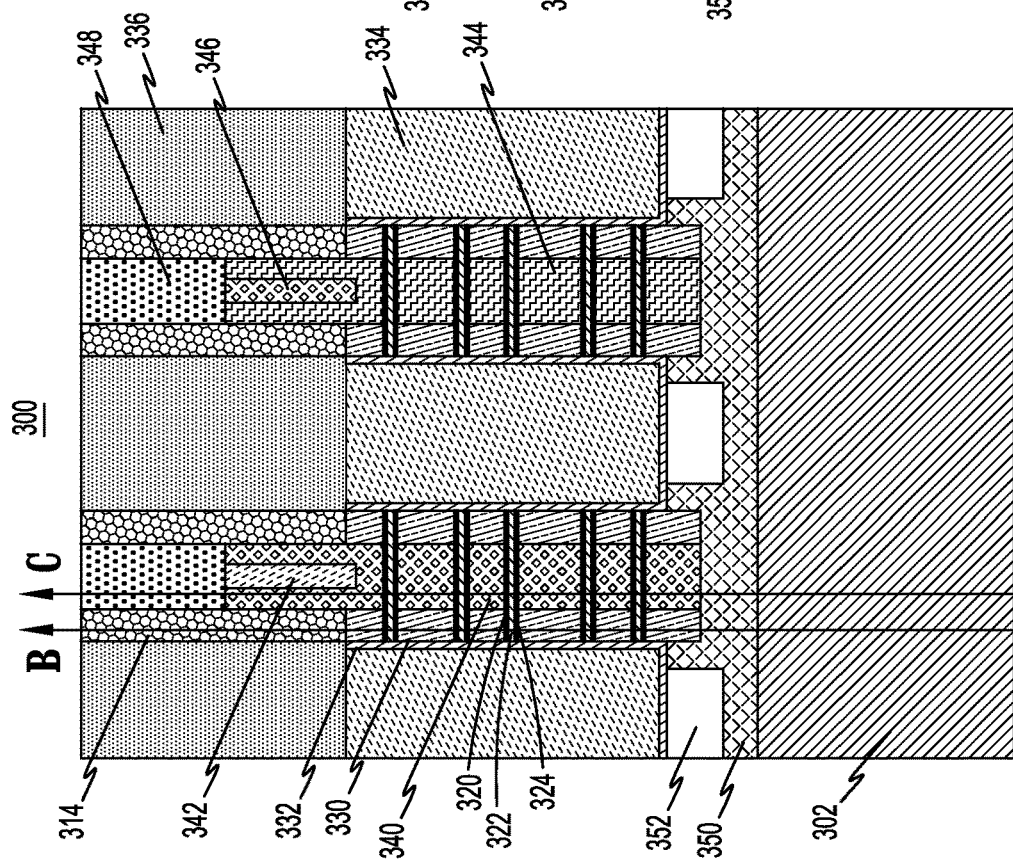

FIGS. 22A-22C are schematic cross-sectional views of the semiconductor structure 300 of FIGS. 21A-21C after the gate replacement process has been performed including the removal of dummy gate electrodes 312, the removal of dummy gate dielectric layers 310, the formation of gate dielectric layer 338, the removal and replacement of sacrificial layer 326 with gate conductor layers 340 and 344, gate contacts 342 and 346 and sacrificial gate caps 348 using similar processes to those described above for the removal and replacement of sacrificial layer 126 with gate conductor layers 140 and 144, gate contacts 142 and 146 and sacrificial gate caps 148 of FIG. 12A. FIG. 22B is taken along section line B-B of FIG. 22A and FIG. 22C is taken along section line C-C of FIG. 22A. Gate dielectric layer 338 may be formed according to either aspect of the first embodiment as described above for gate dielectric layer 138.

Figure 23:
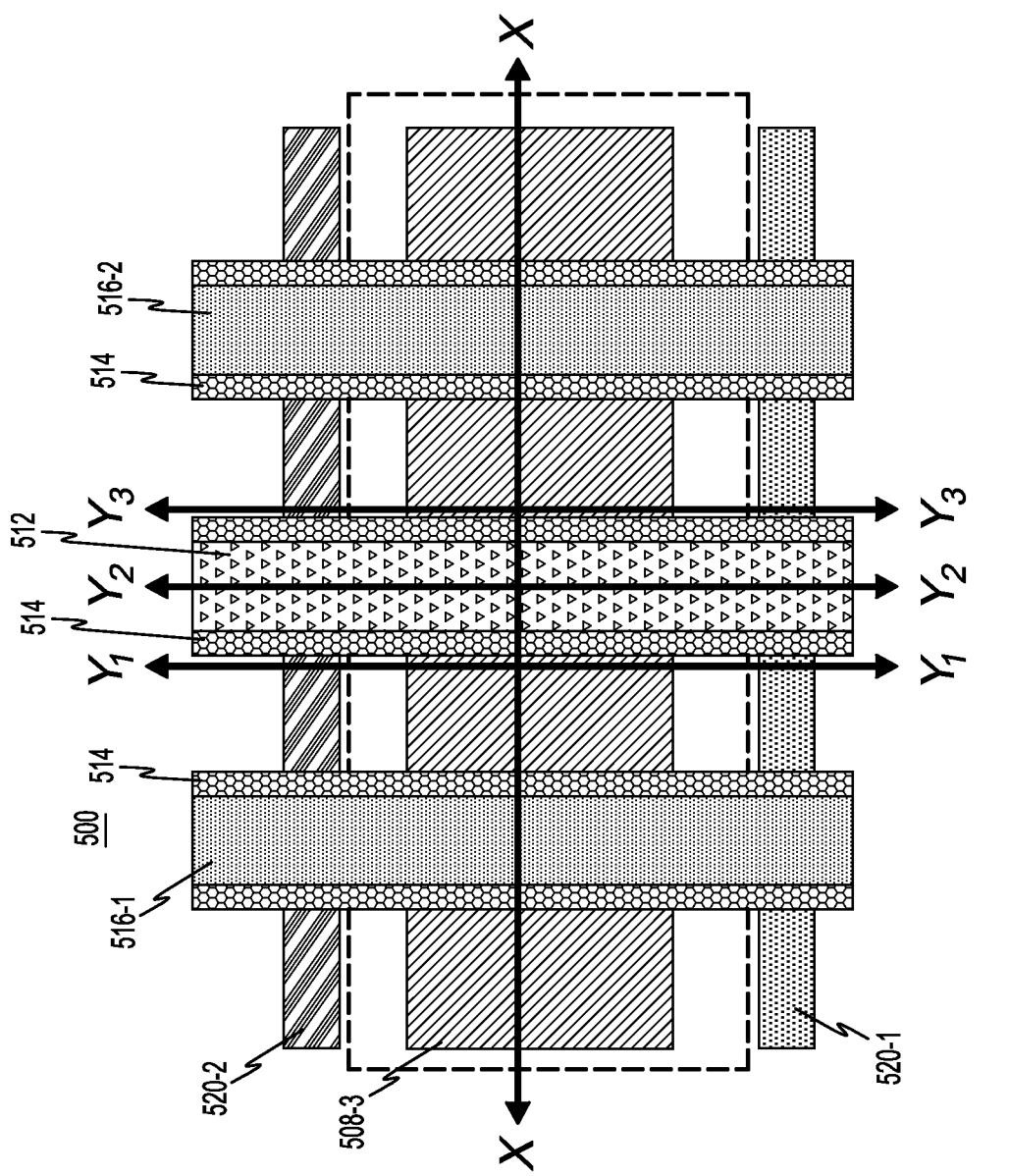
FIG. 23 is schematic top-down view of a semiconductor structure according to a third illustrative embodiment.
Figure 24:
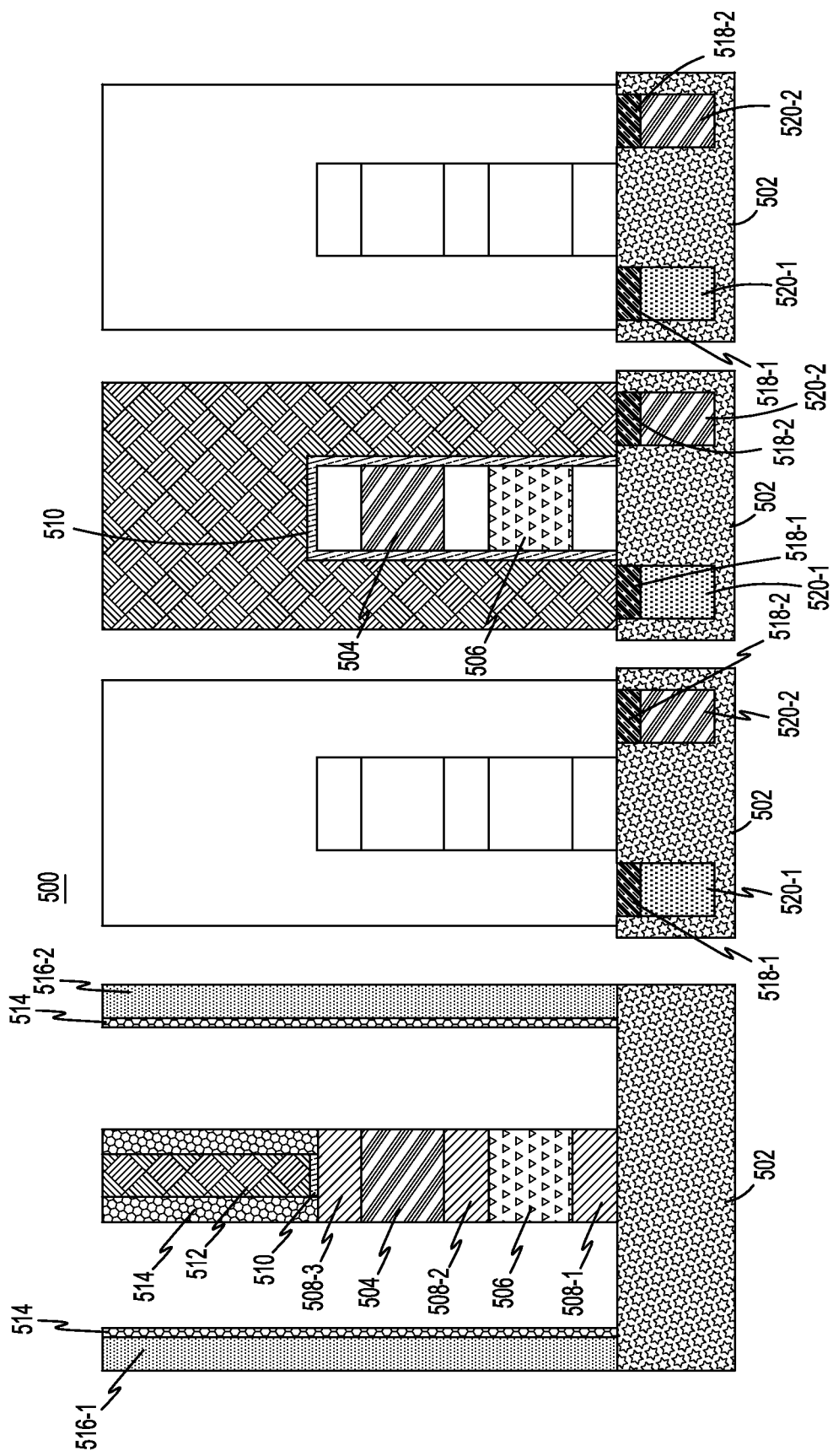
FIGS. 24A through 24D are schematic cross-sectional views of the semiconductor structure of FIG. 23 at an intermediate stage of fabrication.
Figure 25:
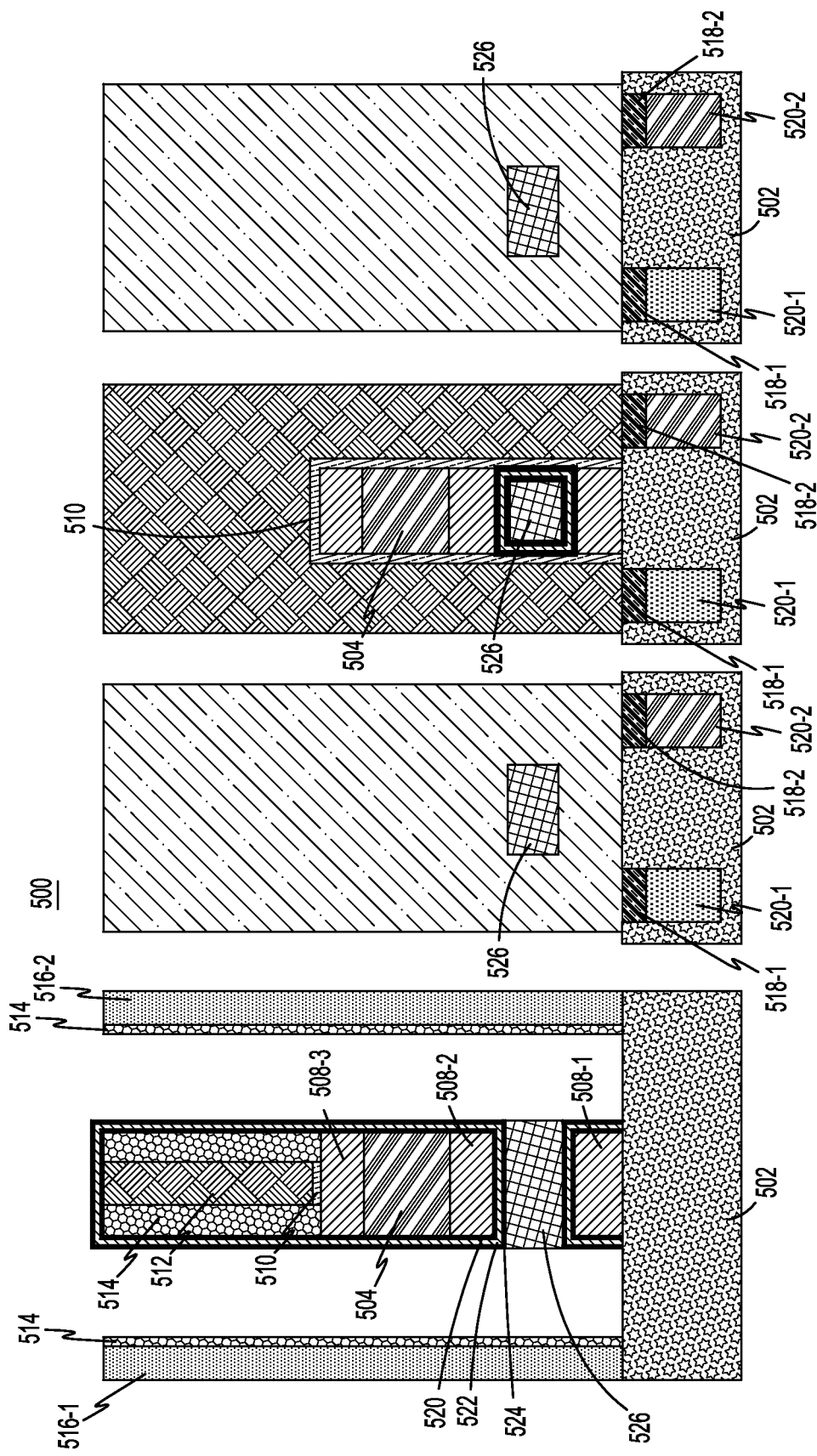
FIGS. 25A through 25D are schematic cross-sectional views of the semiconductor structure of FIGS. 24A through 24D after the removal of the sacrificial layer, the deposition of an inner dielectric layer, the deposition of a channel layer, the deposition of an outer dielectric layer, the deposition of a sacrificial layer and the trimming of the sacrificial layer.
Figure 26:
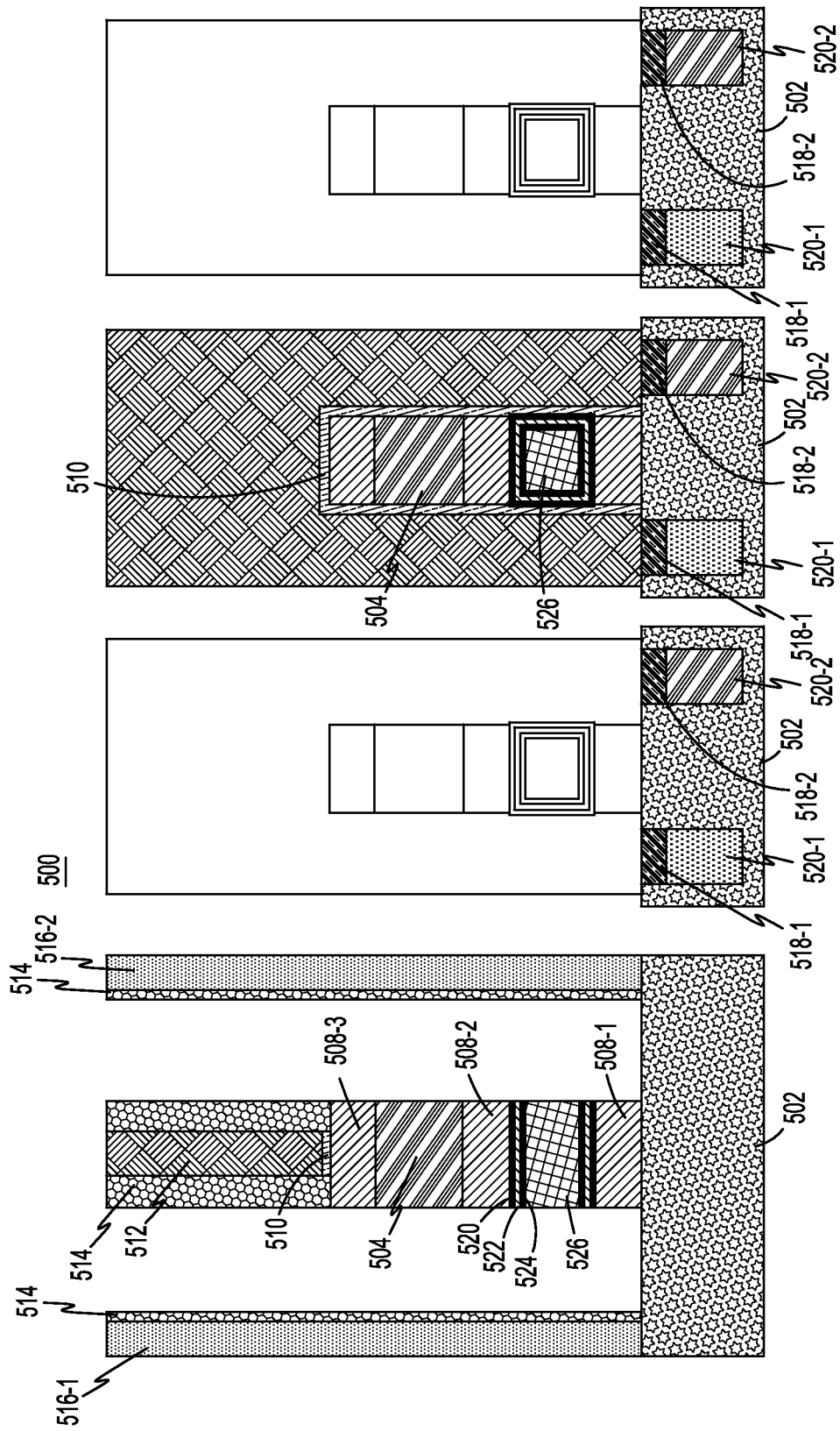
FIGS. 26A through 26D are schematic cross-sectional views of the semiconductor structure of FIGS. 25A through 25D after etching the inner dielectric layer, channel layer, outer dielectric layer and sacrificial layer based on a pattern defined by the sidewall spacers.
Figure 27:
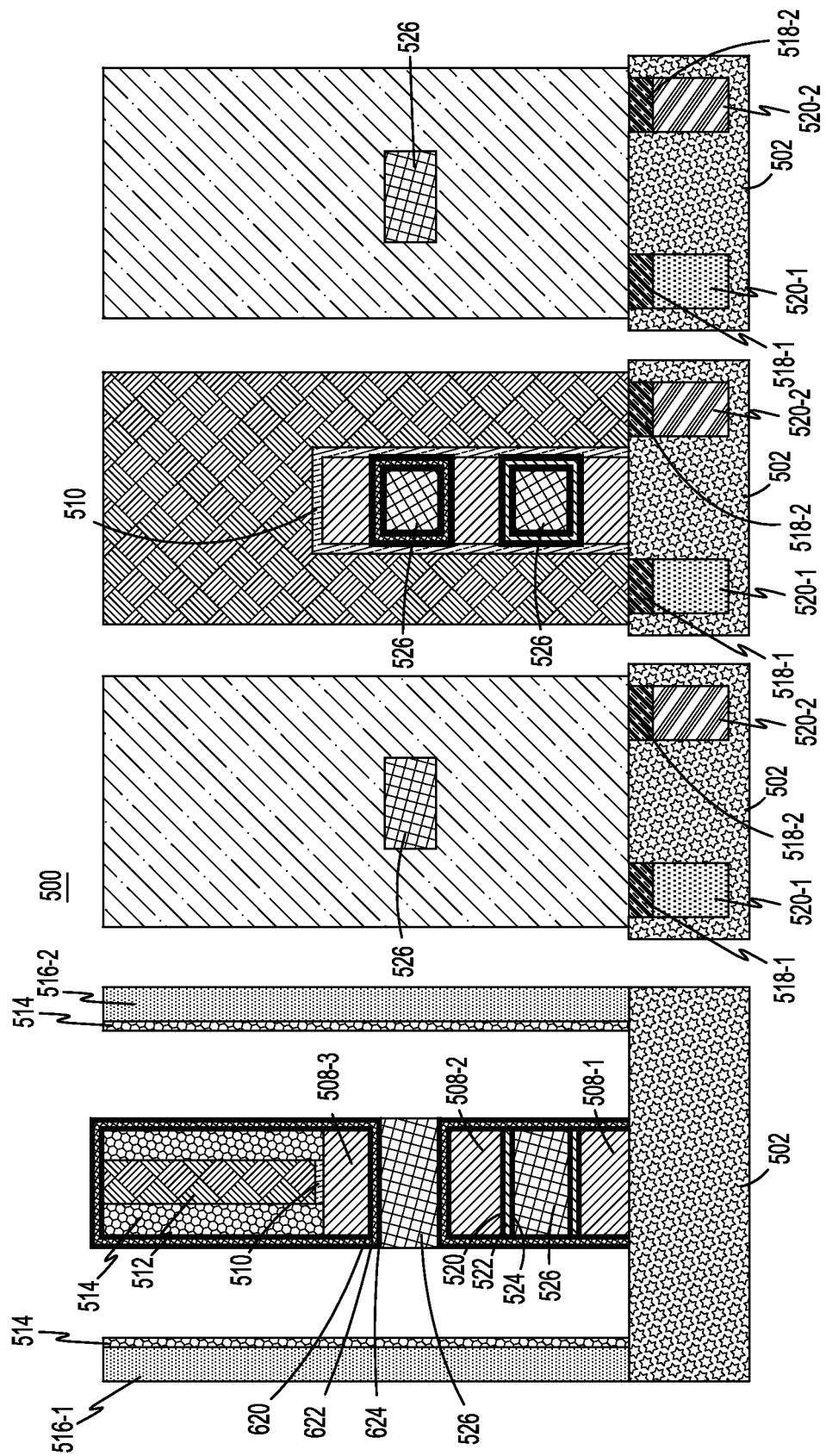
FIGS. 27A through 27D are schematic cross-sectional views of the semiconductor structure of FIGS. 26A through 26D after the removal of the sacrificial layer, the deposition of an inner dielectric layer, the deposition of a channel layer, the deposition of an outer dielectric layer, the deposition of additional material for sacrificial layer and the trimming of the additional material for sacrificial layer.
Figure 28:
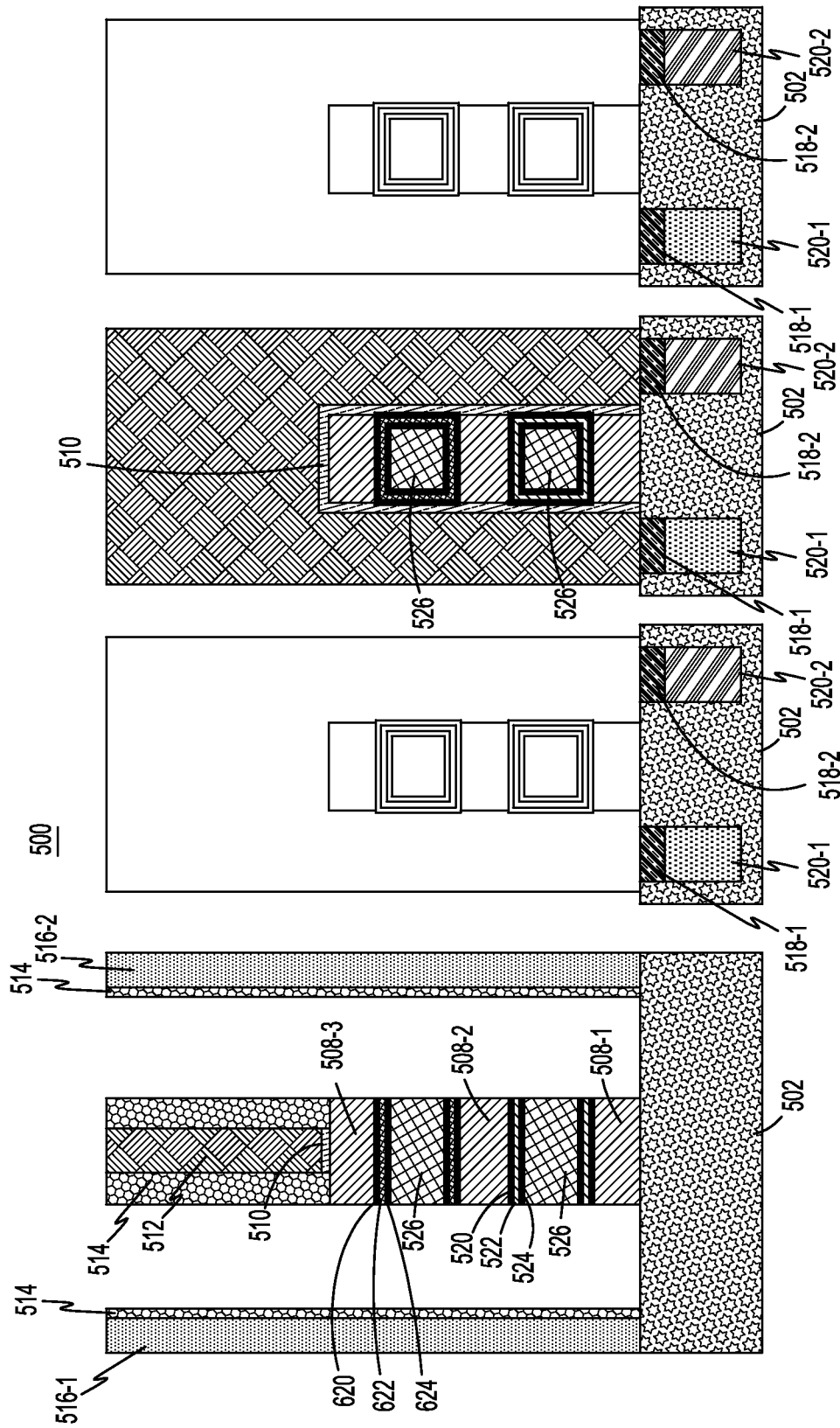
FIGS. 28A through 28D are schematic cross-sectional views of the semiconductor structure of FIGS. 27A through 27D after etching the inner dielectric layer, channel layer, outer dielectric layer and sacrificial layer based on a pattern defined by the sidewall spacers.
Figure 29:
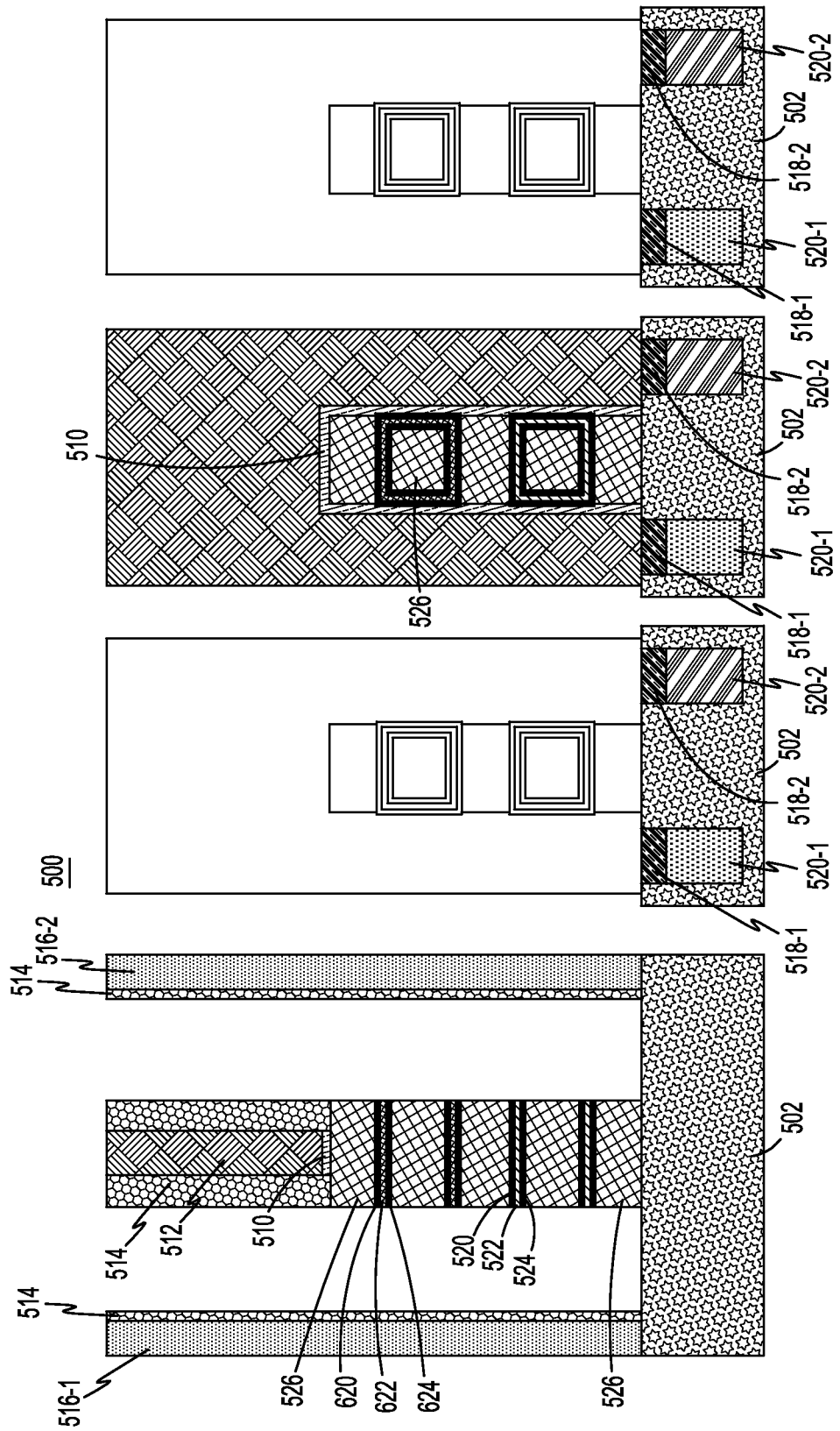
FIGS. 29A through 29D are schematic cross-sectional views of the semiconductor structure of FIGS. 28A through 28D after replacing sacrificial layers with additional material for sacrificial layer.
Figure 30:
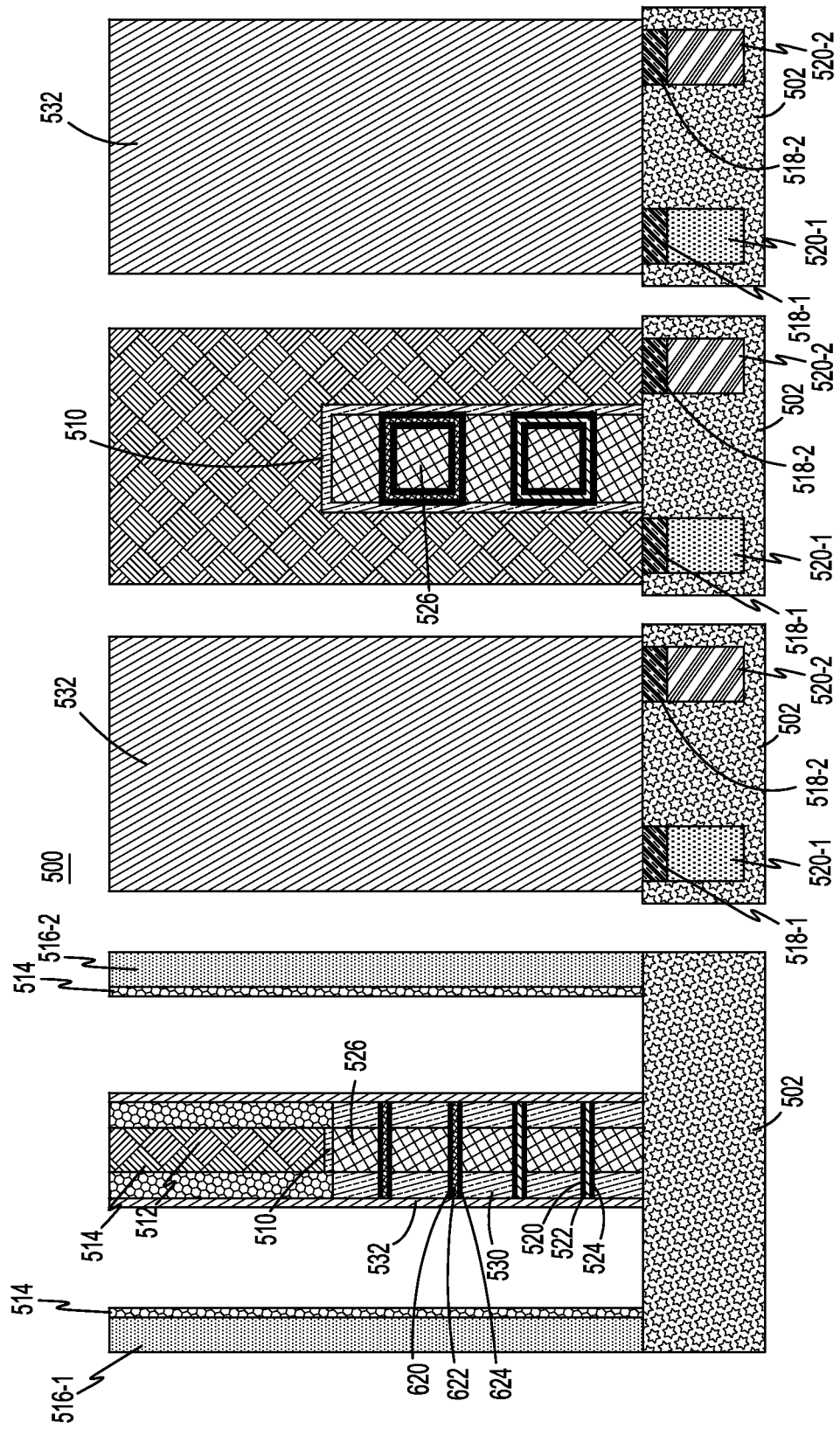
FIGS. 30A through 30D are schematic cross-sectional views of the semiconductor structure of FIGS. 29A through 29D after recessing sacrificial layer, forming inner spacers 530 and forming a contact layer.

FIGS. 23 through 47D schematically illustrate an example method for fabricating semiconductor structure 500 according to a third illustrative embodiment. In an illustrative embodiment, semiconductor structure 500 is a stacked CFET comprising both an nFET and a PFET formed in a stacked arrangement according to the processes described below. In some embodiments, the CFET of semiconductor structure 500 is formed as an inverter CFET. In the third illustrative embodiment, similar features to those found in the first illustrative embodiment will have similar numbers and will be described with reference to the descriptions of those features found above in the first embodiment. In the following figures, figures with the "A" reference are taken along cross-section X-X, figures with the "B" reference are taken along cross-section $Y_1$-$Y_1$ of FIG. 23, figures with the "C" reference are taken along cross-section $Y_2$-$Y_2$ of FIG. 23 and figures with the "D" reference are taken along cross-section $Y_3$-$Y_3$ of FIG. 23. For example, for FIGS. 24A through 24D, FIG. 24A is taken along cross-section X-X, FIG. 24B is taken along cross-section $Y_1$-$Y_1$ of FIG. 23, FIG. 24C is taken along cross-section $Y_2$-$Y_2$ of FIG. 23 and FIG. 24D is taken along cross-section $Y_3$-$Y_3$ of FIG. 23. Note that in the absence of a material or structure formed in the planes defined by the $Y_1$-$Y_1$ and $Y_3$-$Y_3$ cross-sections, these cross-sections will show underlying structures as viewed toward the $Y_2$-$Y_2$ cross-section, as denoted by a semi-transparent plane.

FIG. 23 is schematic top-down view of the semiconductor structure 500. FIGS. 24A through 24D are schematic cross-sectional views of the semiconductor structure 500 of FIG. 23 at an intermediate stage of fabrication as taken along the cross-sections X-X, $Y_1$-$Y_1$, $Y_2$-$Y_2$ and $Y_3$-$Y_3$ described above.

Semiconductor structure 500 comprises a dielectric layer 502 disposed on a semiconductor substrate (not shown), a nanosheet stack structure formed on the dielectric layer 502 and comprising a sacrificial layer 504, a sacrificial layer 506 and sacrificial layers 508-1 through 508-3, an active gate comprising a dummy gate dielectric layer 510 and dummy gate electrode 512, sidewall spacers 514, inactive gates 516-1 and 516-2, buried power rail (BPR) capping layers 518-1 and 518-2 and buried power rails 520-1 and 520-2. While not illustrated, gate capping layers (not shown) may also be disposed on the dummy gate electrodes 512.

The semiconductor substrate may be formed using similar processes to those described above for semiconductor substrate 102 and dielectric layer 502 may be formed on the semiconductor substrate, e.g., using standard deposition techniques such as ALD, CVD, and PVD and planarized to a desired thickness, e.g., using CMP or an etching process. The dielectric layer 502 may comprise dielectric materials such as those described above.

Sacrificial layer 504, sacrificial layer 506, sacrificial layers 508-1 through 508-3, dummy gate dielectric layer 510, dummy gate electrode 512, and sidewall spacers 514 may be formed using similar processes to those described above for sacrificial layers 104-1 and 104-2, sacrificial layers 106-1, 106-2 and 106-3, sacrificial layers 108-1 and 108-2, dummy gate dielectric layers 110, dummy gate electrodes 112 and sidewall spacers 114. In illustrative embodiments, sacrificial layer 504 comprises an SiGe alloy having a range of about 25% to 40% Ge, sacrificial layer 506 comprises an SiGe alloy having a range of about 50% to about 90% Ge, sacrificial layers 508-1 through 508-3 comprise Si or an SiGe alloy having a range of about 5% to about 15% Ge.

The sacrificial layers 504, 506 and 508 may be formed with a thickness that defines the spacing size in which high-k dielectric material and work function metal will be formed. In one embodiment, the thickness of the sacrificial layer 504 is in a range of about 8 nm to about 15 nm, the thickness of the sacrificial layer 506 is in a range of about 8 nm to about 15 nm and the thickness of the sacrificial layers 508 is in a range of about 4 nm to about 8 nm. In some embodiments, other thicknesses for each of sacrificial nanosheet layers 104, 106 and 108 may be used.

Inactive gates 516-1 and 516-2 may be formed by etching and replacement of dummy gate electrodes and other gate materials, e.g., with dielectric materials, using known processes and techniques.

The channels for the BPR capping layers 518-1 and 518-2 and BPRs 520-1 and 520-2 may be formed, for example, by etching the dielectric layer 502 prior to the formation of the nanosheet stack structure, e.g., using lithographic techniques to pattern the dielectric layer 502.

BPRs 520-1 and 520-2 may be comprise metal-based materials such as, e.g., tungsten, cobalt, zirconium, tantalum, titanium, aluminum, ruthenium, and/or copper. BPRs 520-1 and 520-2 may be formed in the channels by conformal deposition using, for example, deposition techniques including, but not limited to, CVD, PECVD, RFCVD, PVD, ALD, MLD, MBD, PLD, LSMCD, sputtering, and/or plating. In some embodiments, metal-based material of the BPRs 520-1 and 520-2 is deposited to fill the channels. A CMP may be utilized to planarize the semiconductor structure 500 and etch away any unwanted metal-based material followed by a metal recess process to recess the BPRs 520-1 and 520-2 into the channel.

BPR layers 518-1 and 518-2 may comprise a dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar dielectric materials commonly used to form capping layers and may be deposited using known techniques such as atomic layer deposition (ALD), CVD and PVD. A CMP may be utilized to planarize the semiconductor structure 500 and etch away any unwanted dielectric material and to expose the dielectric layer 502.

FIGS. 25A through 25D are schematic cross-sectional views of the semiconductor structure 500 of FIGS. 24A through 24D after the removal of the sacrificial layer 506, the deposition of an inner dielectric layer 520, the deposition of a channel layer 522, the deposition of an outer dielectric layer 524, the deposition of a sacrificial layer 526 and the trimming of the sacrificial layer 526, for example, using the processes described above with reference to FIGS. 2 and 3 for the removal of the sacrificial layer 106, the deposition of inner dielectric layer 120, the deposition of channel layer 122, the deposition of outer dielectric layer 124, the deposition of sacrificial layer 126 and the trimming of the sacrificial layer 126.

FIGS. 26A through 26D are schematic cross-sectional views of the semiconductor structure 500 of FIGS. 25A through 25D after etching the inner dielectric layer 520, channel layer 522, outer dielectric layer 524 and sacrificial layer 526 based on a pattern defined by the sidewall spacers 514, for example, using the processes described above with reference to FIG. 4 for etching the inner dielectric layer 120, channel layer 122, outer dielectric layer 124 and sacrificial layer 126 based on a pattern defined by the sidewall spacers 114.

FIGS. 27A through 27D are schematic cross-sectional views of the semiconductor structure 500 of FIGS. 26A through 26D after the removal of the sacrificial layer 504, the deposition of an inner dielectric layer 620, the deposition of a channel layer 622, the deposition of an outer dielectric layer 624, the deposition of additional material for sacrificial layer 526 and the trimming of the additional material for sacrificial layer 526, for example, using the processes described above with reference to FIGS. 2 and 3 for the removal of the sacrificial layer 106, the deposition of inner dielectric layer 120, the deposition of channel layer 122, the deposition of outer dielectric layer 124, the deposition of sacrificial layer 126 and the trimming of the sacrificial layer 126. In some embodiments, the channel material used for channel layer 622 is different than the channel material used for channel layer 522. For example, if the channel layer 522 is used for an nFET semiconductor device and the channel layer 622 is used for a pFET semiconductor device, the materials of channel layers 522 and 622 may be different. In other embodiments, the same material may be used for both the channel layer 522 and the channel layer 622.

FIGS. 28A through 28D are schematic cross-sectional views of the semiconductor structure 500 of FIGS. 27A through 27D after etching the inner dielectric layer 620, channel layer 622, outer dielectric layer 624 and sacrificial layer 526 based on a pattern defined by the sidewall spacers 514, for example, using the processes described above with reference to FIG. 4 for etching the inner dielectric layer 120, channel layer 122, outer dielectric layer 124 and sacrificial layer 126 based on a pattern defined by the sidewall spacers 114.

FIGS. 29A through 29D are schematic cross-sectional views of the semiconductor structure 500 of FIGS. 28A through 28D after replacing sacrificial layers 508 with additional material for sacrificial layer 526, for example, using the processes described above with reference to FIGS. 6 and 7 for removing the sacrificial layers 108 and forming the additional material for sacrificial layer 126.

FIGS. 30A through 30D are schematic cross-sectional views of the semiconductor structure 500 of FIGS. 29A through 29D after recessing sacrificial layer 526, forming inner spacers 530 and forming a contact layer 532, for example, using the processes described above with reference to FIG. 8 for recessing sacrificial layer 126, forming inner spacers 130 and forming a contact layer 132, followed by directionally etching back contact layer 532 to expose the dielectric layer 502.

The contact layer 532 may be etched using, for example, a directional RIE or other directional process that is selective to the dielectric layer 502, sidewall spacers 514 and gate capping layers (not shown) such that the contact layer 532 is removed from the surfaces of dielectric layer 502 while remaining on the sidewalls of the inner spacers 530, inner dielectric layers 520 and 620, channel layers 522 and 622 and outer dielectric layers 524 and 624.

Figure 31:
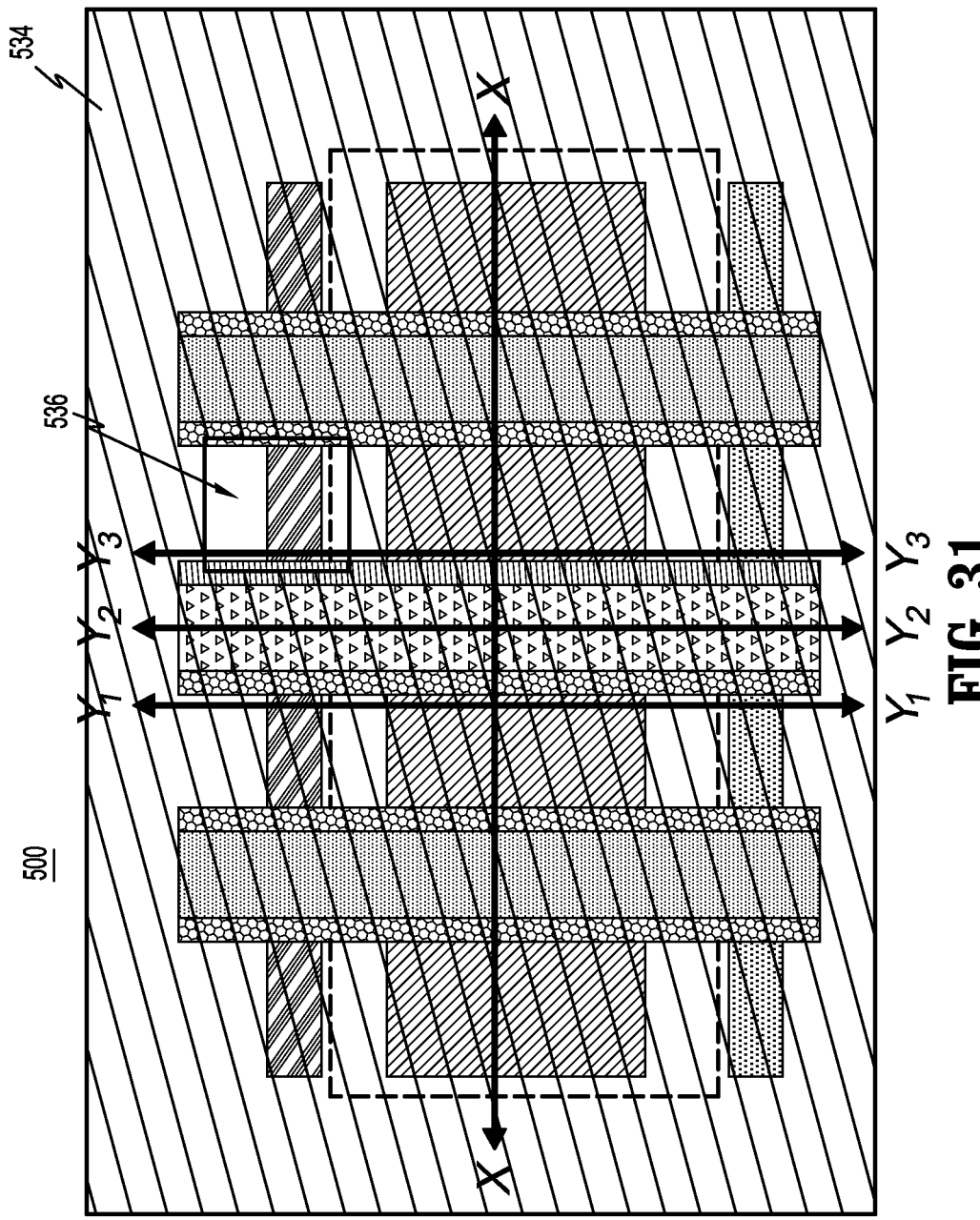
FIG. 31 is a top-down view and FIGS. 32A through 32D are schematic cross-sectional views of the semiconductor structure of FIGS. 30A through 30D after forming an etch mask having patterned channels.
Figures 32A, 32B, 32C, 32D:
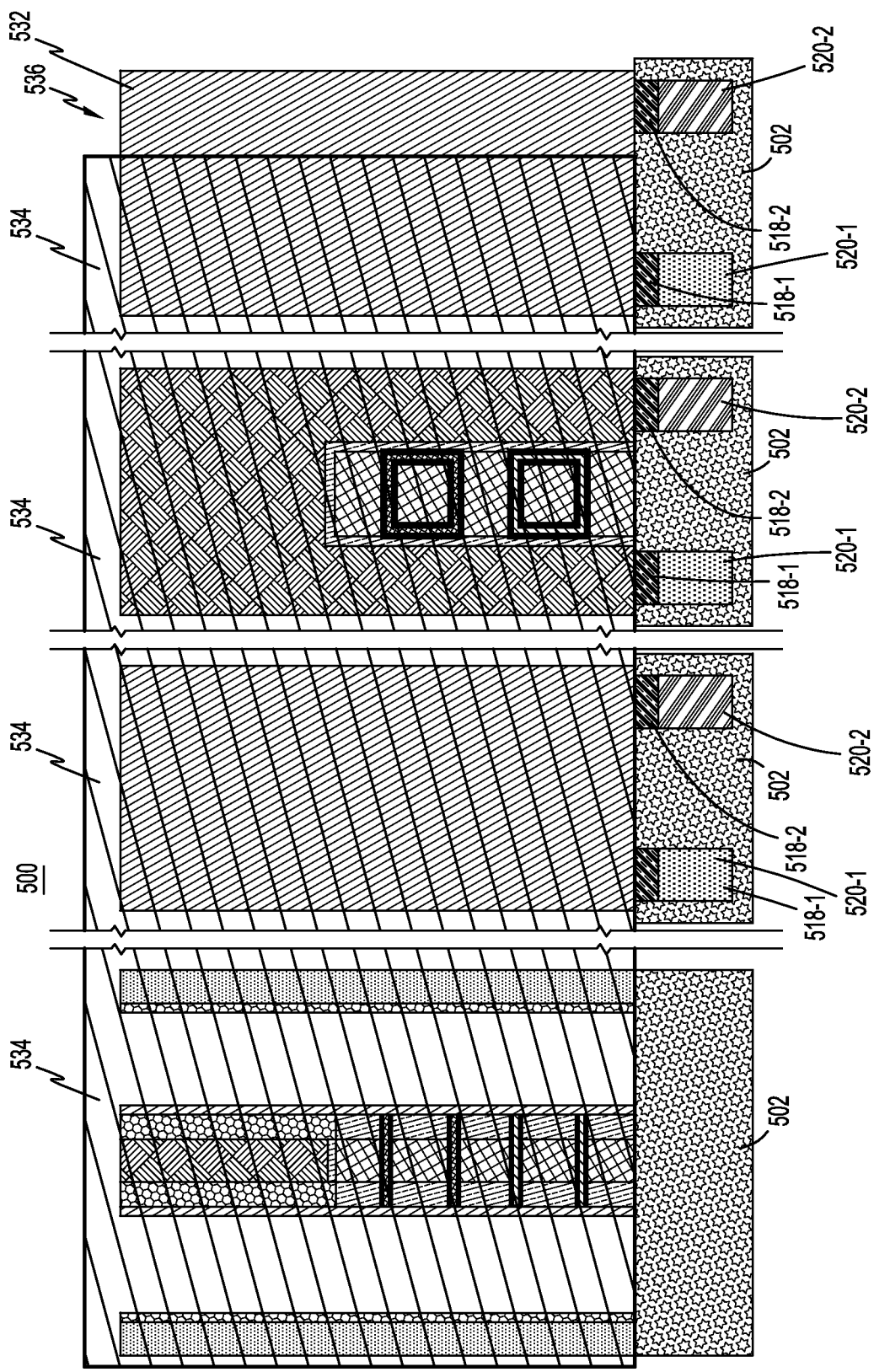

FIG. 31 is a top-down view and FIGS. 32A through 32D are schematic cross-sectional views of the semiconductor structure 500 of FIGS. 30A through 30D after forming an etch mask 534 having patterned channels 536. For example, an OPL may be coated on the semiconductor structure 500, followed by a lithographic process to pattern the OPL and form the etch mask 534. The OPL may comprise, for example, a resin material that is applied by spin coating and baked to enhance planarization. The patterned portion of the OPL is removed to form patterned channels 536 such that etch mask 534 exposes a portion of the BPR capping layer 518-2 in the $Y_3$-$Y_3$ cross-section.

FIGS. 33A through 33D are schematic cross-sectional views of the semiconductor structure 500 of FIGS. 32A through 32D after removal of the exposed BPR capping layer 518-2 in the $Y_3$-$Y_3$ cross-section and the formation of source/drain regions 538 in electrical contact with the BPR 520-2.

The exposed BPR capping layer 518-2 may be removed using, for example, a RIE, wet or dry etch process that is selective to the material of the etch mask 534, dielectric layer 502, contact layer 532 and BPR 520-2.

The source/drain regions 538 may be formed, for example, using the processes and techniques described above for the formation of source/drain regions 134. As seen in FIGS. 33A through 33D, the source/drain regions 134 are in contact with the BPR 520-2 in the $Y_3$-$Y_3$ cross-section where the portion of the BPR capping layer 518-2 was removed.

FIGS. 34A through 34D are schematic cross-sectional views of the semiconductor structure 500 of FIGS. 33A through 33D after recessing the contact layer 532 and source/drain regions 538 to a level below the inner dielectric layers 620, channel layers 622 and outer dielectric layers 624, the formation of a source/drain spacer 540, the formation of an ILD 542 and the recessing of the ILD 542.

The contact layer 532 and source/drain regions 538 may be recessed, e.g., to a level below the inner dielectric layers 620, channel layers 622 and outer dielectric layers 624 as shown in FIG. 34A, using one or more etch processes, e.g., a directional RIE, having an etch chemistry that is selective to sidewall spacers 514. For example, an anisotropic wet etch process may be used to recess the contact layer 532 and source/drain regions 538. In illustrative embodiments, for example, the contact layer 532 and source/drain regions 538 may be etched about three quarters of the way or more down the inner spacer 530 between the bottom most tri-layer stack of inner dielectric layers 620, channel layers 622 and outer dielectric layers 624 and the top most tri-layer stack of inner dielectric layers 520, channel layers 522 and outer dielectric layers 524 without exposing the inner dielectric layers 520, channel layers 522 and outer dielectric layers 524.

Source/drain spacer 540 is formed on the semiconductor structure 500 including on the recessed source/drain regions 538, sidewall spacers 514, exposed inner spacers 530, inner dielectric layers 620, channel layers 622 and outer dielectric layers 624. Non-limiting examples of materials for source/drain spacer 540 include, for example, SiN, AlN, Al2O3or other similar dielectric materials that are selectively etchable to the material of the sidewall spacers 514. In some embodiments, the source/drain spacer 540 is conformally deposited using, for example, deposition techniques including, but not limited to, CVD, PECVD, RFCVD, PVD, ALD, MLD, MBD, PLD, LSMCD, sputtering, and/or plating.

ILD 542 may be formed, for example, by the deposition of a dielectric material, including, but not limited to SiOx, low temperature oxide (LTO), high temperature oxide (HTO), flowable oxide (FOX) or some other dielectric, on the source/drain spacer 540. The ILD 542 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD 542 and planarize the resulting structure. An etching process such as those described above that is selective to the source/drain spacer 540 may be performed to recess the ILD 542 as shown in FIG. 34A.

FIGS. 35A through 35D are schematic cross-sectional views of the semiconductor structure 500 of FIGS. 34A through 34D after recessing the source/drain spacer 540 below the level of the bottom most tri-layer stack of inner dielectric layers 620, channel layers 622 and outer dielectric layers 624 to expose the inner dielectric layers 620, channel layers 622 and outer dielectric layers 624 and a portion of the inner spacer 530 disposed between the bottom most tri-layer stack of inner dielectric layers 620, channel layers 622 and outer dielectric layers 624 and the top most tri-layer stack of inner dielectric layers 520, channel layers 522 and outer dielectric layers 524. For example, the source/drain spacer 540 may be recessed down about a quarter of the way down the inner spacer 530 that is below the bottom most tri-layer stack of inner dielectric layers 620, channel layers 622 and outer dielectric layers 624. As seen in FIG. 35A, the recessed source/drain spacer 540 comprises portions 540-1 and 540-2 on either side of the gate structure and ILD 542 acts as an etch mask for the portions 540-1 and 540-2 of the source/drain spacer 540 to inhibit the etching of the source/drain spacer 540 from exposing the source/drain regions 538.

FIGS. 36A through 36D are schematic cross-sectional views of the semiconductor structure 500 of FIGS. 35A through 35D after removal of the ILD 542 and the formation of an etch mask 544 that is patterned to expose one side of the gate structure, e.g., corresponding to cross-section $Y_1$-$Y_1$ while protecting the other side of the gate structure, e.g., corresponding to cross-section $Y_3$-$Y_3$. An etching process such as those described above that is selective to the source/drain spacer 540, the inner dielectric layers 620, channel layers 622 and outer dielectric layers 624, the inner spacer 530 and the sidewall spacer 514 may be performed to remove the remaining portion of ILD 542.

An OPL may then be coated on the semiconductor structure 500, followed by a lithographic process to pattern the OPL and form the etch mask 544. The OPL may comprise, for example, a resin material that is applied by spin coating and baked to enhance planarization. The patterned portion of the OPL is removed to expose the side of the gate structure corresponding to the $Y_1$-$Y_1$ cross-section.

FIGS. 37A through 37D are schematic cross-sectional views of the semiconductor structure 500 of FIGS. 36A through 36D after removal of the portion 540-1 of the source/drain spacer 540 on the side of the gate structure corresponding to the $Y_1$-$Y_1$ cross-section that was exposed by the etch mask 544, the removal of the etch mask 544, the formation of a contact layer 546 on the semiconductor structure 500 including on the remaining portion 540-2 of the source/drain spacer 540, the source/drain region 538 corresponding to the $Y_1$-$Y_1$ cross-section that was exposed by removal of the portion 540-1 of the source/drain spacer 540 on that side of the gate structure, and on the sidewalls of the gate structure including on inner spacers 530, inner dielectric layers 620, channel layers 622 and outer dielectric layers 624 and sidewall spacers 514, the etching of the contact layer 546 to expose the portion 540-2 of the source/drain spacer 540 corresponding to the $Y_3$-$Y_3$ cross-section and the source/drain region 538 corresponding to the $Y_1$-$Y_1$ cross-section and the removal of the source/drain region 538 corresponding to the $Y_1$-$Y_1$ cross-section.

The portion 540-1 of the source/drain spacer 540 may be removed, for example, using an etch process, e.g., an RIE process, to expose the source/drain regions 538. For example, the RIE process may utilize an etch chemistry that is selective to the material of the source/drain regions 538.

The etch mask 544 may be removed using, for example, a plasma etch process or ash process.

Contact layer 546 may be formed on the semiconductor structure 500 including on the remaining source/drain spacer 540, the source/drain region 538 corresponding to the $Y_1$-$Y_1$ cross-section that was exposed by removal of the source/drain spacer 540 on that side of the gate structure, and on the sidewalls of the gate structure including on inner spacers 530, inner dielectric layers 620, channel layers 622 and outer dielectric layers 624 and sidewall spacers 514 in a similar manner to that described above for contact layer 532. In some embodiments, the material selected for use with contact layer 546 may depend on the material used for channel layer 622, e.g., depending on whether the channel layer 622 is used for an nFET or pFET semiconductor device, and may comprise a dual layer material made of both the material of the channel layer 622 and a semimetal contact layer such as, e.g., Bismuth or Antimoney or other similar materials, or a single layer comprising either the material of the channel layer or the semimetal material. In some embodiments, a doping treatment may be performed on contact layer 546 to reduce the Schottky barrier of the upper FET.

The contact layer 546 may be etched using, for example, a directional RIE or other directional process that is selective to the source/drain regions 538, sidewall spacers 514, gate capping layers (not shown) and portion 540-2 of the source/drain spacer 540 such that the contact layer 546 is removed from the surfaces of source/drain regions 538 and portion 540-2 of the source/drain spacer 540 while remaining on the lateral sidewalls of the inner spacers 530, inner dielectric layers 620, channel layers 622, outer dielectric layers 624 and sidewall spacers 514.

The exposed source/drain regions 538 may be removed using one or more etch processes, e.g., a directional RIE, having an etch chemistry that is selective to sidewall spacers 514, contact layer 532 and contact layer 546. For example, an anisotropic or isotropic dry or wet etch process may be used to remove the exposed source/drain region 538 and expose the dielectric layer 502.

Figure 38:
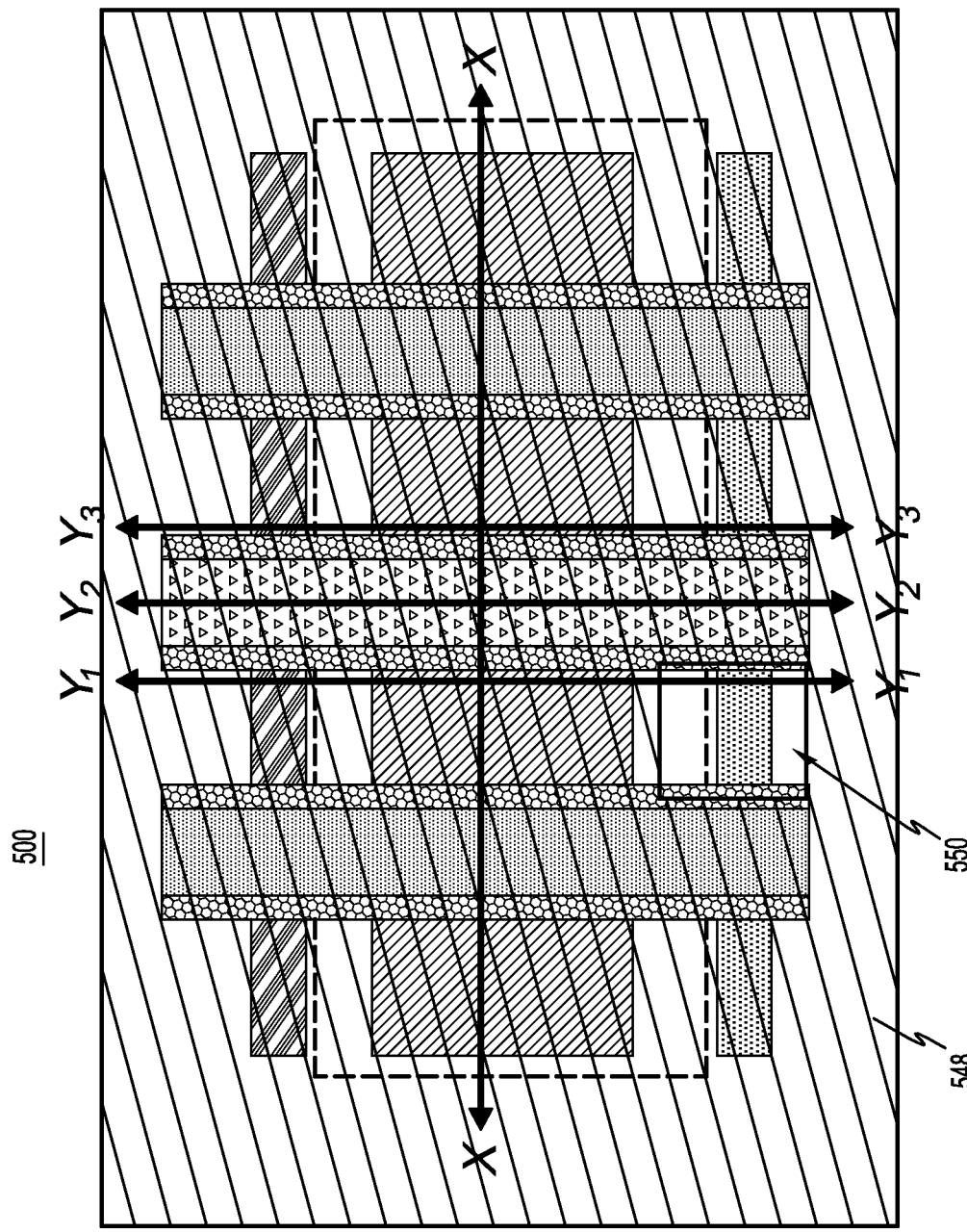
FIG. 38 is a top-down view and FIGS. 39A through 39D are schematic cross-sectional views of the semiconductor structure of FIGS. 37A through 37D after forming an etch mask having patterned channels.
Figures 39A, 39B, 39C, 39D:
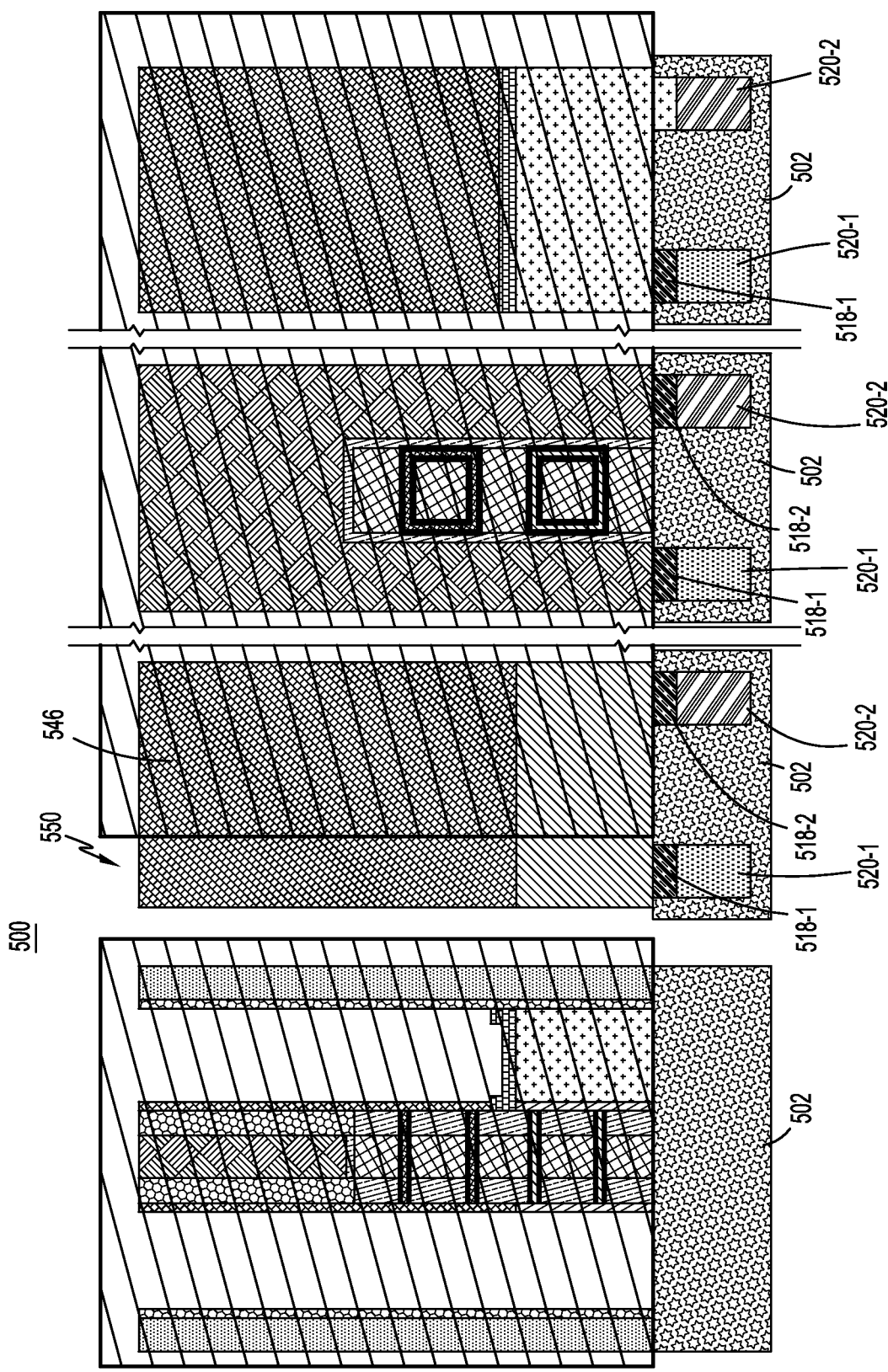

FIG. 38 is a top-down view and FIGS. 39A through 39D are schematic cross-sectional views of the semiconductor structure 500 of FIGS. 37A through 37D after forming an etch mask 548 having patterned channels 550. For example, an OPL may be coated on the semiconductor structure 500, followed by a lithographic process to pattern the OPL and form the etch mask 548. The OPL may comprise, for example, a resin material that is applied by spin coating and baked to enhance planarization. The patterned portion of the OPL is removed to form patterned channels 550 such that etch mask 548 exposes a portion of the BPR capping layer 518-1 in the $Y_1$-$Y_1$ cross-section.

FIGS. 40A through 40D are schematic cross-sectional views of the semiconductor structure 500 of FIGS. 39A through 39D after removal of the exposed BPR capping layer 518-1 in the $Y_1$-$Y_1$ cross-section, formation of source/drain regions 552 in electrical contact with the BPR 520-1 and recessing of the contact layer 546 and source/drain regions 552 to a level above the upper most tri-layer stack of inner dielectric layers 620, channel layers 622 and outer dielectric layers 624 and below the sidewall spacer 514.

The exposed BPR capping layer 518-1 may be removed using, for example, a RIE, wet or dry etch process that is selective to the material of the etch mask 548, dielectric layer 502, contact layers 532 and 546 and BPR 520-1.

The source/drain regions 552 may be formed, for example, using the processes and techniques described above for the formation of source/drain regions 134. In some embodiments, the source/drain regions 552 are formed of a different material than source/drain regions 538, e.g., where the material of each of source/drain regions 538 and source/drain regions 552 depends on the respective type of semiconductor device of the corresponding channel layers 522 and 622. As seen in FIGS. 40A through 40D, the source/drain regions 552 are in contact with the BPR 520-1 in the $Y_1$-$Y_1$ cross-section where the portion of the BPR capping layer 518-1 was removed. In addition, the source/drain regions 552 are also formed over the portion 540-2 of the source/drain spacer 540 in the $Y_3$-$Y_3$ cross-section.

The contact layer 546 and source/drain regions 552 may be recessed using one or more etch processes, e.g., a directional RIE, having an etch chemistry that is selective to sidewall spacers 514. For example, an anisotropic wet etch process may be used to recess the contact layer 546 and source/drain regions 552. In illustrative embodiments, for example, the contact layer 546 and source/drain regions 552 may be etched down to a level between the top most tri-layer stack of inner dielectric layers 620, channel layers 622 and outer dielectric layers 624 and the bottom of the sidewall spacer 514 without exposing the inner dielectric layers 620, channel layers 622 and outer dielectric layers 624. For example, in some embodiments, the contact layer 546 and source/drain regions 552 may be etched down to about halfway between the bottom of the sidewall spacer 514 and the top most tri-layer stack of inner dielectric layers 620, channel layers 622 and outer dielectric layers 624.

FIGS. 41A through 41D are schematic cross-sectional views of the semiconductor structure 500 of FIGS. 40A through 40D after the formation of an ILD 554 and capping layer 556 and the removal of dummy gate electrodes 512.

ILD 554 may be formed, for example, by the deposition of a dielectric material, including, but not limited to SiOx, low temperature oxide (LTO), high temperature oxide (HTO), flowable oxide (FOX) or some other dielectric, on the source/drain spacer 540. The ILD 554 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD 554 and planarize the resulting structure. An etching process such as those described above that is selective to the sidewall spacers 514 may be performed to recess the ILD 554 as shown in FIG. 41A.

Capping layer 556 may be formed, for example, by depositing a layer of dielectric material such as SiN, SiCN, SION, BN, SiBN, SiOC, similar materials to those used for ILD 554 but having a higher density or other similar materials commonly used to form capping layers that are selectively etchable to the sidewall spacers 514. The dielectric material may be deposited using known techniques such as atomic layer deposition (ALD), CVD and PVD and then planarized, for example, using CMP to remove excess material.

The dummy gate electrodes 512 are etched away using known etching techniques and etch chemistries such as those described above for removal of dummy gate electrodes 112.

FIGS. 42A-42D are schematic cross-sectional views of the semiconductor structure 500 of FIGS. 41A-41D after the gate replacement process has been performed including the removal of dummy gate dielectric layers 510, the removal of and replacement of sacrificial layer 526 with a gate conductor layers 560, a gate contact 562 and sacrificial gate cap 564 using similar processes to those described above for the removal of dummy gate dielectric layers 110, the removal of and replacement of sacrificial layer 126 with gate conductor layer 140, gate contact 142 and sacrificial gate caps 148 of FIG. 12A. In some embodiments, a dielectric layer 558 is formed prior to the formation of the gate conductor layers 560 in a similar to that described above for dielectric layer 138 described above.

FIG. 43 is a schematic cross-sectional view of the semiconductor structure 500 according to FIG. 42A illustrating an inverter CFET circuit formed by the semiconductor structure 500. For example, as seen in FIG. 43, the source/drain region 538 corresponds to the $V_S$ of the inverter circuit, the source/drain region 552 on the side of the gate structure corresponding to the $Y_3$-$Y_3$ cross-section corresponds to the $V_{DD}$ of the inverter circuit, the source/drain region 552 on the side of the gate structure corresponding to the $Y_1$-$Y_1$ cross-section corresponds to the Vout of the inverter circuit and the gate contact 562 corresponds to the Vin of the inverter circuit.

Figure 44:
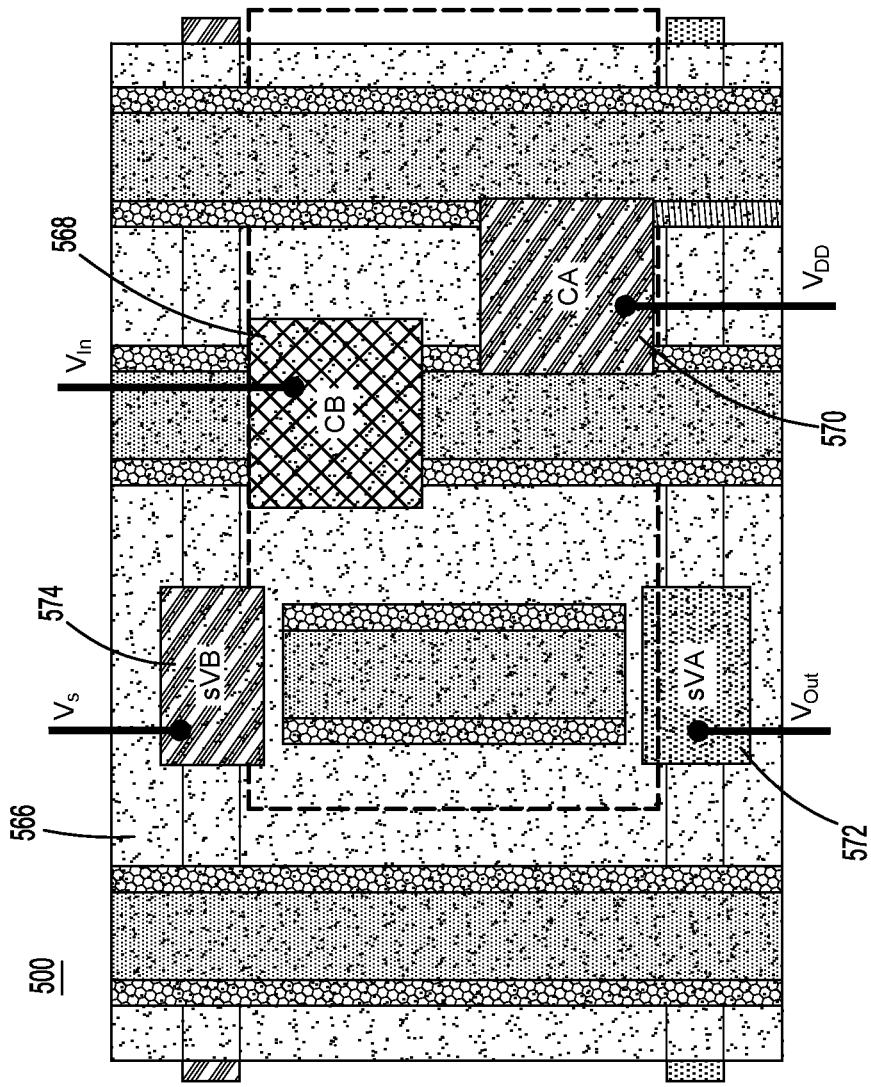
Figure 45:
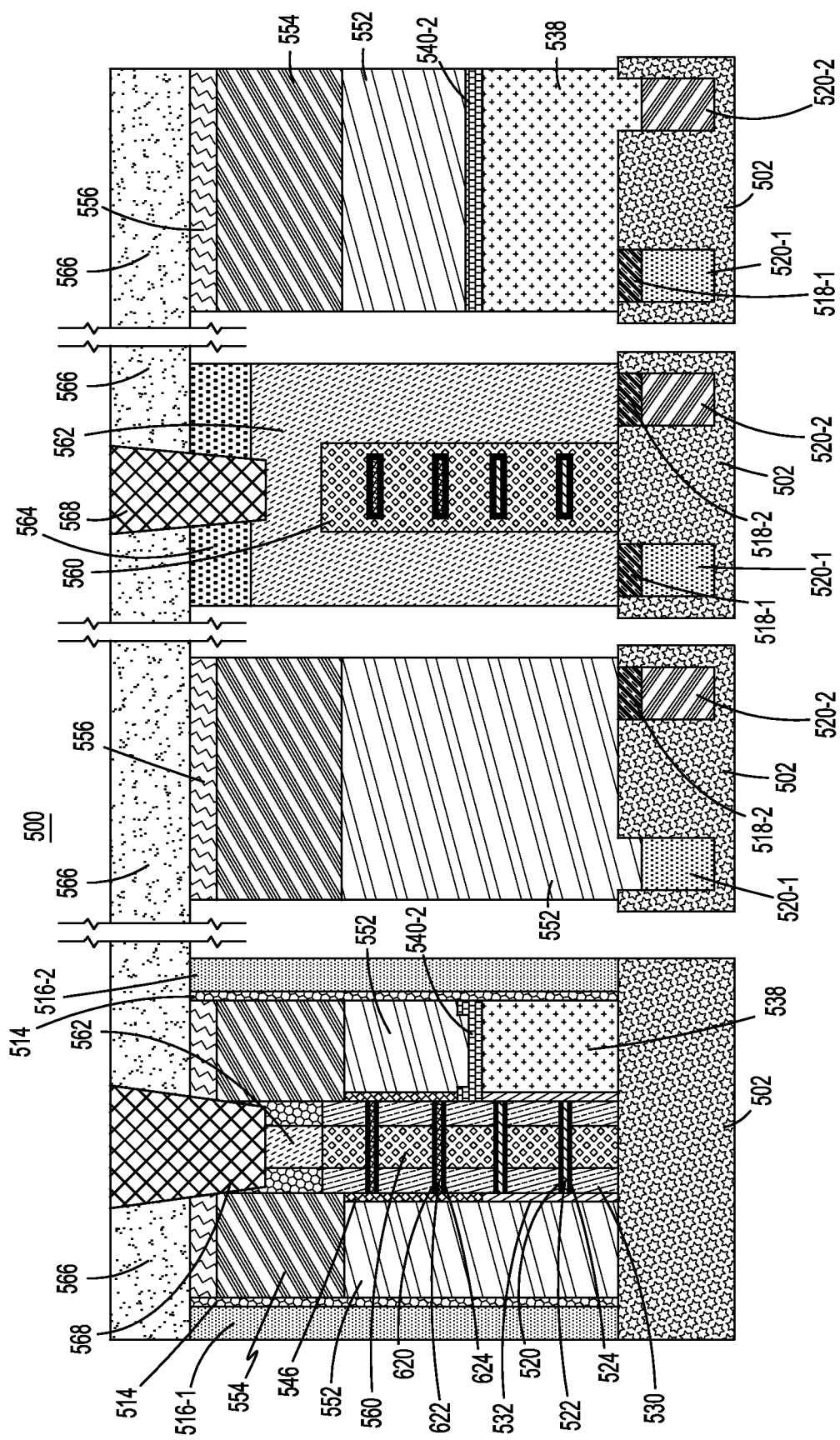
Figure 46:
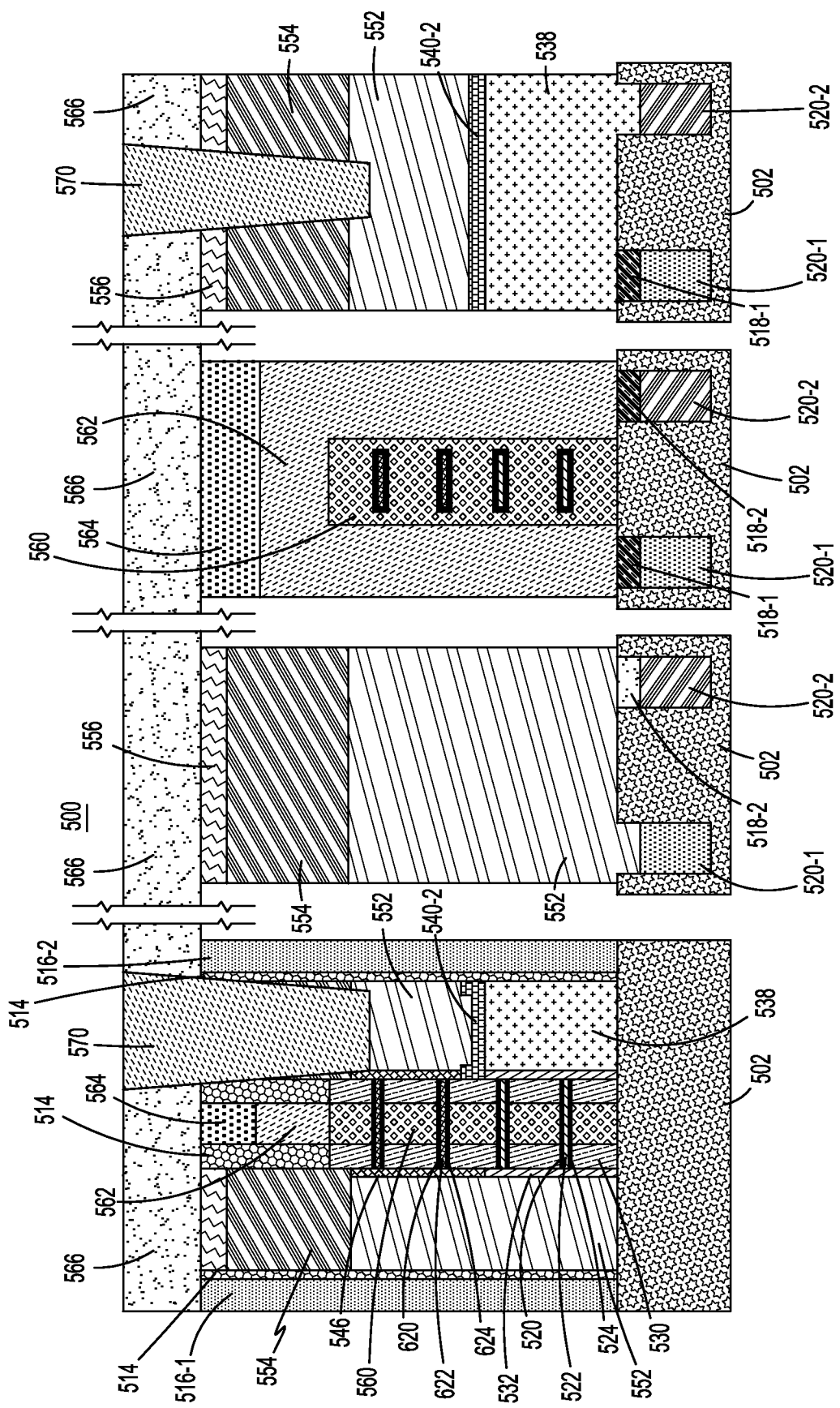
Figure 47:
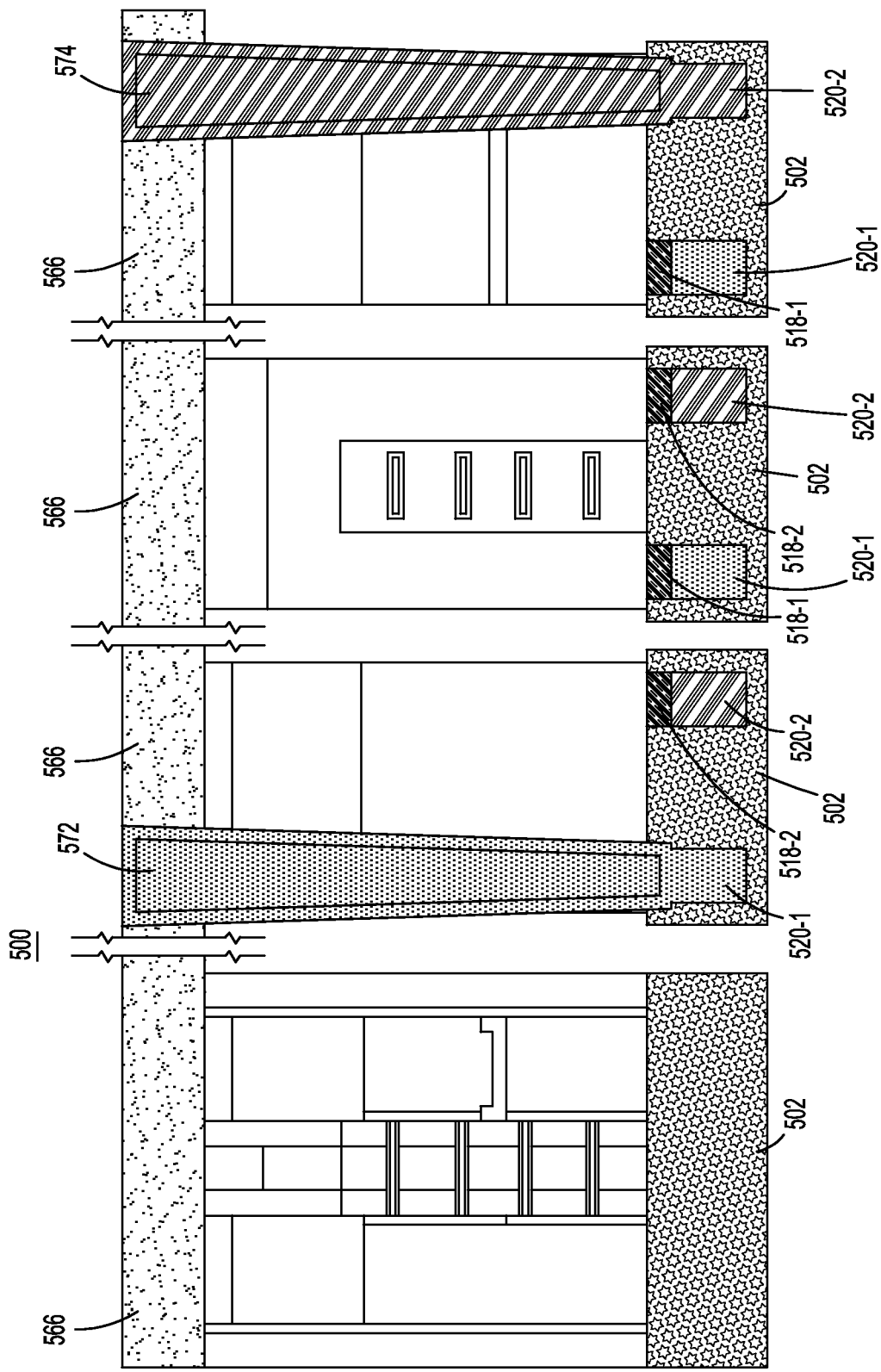

FIG. 44 is a top-down view of the semiconductor structure 500 according to FIG. 42A after the formation of middle-of-line (MOL) contacts with reference also to FIGS. 45A through 47D in a non-limiting example. As part of the MOL process, a MOL dielectric layer 566 is formed over the semiconductor structure 500 using, e.g., a conformal deposition such as described above for the various dielectric layers. Contact channels are etched into the MOL dielectric layer 566 to expose the gate contact 562, to expose the source/drain region 552 on the side of the gate structure corresponding to the $Y_3$-$Y_3$ cross-section and to expose the BPRs 520-1 and 520-2, respectively.

For example, as shown in FIGS. 45A and 45C, contact channels may be etched into MOL dielectric layer 566, sidewall spacers 514 and sacrificial gate cap 564 to expose the gate contact 562 using, e.g., one or more lithographic or etching processes such as those described above. A MOL contact material including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited in the channels using, for example, CVD, PECVD, RFCVD, PVD, ALD, MLD, MBD, PLD, LSMCD, and/or sputtering, followed by planarization by, for example, CMP to form MOL contact 568 for the gate contact 562.

As shown in FIGS. 46A and 46D, contact channels may be etched into MOL dielectric layer 566, capping layer 556 and ILD 554 on the side of the gate structure corresponding to the $Y_3$-$Y_3$ cross-section to expose the source/drain region 552 on the side of the gate structure corresponding to the $Y_3$-$Y_3$ cross-section using, e.g., one or more lithographic or etching processes such as those described above. A MOL contact material including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited in the channels using, for example, CVD, PECVD, RFCVD, PVD, ALD, MLD, MBD, PLD, LSMCD, and/or sputtering, followed by planarization by, for example, CMP to form MOL contact 570 for the exposed source/drain region 552.

As shown in FIGS. 47B and 47D, contact channels may be etched into MOL dielectric layer 566 over the BPRs 520-1 and 520-2 to expose the BPRs 520-1 and 520-2, e.g., one or more lithographic or etching processes such as those described above. A MOL contact material including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited in the channels using, for example, CVD, PECVD, RFCVD, PVD, ALD, MLD, MBD, PLD, LSMCD, and/or sputtering, followed by planarization by, for example, CMP to form MOL contact 572 for the exposed BPR 520-1 and MOL contact 574 for the exposed BPR 520-2.

Figure 48:
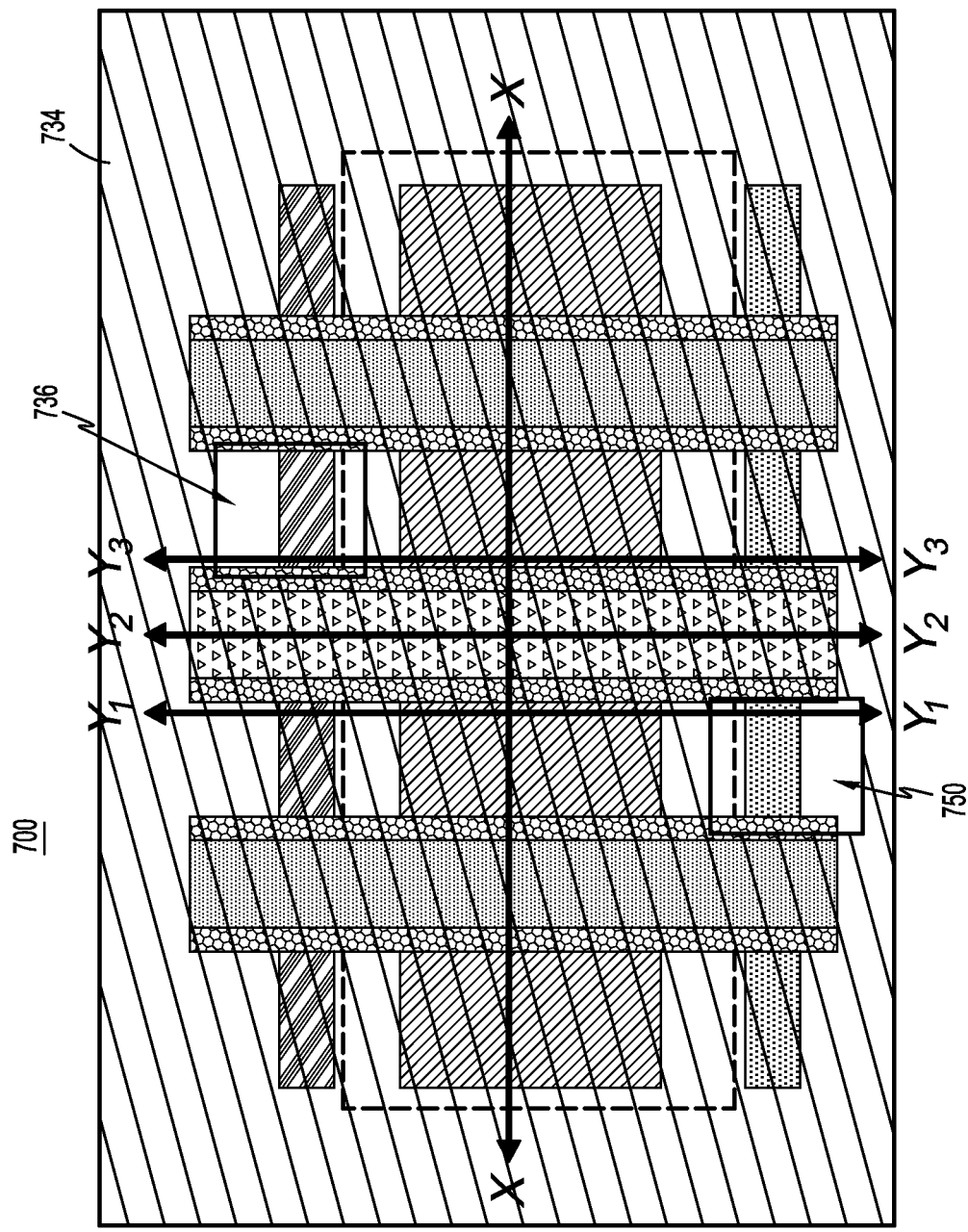
FIG. 48 is schematic top-down view of the semiconductor structure according to a fourth illustrative embodiment and FIGS. 49A through 49D are schematic cross-sectional views of the semiconductor structure of FIG. 48 at an intermediate stage of fabrication similar to the stage of fabrication for the semiconductor structure of the third embodiment as shown in FIG. 31.
Figure 49:
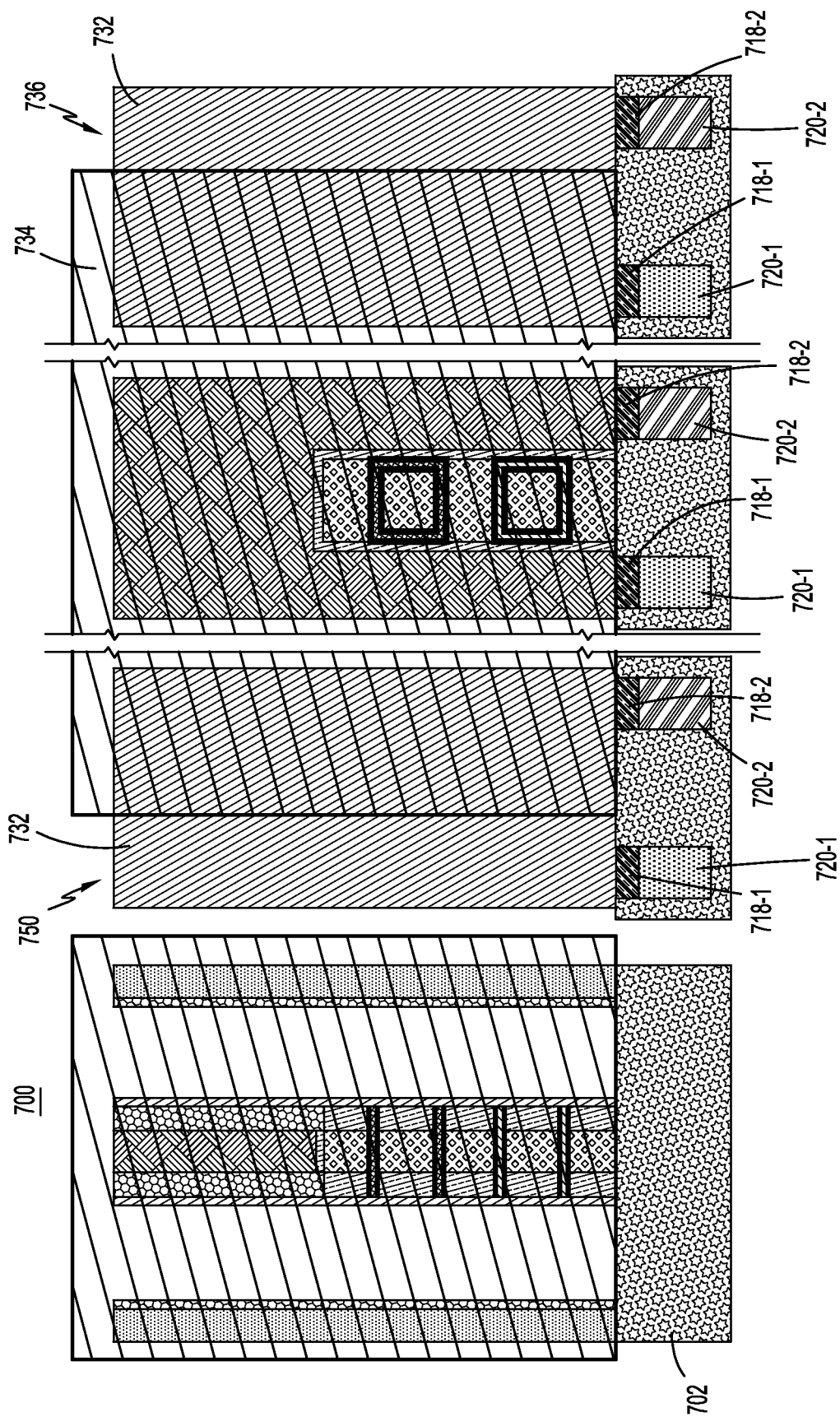
Figure 50:
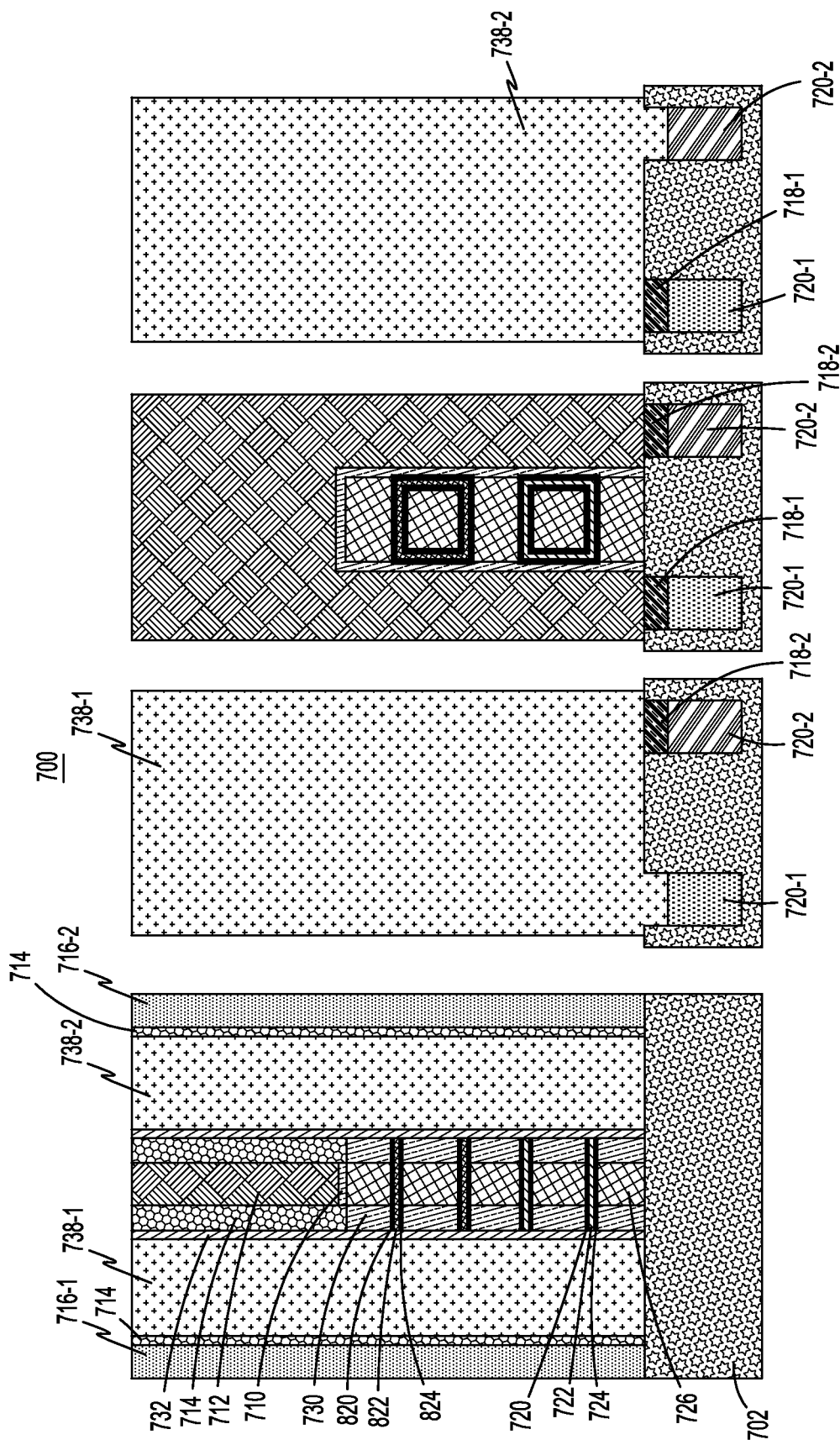
FIGS. 50A through 50D are schematic cross-sectional views of the semiconductor structure of FIGS. 49A through 49D after removal of the exposed portions of the BPR capping layers and the formation of source/drain regions in electrical contact with the BPRs.
Figure 51:
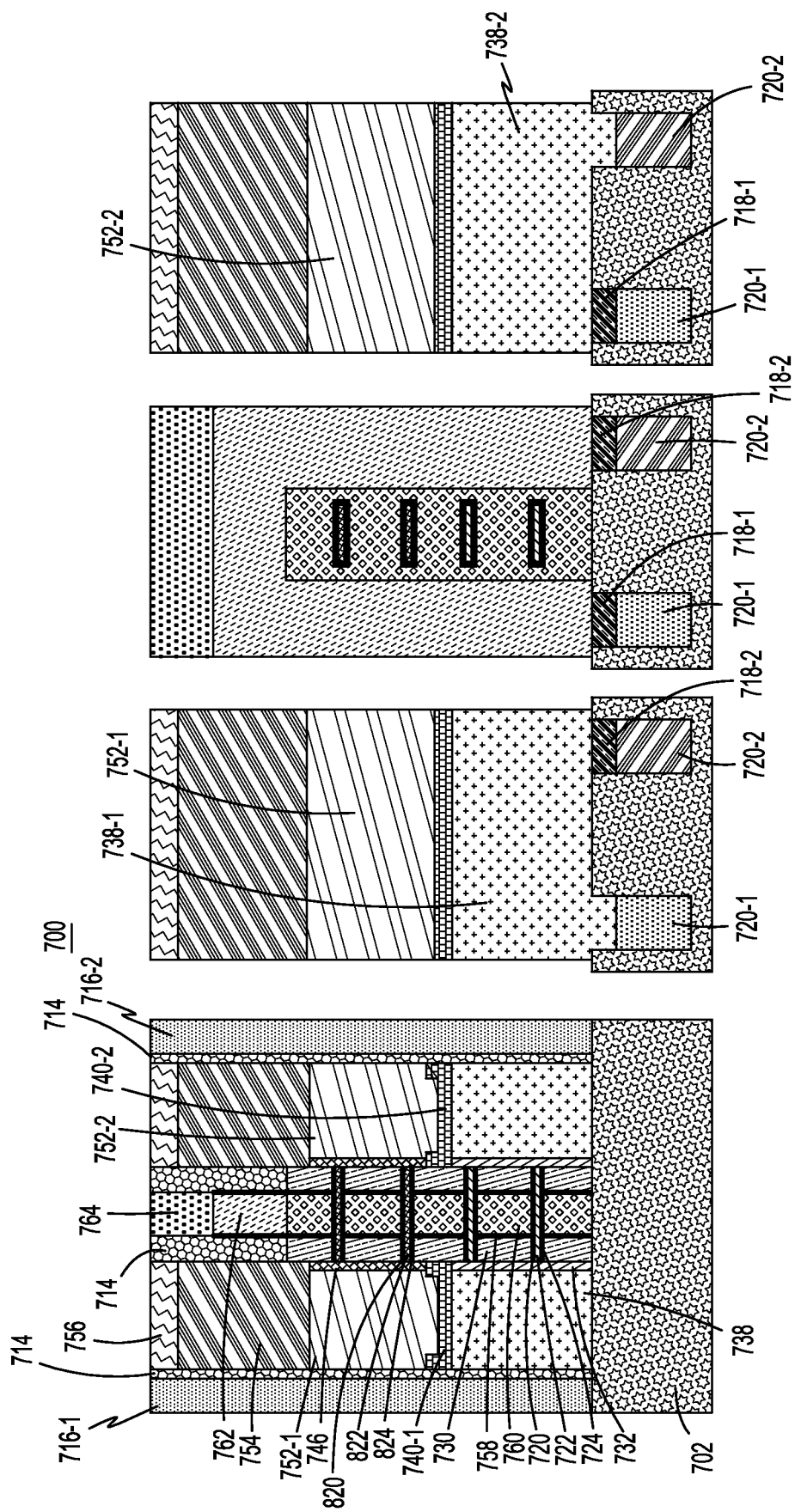
FIGS. 51A through 51D are schematic cross-sectional views of the semiconductor structure of FIGS. 50A through 50D after recessing the contact layer and source/drain regions to a level below the inner dielectric layers, channel layers and outer dielectric layers, the formation of source/drain spacers, the formation of a contact layer, the formation of additional source/drain regions, the formation of an ILD and capping layer, the removal of dummy gate electrodes, the removal of dummy gate dielectric layers, the removal of and replacement of sacrificial layer with a gate conductor layers, a gate contact and sacrificial gate cap and in some embodiments the formation of dielectric layer prior to the formation of the gate conductor layers.

FIGS. 48 through 56D schematically illustrate an example method for fabricating semiconductor structure 700 according to a fourth illustrative embodiment. In an illustrative embodiment, semiconductor structure 700 is a stacked CFET comprising both an nFET and a pFET formed in a stacked arrangement according to the processes described below, and is formed in a similar to semiconductor structure 500 except where described differently below. In the fourth illustrative embodiment, similar features to those found in the third illustrative embodiment will have similar numbers and will be described with reference to the descriptions of those features found above in the first embodiment. In the following figures, figures with the "A" reference are taken along cross-section X-X of FIG. 48, figures with the "B" reference are taken along cross-section $Y_1$-$Y_1$ of FIG. 48, figures with the "C" reference are taken along cross-section $Y_2$-$Y_2$ of FIG. 48 and figures with the "D" reference are taken along cross-section $Y_3$-$Y_3$ of FIG. 48. For example, for FIGS. 49A through 49D, FIG. 49A is taken along cross-section X-X, FIG. 49B is taken along cross-section $Y_1$-$Y_1$ of FIG. 48, FIG. 49C is taken along cross-section $Y_2$-$Y_2$ of FIG. 48 and FIG. 49D is taken along cross-section $Y_3$-$Y_3$ of FIG. 48. Note that in the absence of a material or structure formed in the planes defined by the $Y_1$-$Y_1$ and $Y_3$-$Y_3$ cross-sections, these cross-sections will show underlying structures as viewed toward the $Y_2$-$Y_2$ cross-section, as denoted by a semi-transparent plane.

FIG. 48 is schematic top-down view of the semiconductor structure 700 and FIGS. 49A through 49D are schematic cross-sectional views of the semiconductor structure 700 of FIG. 48 at an intermediate stage of fabrication similar to the stage of fabrication for semiconductor structure 500 as shown in FIG. 31. For example, with reference also to FIGS. 50A-50D, semiconductor structure 700 comprises a dielectric layer 702 disposed on a semiconductor substrate (not shown), a nanosheet stack structure formed on the dielectric layer 702 and comprising inner dielectric layers 720, channel layers 722, outer dielectric layers 724, sacrificial layer 726, inner dielectric layers 820, channel layers 822, outer dielectric layers 824, sidewall spacers 730, contact layer 732, an active gate comprising a dummy gate dielectric layer 710 and dummy gate electrode 712, sidewall spacers 714, inactive gates 716-1 and 716-2, buried power rail (BPR) capping layers 718-1 and 718-2 and buried power rails 720-1 and 720-2. While not illustrated, gate capping layers (not shown) may also be disposed on the dummy gate electrodes 712. Each of these layers may be formed, for example, using the above described processes, techniques and materials that were used to form a dielectric layer 502, inner dielectric layers 520, channel layers 522, outer dielectric layers 524, sacrificial layer 526, inner dielectric layers 620, channel layers 622, outer dielectric layers 624, inner spacers 530, contact layer 532, dummy gate dielectric layer 510 and dummy gate electrode 512, sidewall spacers 514, inactive gates 516-1 and 516-2, buried power rail (BPR) capping layers 518-1 and 518-2 and buried power rails 520-1 and 520-2.

Referring again to FIGS. 48 and 49A-49D, in the fourth embodiment, an etch mask 734 having patterned channels 736 and 750 is formed and patterned, for example, in a similar manner to the formation of etch masks 534 and 548 as described above. Channel 736 exposes a portion of the BPR capping layers 718-2 in the $Y_3$-$Y_3$ cross-section and channel 750 exposes a portion of the BPR capping layers 718-1 in the $Y_1$-$Y_1$ cross-section. It is important to note that in the fourth illustrative embodiment, channels 736 and 750 are opened at the same stage of the fabrication process to expose the BPR capping layers 718-1 and 718-2 for both BPRs 720-1 and 720-2, as compared to the third embodiment which opens the channels at different stages of the fabrication process.

FIGS. 50A through 50D are schematic cross-sectional views of the semiconductor structure 700 of FIGS. 49A through 49D after removal of the exposed portions of the BPR capping layers 718-1 and 718-2 and the formation of a source/drain region 738-1 in electrical contact with the BPR 720-1 and a source/drain region 738-2 in electrical contact with the BPR 720-2.

The exposed BPR capping layers 718-1 and 718-2 may be removed using, for example, the processes and techniques described above for the removal of BPR capping layers 518-1 and 518-2.

The source/drain regions 738-1 and 738-2 may be formed, for example, using the processes and techniques described above for the formation of source/drain regions 538-1 and 538-2. As seen in FIGS. 50A through 50D, the source/drain region 738-1 is in contact with the BPR 720-1 in the $Y_1$-$Y_1$ cross-section where the portion of the BPR capping layer 718-2 was removed and the source/drain region 738-1 is in contact with the BPR 720-2 in the $Y_3$-$Y_3$ cross-section where the portion of the BPR capping layer 718-2 was removed.

FIGS. 51A through 51D are schematic cross-sectional views of the semiconductor structure 700 of FIGS. 50A through 50D after recessing the contact layer 732 and source/drain regions 738-1 and 738-2 to a level below the inner dielectric layers 820, channel layers 822 and outer dielectric layers 824, the formation of source/drain spacers 740-1 and 740-2, the formation of contact layer 746, the formation of source/drain regions 752-1 and 752-2, the formation of ILD 754 and capping layer 756, the removal of dummy gate electrodes 712, the removal of dummy gate dielectric layers 710, the removal of and replacement of sacrificial layer 726 with a gate conductor layers 760, a gate contact 762 and sacrificial gate cap 764 and in some embodiments the formation of dielectric layer 758 prior to the formation of the gate conductor layers 760 using similar processes to those described above for the third embodiment.

Figure 52:
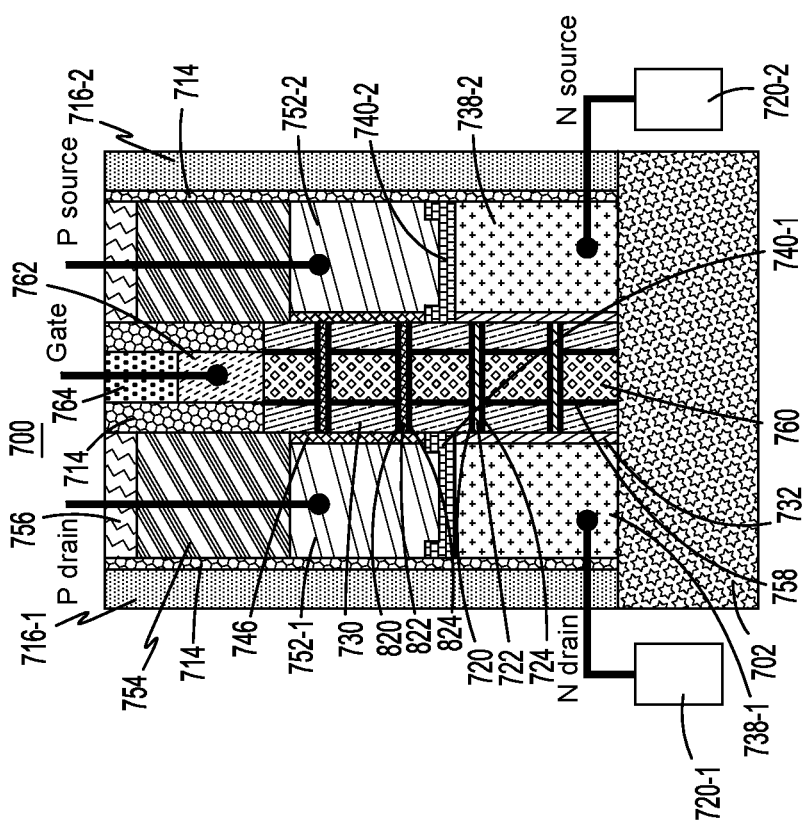
FIG. 52 is a schematic cross-sectional view of the semiconductor structure according to FIG. 51A illustrating a CFET circuit formed by the semiconductor structure of the fourth embodiment.

FIG. 52 is a schematic cross-sectional view of the semiconductor structure 700 according to FIG. 51A illustrating a CFET circuit formed by the semiconductor structure 700. For example, as seen in FIG. 52, the source/drain region 738-1 corresponds to the nFET drain, the source/drain region 738-2 corresponds to the nFET source, the source/drain region 752-1 corresponds to the pFET drain, the source/drain region 752-2 corresponds to the pFET source, and the gate contact 762 corresponds to the gate.

Referring again to FIGS. 51A through 51D, source/drain region 738-1 is in electrical contact with BDR 720-1 and the source/drain region 738-2 is in electrical contact with BDR 720-2. Source/drain regions 752-1 and 752-2 will be connected to contacts during the MOL process, for example, as shown in FIGS. 53, and 54A through 56D.

Figure 53:
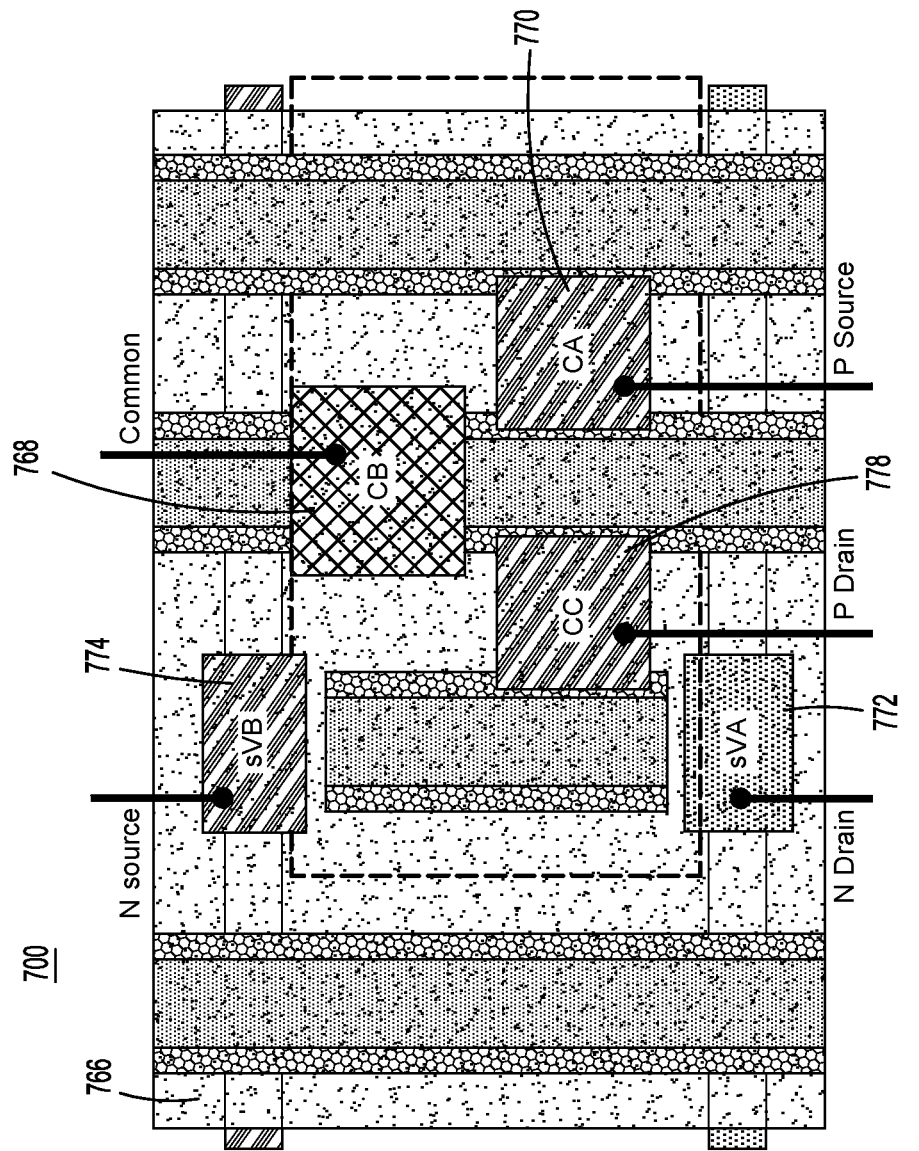

FIG. 53 is a top-down view of the semiconductor structure 700 according to FIG. 51A after the formation of middle-of-line (MOL) contacts with reference also to FIGS. 54A through 56D in a non-limiting example. As part of the MOL process, a MOL dielectric layer 766 is formed over the semiconductor structure 700 and contact channels are etched into the MOL dielectric layer 766 to expose the gate contact 762, to expose the source/drain region 752-1 and 752-2 and to expose the BPRs 720-1 and 720-2, respectively, for example, using the processes and techniques described above for semiconductor structure 500 in the third embodiment.

A MOL contact material including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited in the channels using, for example, CVD, PECVD, RFCVD, PVD, ALD, MLD, MBD, PLD, LSMCD, and/or sputtering, followed by planarization by, for example, CMP to form MOL contact 768 for the gate contact 762.

As shown in FIGS. 55A and 55D, contact channels may be etched into MOL dielectric layer 766, capping layer 756 and ILD 754 to expose the source/drain regions 552-1 and 552-2, e.g., one or more lithographic or etching processes such as those described above. A MOL contact material including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited in the channels using, for example, CVD, PECVD, RFCVD, PVD, ALD, MLD, MBD, PLD, LSMCD, and/or sputtering, followed by planarization by, for example, CMP to form MOL contacts 770 and 778 for the exposed source/drain region 752-1 and 752-2.

As shown in FIGS. 56B and 56D, contact channels may be etched into MOL dielectric layer 766 over the BPRs 720-1 and 720-2 to expose the BPRs 720-1 and 720-2, e.g., one or more lithographic or etching processes such as those described above. A MOL contact material including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited in the channels using, for example, CVD, PECVD, RFCVD, PVD, ALD, MLD, MBD, PLD, LSMCD, and/or sputtering, followed by planarization by, for example, CMP to form MOL contact 772 for the exposed BPR 720-1 and MOL contact 774 for the exposed BPR 720-2.

The use of standard Si-based nanosheet layers as a framework for forming 2D channel layers in the semiconductor structures 100, 300, 500 and 700 of the above-described embodiments allows standard fabrication processes to be utilized in the formation of the 2D channel layers in a way that limits the effect of channel defects in the growth of the Si-based, e.g., since all of these channels are etched away as sacrificial layers. In addition, because the 2D materials enable the use of metal-based source/drain regions, the ease of placement of the source/drain regions is enhanced since they no longer need to be grown from a silicon substrate or base of another material and can instead be deposited. The use of 2D channel materials allows for a higher drive current density than Si-based CFETs, enabling higher performance from CFETs having a lower-aspect-ratio. N/P performance matching may also be accomplished through the selection of the channel layer material.

It is to be understood that the methods discussed herein for fabricating a semiconductor structure can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

The invention claimed is:

1. A semiconductor structure, comprising:
 a gate structure comprising a multi-layer channel stack, the multi-layer channel stack comprising:
  a first dielectric layer;
  a second dielectric layer; and
  a channel layer disposed between the first and second dielectric layers;
 a first source/drain region disposed on a first side of the gate structure in electrical contact with a first end portion of the multi-layer channel stack; and
 a second source/drain region disposed on a second side of the gate structure in electrical contact with a second end portion of the multi-layer channel stack;
 wherein the multi-layer channel stack extends through an inner spacer to a contact layer electrically connecting the channel layer to the first source/drain region, the contact layer being disposed between the inner spacer and the first source/drain region, and in contact with the channel layer, the inner spacer, the first source/drain region, a bottom dielectric isolation layer, a first inter-layer dielectric layer, and a second inter-layer dielectric layer.

2. The semiconductor structure of claim 1, wherein the multi-layer channel stack comprises a thickness having a range of about 2 nm to about 4 nm.

3. The semiconductor structure of claim 1, wherein the first and second source/drain regions comprise metal-based materials.

4. The semiconductor structure of claim 1, wherein the channel layer comprises a metal-based material.

5. The semiconductor structure of claim 1, wherein the channel layer comprises a two-dimensional layer.

6. The semiconductor structure of claim 1, further comprising a second contact layer electrically connecting the channel layer to the second source/drain region, the contact layer being disposed between the inner spacer and the second source/drain region.

7. The semiconductor structure of claim 6, further comprising a semiconductor substrate, the gate structure being disposed on the semiconductor substrate and the first and second source/drain regions being recessed into the semiconductor substrate, wherein the contact layer is disposed between the first source/drain region and the semiconductor substrate.

8. The semiconductor structure of claim 6, further comprising a bottom dielectric isolation layer, the gate structure being disposed on the bottom dielectric isolation layer, wherein the contact layer is disposed between the first source/drain region and the bottom dielectric isolation layer.

9. The semiconductor structure of claim 8, further comprising a second dielectric isolation layer disposed between a portion of the bottom dielectric isolation layer and the first source/drain region, wherein the contact layer is disposed between the first source/drain region and the second dielectric isolation layer.

10. A semiconductor structure, comprising:
 a gate structure comprising a first multi-layer channel stack and a second multi-layer channel stack spaced apart by an inner spacer, each of the first and second multi-layer channel stacks comprising:
  a first dielectric layer;
  a second dielectric layer; and
  a channel layer disposed between the first and second dielectric layers, the channel layer of the first multi-layer channel stack comprising a first material that is configured for use with one of an n-type field effect transistor and a p-type field effect transistor and the channel layer of the second multi-layer channel stack comprising a second material that is configured for use with the other of the n-type field effect transistor and a p-type field effect transistor;
 wherein the multi-layer channel stack extends through the inner spacer to a contact layer electrically connecting the channel layer to a first metal-based source/drain region, the contact layer being disposed between the inner spacer and the first metal-based source/drain region, and in contact with the channel layer, the inner spacer, the first metal-based source/drain region, a bottom dielectric isolation layer, a first inter-layer dielectric layer, and a second inter-layer dielectric layer.

11. The semiconductor structure of claim 10, wherein the first material is different than the second material.

12. The semiconductor structure of claim 10, wherein the semiconductor structure further comprises:
the first metal-based source/drain region disposed on a first side of the gate structure and in electrical contact with a first end portion of the first multi-layer channel stack; and
a second metal-based source/drain region disposed on the first side of the gate structure and in electrical contact with a second end portion of the second multi-layer channel stack.

13. The semiconductor structure of claim 12, wherein the first metal-based source/drain region comprises a material that is different than the second metal-based source/drain region.

14. The semiconductor structure of claim 12, wherein the first and second multi-layer channel stacks extend through the inner spacer to the first metal-based source/drain region.

15. The semiconductor structure of claim 12, wherein the contact layer comprises:
a first contact layer portion electrically connecting the channel layer of the first multi-layer channel stack to the first metal-based source/drain region, the first contact layer portion being disposed between the inner spacer and the first metal-based source/drain region; and
a second contact layer portion electrically connecting the channel layer of the second multi-layer channel stack to the second metal-based source/drain region, the second contact layer portion being disposed between the inner spacer and the second metal-based source/drain region.

16. The semiconductor structure of claim 15, wherein the material of the first contact layer portion is different than the material of the second contact layer portion.

17. The semiconductor structure of claim 10, wherein the gate structure is disposed on a dielectric material.

18. An integrated circuit, comprising:
a plurality of semiconductor structures, wherein at least one of the plurality of semiconductor structures comprises:
a gate structure comprising a multi-layer channel stack, the multi-layer channel stack comprising:
a first dielectric layer;
a second dielectric layer; and
a channel layer disposed between the first and second dielectric layers;
a first source/drain region disposed on a first side of the gate structure in electrical contact with a first end portion of the multi-layer channel stack; and
a second source/drain region disposed on a second side of the gate structure in electrical contact with a second end portion of the multi-layer channel stack;
wherein the multi-layer channel stack extends through an inner spacer to a contact layer electrically connecting the channel layer to the first source/drain region, the contact layer being disposed between the inner spacer and the first source/drain region, and in contact with the channel layer, the inner spacer, the first source/drain region, a bottom dielectric isolation layer, a first inter-layer dielectric layer, and a second inter-layer dielectric layer.

19. The integrated circuit of claim 18, wherein the first and second source/drain regions comprise metal-based materials.

20. The integrated circuit of claim 18, wherein the channel layer comprises a metal-based material.

* * * * *